(12) United States Patent
Kojima et al.

(10) Patent No.: US 11,791,787 B2
(45) Date of Patent: Oct. 17, 2023

(54) COMPARATOR, OSCILLATOR, AND POWER CONVERTER

(71) Applicant: Mitsubishi Electric Corporation, Tokyo (JP)

(72) Inventors: Tomokazu Kojima, Tokyo (JP); Yuhei Morimoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/003,700

(22) PCT Filed: Aug. 24, 2021

(86) PCT No.: PCT/JP2021/030922
§ 371 (c)(1),
(2) Date: Dec. 29, 2022

(87) PCT Pub. No.: WO2022/045106
PCT Pub. Date: Mar. 3, 2022

(65) Prior Publication Data
US 2023/0261624 A1    Aug. 17, 2023

(30) Foreign Application Priority Data

Aug. 28, 2020   (JP) .................................. 2020-144210

(51) Int. Cl.
*H03F 3/45* (2006.01)
(52) U.S. Cl.
CPC ..... *H03F 3/45475* (2013.01); *H03F 3/45753* (2013.01); *H03F 3/45977* (2013.01)
(58) Field of Classification Search
CPC ....................................................... H03F 3/45
(Continued)

(56) References Cited

U.S. PATENT DOCUMENTS 5,177,450 A * 1/1993 Lee ..................... H03F 3/45076
330/253
5,990,742 A * 11/1999 Suzuki ................. H03F 3/3001
330/253
(Continued)

FOREIGN PATENT DOCUMENTS

JP    2001285037 A    10/2001
JP    2002084742 A     3/2002
(Continued)

OTHER PUBLICATIONS

International Preliminary Report on Patentability (PCT/IB/373) with Written Opinion of the International Searching Authority, dated Mar. 9, 2023, by the International Bureau of WIPO, for International Application No. PCT/JP2021/030922.

*Primary Examiner* — Henry Choe
(74) *Attorney, Agent, or Firm* — BUCHANAN INGERSOLL & ROONEY PC

(57) ABSTRACT

A differential amplifier circuit generates a first current and a second current having a current difference obtained by amplifying a voltage difference between an input voltage and a reference voltage. An output stage supplies current proportional to the first current to an output node. A current conversion circuit discharges current proportional to the second current from the output node. After connecting the output node to a ground node in response to a reset signal, a latch circuit disconnects the output node from the ground node after reset cancellation. Thereafter, when voltage at the output node rises from the ground voltage in a case where a level relationship between the input voltage and the reference voltage is reversed from a reset cancellation time point, the latch circuit fixes the voltage at the output node to a power supply voltage by a positive feedback latch operation.

26 Claims, 24 Drawing Sheets

(58) Field of Classification Search
USPC .................................... 330/257, 261, 255
See application file for complete search history.

(56) References Cited

U.S. PATENT DOCUMENTS

| | | | |
|---|---|---|---|
| 6,051,999 A * | 4/2000 | To .................... | G11C 7/1078 327/66 |
| 7,679,406 B2 * | 3/2010 | Yagi .................. | H03F 3/45192 327/55 |
| 7,863,992 B2 | 1/2011 | Chung | |
| 8,310,306 B2 * | 11/2012 | Itoh ................... | H03F 3/3022 330/257 |
| 8,754,708 B2 * | 6/2014 | Liu .................... | H03F 3/3022 330/257 |
| 2008/0143440 A1 | 6/2008 | Yagi | |
| 2010/0231301 A1 | 9/2010 | Bruin | |

FOREIGN PATENT DOCUMENTS

| | | | |
|---|---|---|---|
| JP | 2002237743 A | 8/2002 | |
| JP | 2008153866 A | 7/2008 | |
| JP | 2009524327 A | 6/2009 | |
| JP | 2014075744 A | 4/2014 | |

* cited by examiner

COMPARATOR, OSCILLATOR, AND POWER CONVERTER

TECHNICAL FIELD

The present disclosure relates to a comparator, and an oscillator and a power converter that include the comparator.

BACKGROUND ART

In recent years, with the progress of Internet of Things (IoT), artificial intelligence (AI) technology, and the like, there is an increasing need for a technique of a mixed signal circuit including an analog circuit and a digital circuit with high accuracy and extremely low power consumption. In the mixed signal circuit, a large-scale digital circuit for multi-functionalization and an analog circuit for high performance coexist on silicon.

A comparator that generates an output signal according to a comparison result between two analog voltages that is an input voltage as an input signal to the digital circuit is often used as one of such the analog circuit.

The comparator is also used as a component of a relaxation oscillator in order to generate a clock signal having a constant frequency to be supplied to the digital circuit. This relaxation oscillator is advantageous in that the relaxation oscillator can be implemented by a complementary metal-oxide semiconductor (CMOS) circuit as compared with a crystal oscillator and an LC oscillator that are disadvantageous in terms of cost and integration while being highly accurate. In addition, because the crystal oscillator is required to be started, it is pointed out that it is difficult to apply the crystal oscillator to an application that achieves the low power consumption by an intermittent operation that is frequently turned on and off.

As one of techniques for reducing the power consumption of the comparator, Japanese Patent Laying-Open No. 2008-153866 (PTL 1) describes a circuit configuration of a comparator including a latch circuit. In the comparator described in PTL 1, the output signals from a differential amplifier circuit to which the two analog voltages to be compared are input are amplified by the latch circuit, and then the current flowing through the differential amplifier circuit is reduced, thereby achieving the low power consumption.

CITATION LIST

Patent Literature

PTL 1: Japanese Patent Laying-Open No. 2008-153866

SUMMARY OF INVENTION

Technical Problem

In the comparator of PTL 1, the signal amplified by the latch circuit is determined as the output signal of the comparator circuit according to the comparison result of the two input voltages (analog voltages) at timing when the clock signal changes from a logic low level (hereinafter, an "L level") to a logic high level (hereinafter, an "H level"). For this reason, the comparator of PTL 1 is suitable for an application of comparing the two analog voltages (input voltages) at specified timing.

On the other hand, an application in which one of the input voltages is set to a fixed voltage (reference voltage) to detect timing at which the other input voltage increases or decreases to reach the reference voltage, namely, an application as a one-shot type comparator exists as another application of the comparator. For example, in the above-described relaxation oscillator, a periodic clock signal is generated by the operation in which two comparators alternately detect the timing.

However, when the comparator of PTL 1 is applied to such the application, in order to detect the timing with high accuracy, the frequency of the clock signal is required to be enhanced to repeat the comparison operation of the input voltage in a short period. As a result, there is a concern that the power consumption increases.

The present disclosure has been made to solve such the problem, and an object of the present disclosure is to reduce the power consumption of the one-shot type comparator detecting that the analog voltage of one of two inputs reaches a reference voltage of the other of two inputs.

Solution to Problem

According to one aspect of the present disclosure, a comparator that operates by supplying a first voltage and a second voltage includes a differential amplifier circuit, a current source circuit, an output stage, a current conversion circuit, a minimum selector circuit, and a latch circuit. The differential amplifier circuit is connected to a first power supply node that supplies the first voltage through the first and second nodes. The differential amplifier circuit generates a first current and a second current having a current difference obtained by amplifying a voltage difference between the reference voltage and the input voltage at the first node and the second node. The reference voltage is previously determined between the first and second voltages. The current source circuit is connected in series with the differential amplifier circuit through a third node between a first power supply node and a second power supply node that supplies the second voltage. The current source circuit generates a third current, which is a sum of the first and second currents, at the third node. The output stage is connected between an output node and the first power supply node, and has current drive force to generate a first output current proportional to the first current between the first power supply node and the output node. The current conversion circuit has a current drive force that generates a second output current proportional to the second current between the second power supply node and the output node. The minimum selector circuit is connected between an output complementary node and the first power supply node to generate current proportional to a minimum current of the first and second currents at the output complementary node. The latch circuit is connected between the output node and the output complementary node and the second power supply node. The latch circuit executes a reset operation in which each of the output node and the output complementary node is electrically connected to the second power supply node in response to a reset signal. The latch circuit executes a positive feedback latch operation in which a change, generated in the output node, from the second voltage to the first voltage is amplified when a high and low relationship between the input voltage and the reference voltage is reversed from a cancellation time point of the reset operation while the output node and the output complementary node are electrically disconnected from the second power supply node during a circuit operation after cancellation of the reset operation, and fixes voltage at the output node to the first voltage while fixing voltage at the output complementary node to the second voltage until the reset signal is input next time.

According to another aspect of the present disclosure, an oscillator includes first and second comparators each configured of the comparator and a signal generation circuit. The signal generation circuit receives the first output signal from the first comparator and the second output signal from the second comparator to generate a periodic signal that repeats transition of a logic level. The first output signal has a logic level according to voltage at the output node of the first comparator. The second output signal has a logic level according to voltage at the output node of the second comparator. Furthermore, the input voltage of the first comparator and the input voltage of the second comparator are controlled such that a voltage change toward the reference voltage is alternately generated in response to each of transitions of a logic level of the periodic signal. The first and second comparators alternately execute the circuit operation to generate the first and second output signals according to the reference voltage and the input voltage with the voltage change. The signal generation circuit causes transition of the logic level of the periodic signal according to each of a change in the logic level in a predetermined direction of the first output signal and a change in the logic level in the predetermined direction of the second output signal.

In still another aspect of the present disclosure, a power converter is provided. The power converter is a power converter that is connected to a ground wiring and a power supply wiring, converts a first DC voltage at the power supply wiring, and outputs a second DC voltage to a DC voltage output node, and includes an output voltage monitoring comparator configured of the comparator, a drive switching element, and a voltage control circuit. The drive switching element is connected between the power supply wiring and the DC voltage output node. the output voltage monitoring comparator operates to output a control signal set to a first or second level according to voltage at the output node or the output complementary node with voltage according to the second DC voltage as the input voltage and voltage according to a target voltage at the second DC voltage as the reference voltage. The voltage control circuit control on and off of the drive switching element based on the control signal output from the output voltage monitoring comparator.

Advantageous Effects of Invention

According to the present disclosure, the voltage at the output node can be changed from the second voltage during resetting to the first voltage in response to the input voltage rising or falling to be equivalent to the reference voltage, and no current is generated in the latch circuit and the output stage except for the period in which the voltage at the output node changes. As a result, the power consumption of the one-shot type comparator that detects that the input voltage reaches the reference voltage can be reduced. Furthermore, the power consumption of the oscillator and the power converter can be reduced using the comparator.

DESCRIPTION OF EMBODIMENTS

Figure 1:
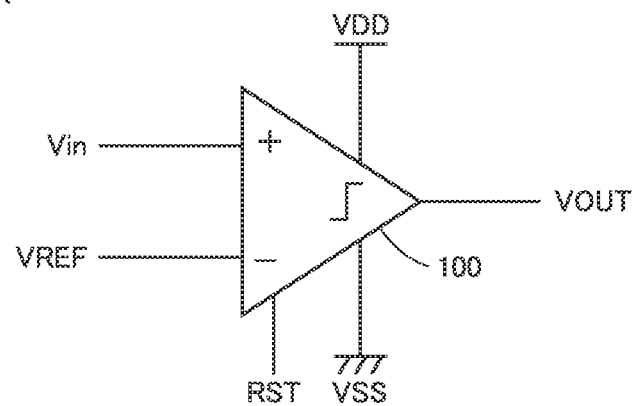
FIG. 1 is a symbol diagram illustrating input and output signals of a comparator according to the present embodiment.

With reference to the drawings, embodiments of the present disclosure will be described in detail below. A plurality of embodiments will be described below, but it is planned from a beginning of the application that configurations described in each embodiment appropriately combined within a range in which inconsistency or inconsistency is not generated including combinations not mentioned in the specification. In the drawings, the same or corresponding portion is denoted by the same reference numeral, and the description will not be repeated in principle.

First Embodiment

FIG. 1 is a symbol diagram illustrating input and output signals of a comparator according to the present embodiment.

With reference to FIG. 1, a comparator 100 of the present embodiment operates by receiving supply of a power supply voltage VDD (for example, 5 [V]) and a ground voltage VSS (0 [V]) and input of a reset signal RST. Comparator 100 receives an input voltage Vin at a (+) side input terminal and a reference voltage VREF (for example, 2.5 [V]) at a (−) side input terminal, and generates an output voltage VOUT reflecting a level of both.

Figure 2:
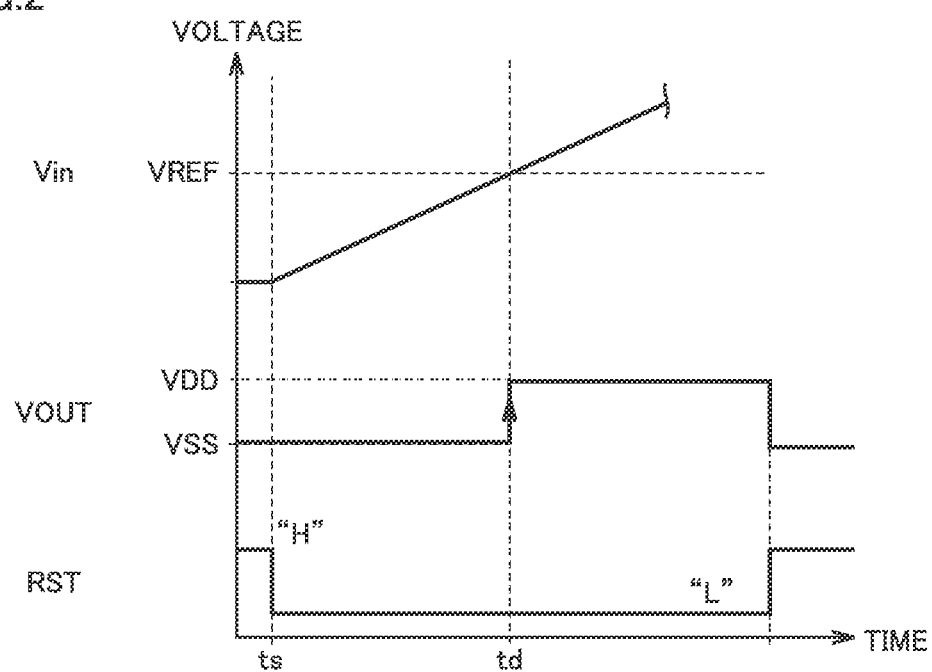
FIG. 2 is a waveform chart illustrating an operation example of the comparator of the present embodiment.

FIG. 2 is a waveform chart illustrating an operation example of comparator 100. With reference to FIG. 2, reset signal RST is set to an H-level during a non-operation period of comparator 100, and set to an L-level during an operation period of comparator 100. In an H-level period of reset signal RST, output voltage VOUT of comparator 100 is fixed to the L-level (VOUT=VSS).

When reset signal RST changes from the H-level to the L-level at a time ts, a reset operation is canceled and comparator 100 starts a circuit operation. In the example of FIG. 2, input voltage Vin is lower than reference voltage VREF at time ts, and gradually increases after time ts.

Output voltage VOUT is maintained at the initialized L-level (VOUT=VSS) until input voltage Vin reaches reference voltage VREF. At a time td, when input voltage Vin reaches reference voltage VREF, namely, when input voltage Vin intersects with reference voltage VREF, output voltage VOUT changes from the reset L-level to the H-level.

After time td, output voltage VOUT is maintained at the H-level (VOUT=VDD) until reset signal RST changes to the H-level next time. When reset signal RST changes to the H-level, output voltage VOUT changes to the L-level again, and thereafter, the operation after time ts is repeated.

Figure 3:
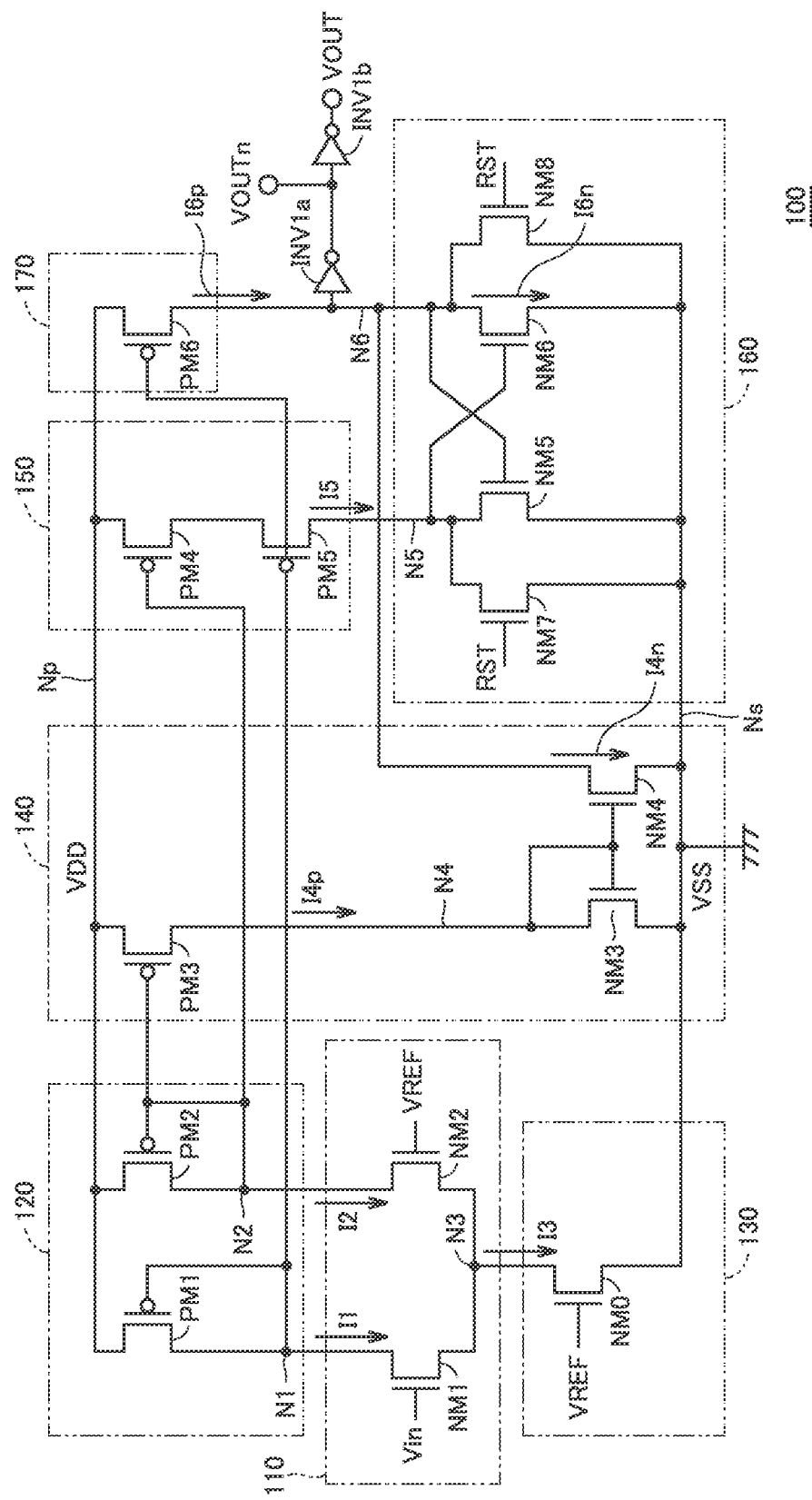
FIG. 3 is a circuit diagram illustrating a configuration example of the comparator of a first embodiment.

FIG. 3 is a circuit diagram illustrating a configuration example of comparator 100.

With reference to FIG. 3, comparator 100 includes a differential amplifier circuit 110, an active load circuit 120, a current source circuit 130, a current conversion circuit 140, a minimum selector circuit 150, a latch circuit 160, and an output stage 170.

Active load circuit 120 includes P-type transistors PM1, PM2. Transistors PM1, PM2 are connected between a power node Np that transmits power supply voltage VDD and nodes N1 and N2, respectively. A gate of transistor PM1 is connected to node N1, and a gate of transistor PM2 is connected to node N2. That is, each of transistors PM1 and PM2 functions as a diode having the side of power supply node Np as an anode.

Differential amplifier circuit 110 includes N-type transistors NM1, NM2. Transistor NM1 is connected between nodes N1 and N3, and receives input voltage Vin (FIG. 1) at the gate of transistor NM1. Transistor NM2 is connected between nodes N2 and N3, and receives reference voltage VREF (FIG. 1) at the gate of transistor NM2.

Current source circuit 130 includes an N-type transistor NM0 connected between a ground node Ns that transmits ground voltage VSS and node N3. That is, current source circuit 130 is connected in series to differential amplifier circuit 110 between power supply node Np and ground node Ns through node N3. A constant voltage (for example, reference voltage VREF) is input to the gate of transistor NM0.

Current conversion circuit 140 includes a P-type transistor PM3 and N-type transistors NM3, NM4. Transistor PM3 is connected between power supply node Np and a node N4. The gate of transistor PM3 is connected to node N2 in common with the gate of transistor PM2. Therefore, transistor PM3 configures a current mirror with transistor PM2.

Transistor NM3 is connected between node N4 and ground node Ns, and transistor NM4 is connected between a node N6 and ground node Ns. The gates of transistors NM3 and NM4 are connected to node N4. That is, transistor NM3 is diode-connected, and transistor NM4 configures the current mirror with transistor NM3.

Minimum selector circuit 150 includes P-type transistors PM4 and PM5 connected in series between power supply node Np and a node N5. The gate of transistor PM4 is connected to node N2. The gate of transistor PM5 is connected to node N1.

Output stage 170 includes a P-type transistor PM6 connected between power supply node Np and node N6. The gate of transistor PM6 is connected to node N1.

Latch circuit 160 includes N-type transistors NM5 to NMB. Transistors NM5 and NM7 are connected in parallel between node N5 and ground node Ns. Transistors NM6 and NM8 are connected in parallel between node N6 and ground node Ns. Reset signal RST is input to the gates of transistors NM7 and NM8. The gate of transistor NM5 is connected to node N6. The gate of transistor NM6 is connected to node N5.

The voltage level of node N6 is inverted and amplified by an inverter INV1a to generate voltage VOUTn, and the output of inverter INV1a is inverted and amplified by an inverter INV1b to generate output voltage VOUT of comparator 100. That is, output voltage VOUT is set to one of the H-level (VDD) and the L-level (VSS) according to the voltage at node N6. Voltage VOUTn is set to a voltage level complementary to output voltage VOUT.

For the P-type transistors PM1 to PM6 in comparator 100, transistors PM5 and PM6 can generate current proportional to that of transistor PM1. Similarly, transistors PM3 and PM4 can generate current proportional to that of transistor PM2. Here, the transistor sizes (W/L) of transistors PM1, PM2, and PM4 to PM6 are equivalent to each other, and the transistor size of transistor PM3 is (1/2) times the transistor size of transistors PM1, PM2, and PM4 to PM6.

In addition, the transistor sizes of N-type transistors NM3 and NM4 constituting the current mirror are 1:1, and transistor NM4 can flow the current equivalent to that of transistor NM3.

The operation of comparator 100 will be described below.

In the series circuit of differential amplifier circuit 110, active load circuit 120, and current source circuit 130, current I3 flowing from transistor NM3 of current source circuit 130 is the sum of current I1 flowing from transistor PM1 to node N1 and current I2 flowing from transistor PM2 to node N2. A breakdown of currents I1 and I2 with respect to current I3 is changed by the input voltage Vin (gate voltage at transistor NM1) and reference voltage VREF (gate voltage at transistor NM2). Specifically, a current difference obtained by amplifying a voltage difference between input voltage Vin and reference voltage VREF is generated between currents I1 and I2.

In current conversion circuit 140, current I4$p$ flowing from P-type transistor PM3 to node N4 is proportional to current I2, and I4$p$=I2/2 is obtained according to the ratio of the transistor sizes. On the other hand, N-type transistor NM4 generates current I4$n$ proportional to current I4$p$ from node N6 to ground node Ns. According to the transistor size ratio described above, I4$n$=I4$p$=I2/2 is obtained. As described above, current conversion circuit 140 has current drive force that generates current I4$n$ proportional to current I2 between node N6 and ground node Ns.

On the other hand, transistor PM6 of output stage 170 has the current drive force that generates current I6$p$ proportional to current I1 between power supply node Np and node N6.

In minimum selector circuit 150, transistor PM4 has the current drive force that generates current I5$a$ proportional to current I1. Transistor PM5 has the current drive force that generates current I5$b$ proportional to current I2. Because transistors PM4 and PM5 having the same transistor size are connected in series, when current I1 or I2 is zero, one of currents I5$a$ and I5$b$ proportional to current I1 or I2 becomes zero, so that current I5 flowing through node N5 and transistor NM5 becomes zero. In the case of current I5$a$=I5$b$, I5=I5$a$/2=I5$b$/2 is obtained. As a result, minimum selector circuit 150 operates so as to generate current I5 proportional to the minimum value (minimum current) of currents I1 and I2 at node N5.

In latch circuit 160, during the H-level period of reset signal RST, transistors NM7 and NM8 are turned on, so that nodes N5 and N6 are pulled down and the voltages of both nodes are reset to ground voltage VSS. As a result, as illustrated in FIG. 2, output voltage VOUT is initialized to the L-level (VSS). In addition, transistors NM5 and NM6 are turned off. When reset signal RST changes to the L-level, transistors NM7, NM8 are turned off, so that nodes N5 and N6 go into a high impedance state (HiZ). Thereafter, in nodes N5 and N6, voltage changes are generated depending on the currents flowing through nodes N5 and N6 according to currents I1 and I2. In response to the voltage change at node N6, output voltage VOUT also changes.

Figure 4:
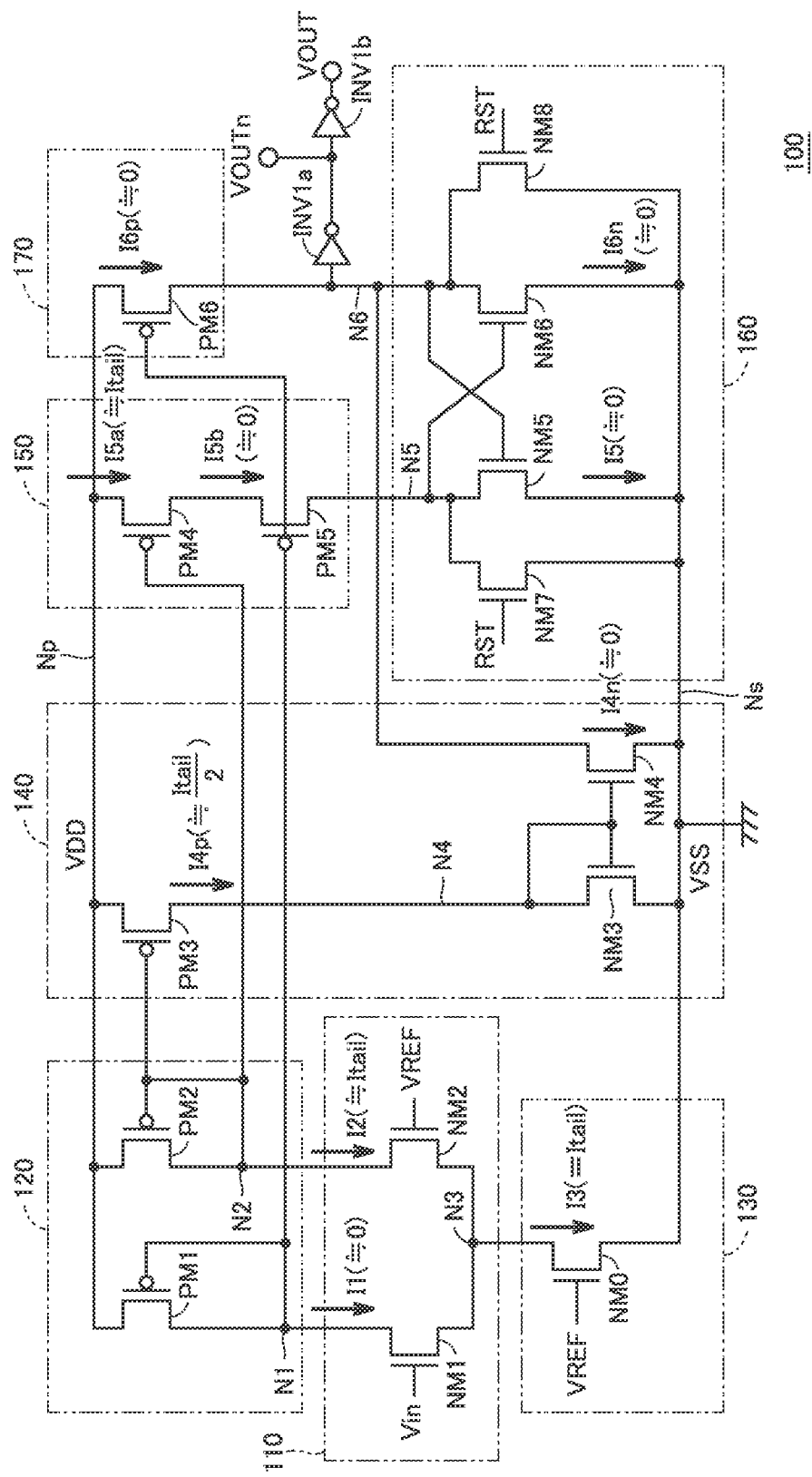
FIG. 4 is a first circuit diagram illustrating operation of the comparator in FIG. 3.
Figure 5:
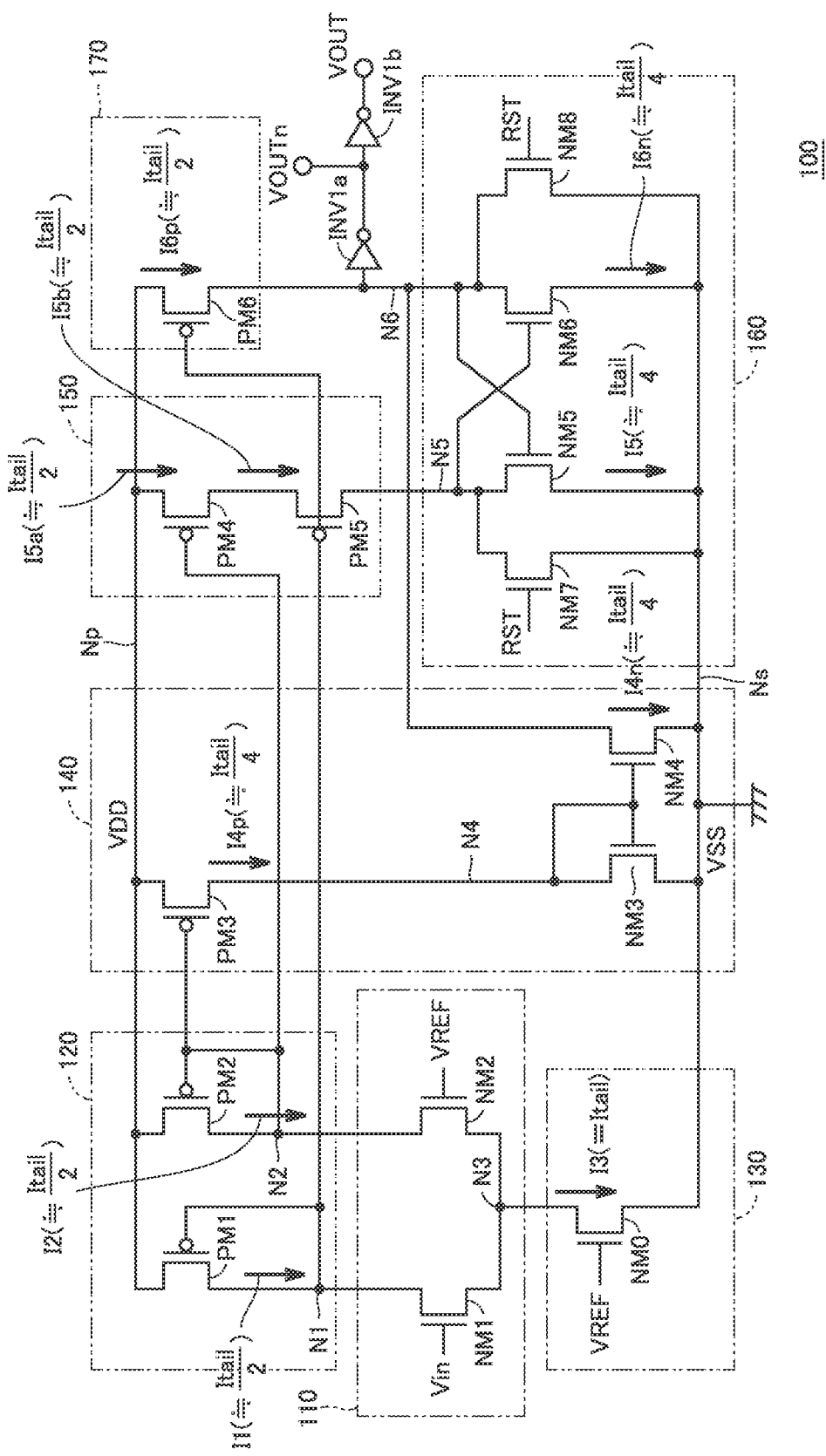
FIG. 5 is a second circuit diagram illustrating the operation of the comparator in FIG. 3.
Figure 6:
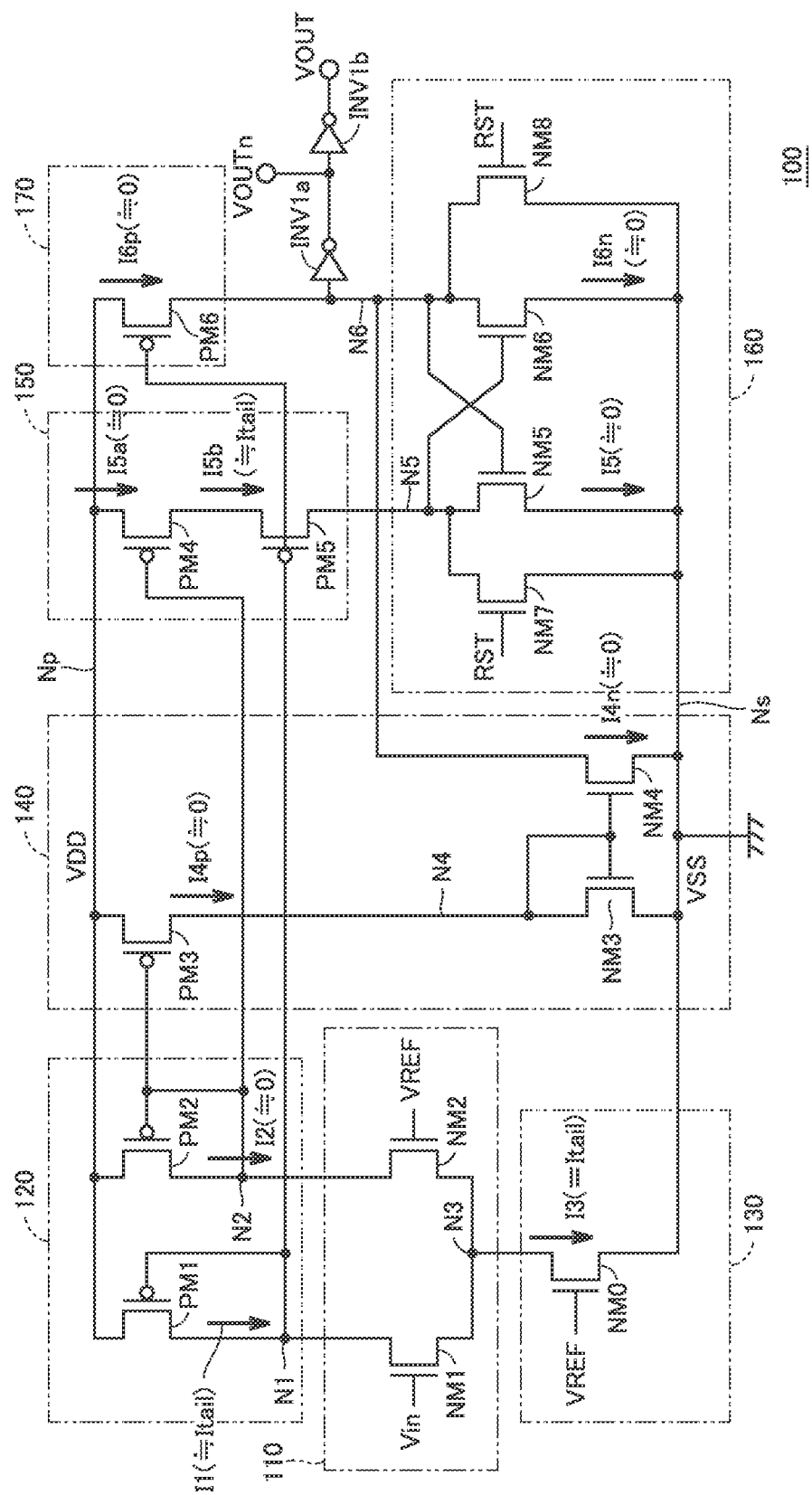
FIG. 6 is a third circuit diagram illustrating the operation of the comparator in FIG. 3.

With reference to FIGS. 4 to 6, the operation of comparator 100 for each range of input voltage Vin will be described in detail below.

FIG. 4 illustrates the operation of comparator 100 when input voltage Vin is lower than reference voltage VREF (Vin<VREF).

With reference to FIG. 4, in the series circuit of differential amplifier circuit 110, active load circuit 120, and current source circuit 130, assuming that current I3 by current source circuit 130 (transistor NM3) is equal to Itail, in the case of Vin<VREF, current I1 flowing through transistor NM1 input to the gate of input voltage Vin becomes almost becomes zero, and current I2 of transistor NM2 input to the gate of reference voltage VREF becomes almost becomes Itail.

Because current I2 (≈Itail) flows through transistor PM2, the current proportional to current I2 is generated in transistors PM3 and PM4. A current I4$p$ Itail/2) is generated from transistor PM3 to node N4 according to the above-described transistor size. On the other hand, the current drive force that generates current I5$a$ Itail acts on transistor PM4.

On the other hand, because current I1 of transistor PM1 becomes zero, current I6$p$, which is proportional to current I1, supplied from transistor PM6 to node N6 becomes zero. As a result, current I6$n$ flowing through transistor NM6 also becomes zero.

In transistor NM4, I4$p$ Itail/2 flows through transistor NM3 constituting the current mirror, but no current is supplied from transistor PM6 to node N6. As a result, current I4$n$ of transistor NM4 becomes zero. That is, for node N6, I6$p$=I6$n$=I4$n$=0 is obtained.

Furthermore, current I5$b$ of transistor PM6 of minimum selector circuit 150 also becomes zero. As a result, because the current output from minimum selector circuit 150 becomes zero, current I5 of node N5 becomes zero.

When comparator 100 starts the operation, nodes N5 and N6 change from the state of being pulled down to ground voltage VSS to the high-impedance state. In the state of FIG. 4 (Vin<VREF), as described above, no current is generated at nodes N5 and N6, so that the voltages at nodes N5 and N6 are maintained at ground voltage VSS at the start of the operation. For this reason, in latch circuit 160, transistors NM5 to NM8 are maintained in an off-state (drain current=0), and the voltage at node N6 is maintained at the ground voltage. As a result, output voltage VOUT=L-level (VSS) is obtained.

In the state of FIG. 4, for comparison between input voltage Vin and reference voltage VREF, the current is consumed in differential amplifier circuit 110, active load circuit 120, current source circuit 130, and current conversion circuit 140 while the current is not consumed in minimum selector circuit 150, latch circuit 160, and output stage 170 (I6$p$=I6 n=I5=I4 n=0). That is, the consumption current in entire comparator 100 is I2+I4$p$=(3/2)·Itail.

FIG. 5 illustrates the operation of comparator 100 when input voltage Vin is near reference voltage VREF (Vin VREF).

With reference to FIG. 5, in the series circuit of differential amplifier circuit 110, active load circuit 120, and current source circuit 130, assuming that the current I3 by the current source circuit 130 (transistor NM3) is equal to Itail, in the case of Vin VREF, current I1 flowing through transistor PM1 and current I2 of transistor PM2 are balanced, and I1=I2 becomes almost Itail/2.

As a result, the current proportional to current I1 is also generated in transistor PM5 of minimum selector circuit 150 and transistor PM6 of output stage 170. From the above-described transistor size ratio, current I5$b$=I6$p$=I1 becomes almost Itail/2.

Similarly, the current proportional to current I2 is also generated in transistor PM3 of current conversion circuit 140 and transistor PM4 of minimum selector circuit 150. From the above-described transistor size ratio, I4$p$=I2/2 becomes almost Itail/4, and I5$a$=I6$p$=I2 becomes almost Itail/2.

In current conversion circuit 140, current I4$p$ Itail/4 flows through transistors PM3 and NM3, and current I4$n$ Itail/4 also flows through transistor NM4 constituting the current mirror with transistor NM3.

In minimum selector circuit 150, current driving forces of current I5$a$ Itail/2 and current I5$b$=Itail/2 are generated in transistors PM4 and PM5 that are connected in series and have the same transistor size, respectively. Accordingly, current I5 output from minimum selector circuit 150 becomes I5=I5$a$/2=I5$b$/2 Itail/4.

In latch circuit 160, current I5 from minimum selector circuit 150 flows to transistor NM5 as the drain current. In addition, at node N6, current I6$n$ obtained by subtracting current I4$n$ by transistor NM4 from current I6$p$ by transistor PM6 flows through transistor NM6 as the drain current. Current I6$n$=I6$p$-I4$n$ Itail/4 is obtained.

Therefore, in the state of Vin=VREF, an equivalent drain current flows through transistors NM5 and NM6. Furthermore, because the gate-source voltages of transistors NM5 and NM6 are also equivalent, the voltages of nodes N4 and N5 are balanced at an intermediate voltage. From this state, when Vin slightly rises above VREF, the current difference (I1>I2) is generated between current I1 of transistor PM1 and current I2 of transistor PM2. In response to this, current I6$p$ of transistor PM6 of output stage 170 increases. On the other hand, in minimum selector circuit 150, because the current drive capability of transistor PM4 decreases while the current drive capability of transistor PM5 increases, current I5 output from transistors PM4 and PM5 connected in series to node N5 is lower than the state of Vin=VREF Itail/4). As a result, when the state of Vin=VREF changes to the state of Vin>VREF, even when the voltage difference between Vin and VREF is small, the voltage at node N6 rises more quickly than the voltage at node N5 due to the current difference generated at nodes N5 and N6.

As a result, transistor NM5 is turned on earlier than transistor NM6 in response to the voltage rise at node N6. As a result, because the voltage at node N5 decreases to ground voltage VSS, transistor NM6 is turned off and maintains the off-state. As a result, the voltage at node N6 rises to power supply voltage VDD, so that transistor NM5 is maintained in an on-state. As described above, in latch circuit 160, the on-state of transistor NM5 and the off-state of transistor NM6 are maintained by the positive feedback latch operation. As a result, the voltage at node N6 is fixed to the H-level (VDD), and the voltage at node N5 is fixed to the L-level (VSS).

As described above, in latch circuit 160, after the voltage difference between input voltage Vin and reference voltage VREF decreases and both currents I1 and I2 are not zero, when reference voltage VREF becomes slightly higher than input voltage Vin, namely, when the relationship between the level of input voltage Vin and reference voltage VREF is reversed from the time point at which the reset operation is canceled, the voltage at node N6 is fixed to the H-level (VDD) and the voltage at node N5 is fixed to the L-level (VSS) by the latch operation by the positive feedback. By such the circuit operation, output voltage VOUT changes from the L-level to the H-level.

FIG. 5 illustrates the current before the latch operation at Vin VREF, and in this state, the consumption current in entire comparator 100 becomes (I1+I2)+I4$p$+I5+I6$p$≈2·Itail.

FIG. 6 illustrates the operation of comparator 100 when input voltage Vin is higher than reference voltage VREF (Vin>VREF), particularly after the latch operation of the positive feedback by latch circuit 160.

With reference to FIG. 6, in the series circuit of differential amplifier circuit 110, active load circuit 120, and current source circuit 130, in the case of Vin>VREF, input voltage Vin becomes current I1 Itail flowing through transistor NM1 input to the gate, and reference voltage VREF becomes current I2≈0 of transistor NM2 input to the gate.

When current I1 becomes almost Itail, the current drive force corresponding to I5$b$=I6$p$ Itail is also generated in transistor PM5 of minimum selector circuit 150 and transistor PM6 of output stage 170.

On the other hand, because of current I2=0, current I4$p$ of transistors PM3 and NM3 of current conversion circuit 140 also becomes zero, and the current drive force of transistor PM4 of the minimum selector circuit 150 also becomes zero.

Therefore, current I5 output from minimum selector circuit 150 becomes zero. For this reason, the voltage (ground voltage VSS) at node N5 pulled down by transistor NM5 turned on when Vin=VREF is held in latch circuit 160. As illustrated in FIGS. 4 and 6, it is understood that minimum selector circuit 150 operates such that output current I5 becomes zero when one of current I1 and current I2 is zero.

On the other hand, because transistor NM6 of latch circuit 160 after the latch operation is maintained in the off-state, current I6$p$ is zero. In addition, because no current flows through transistor NM3 constituting the current mirror with transistor NM4, current I4$n$ is zero. As a result, the current path including node N6 is not formed, and no current flows through transistor PM6 (I6$p$=I6$n$=I4$n$=0). Consequently, in latch circuit 160, the voltage (VDD) of node N6 and the voltage (VSS) of node N5, which are changed by the latch operation of the positive feedback, are held while maintaining the state in which no current is generated in nodes N5 and N6. That is, output voltage VOUT is held at the H-level (VDD).

As described above, when input voltage Vin intersects with reference voltage VREF, latch circuit 160 changes output voltage VOUT from the L-level to the H-level by the positive feedback, and thereafter, holds this voltage state until reset signal RST is set to the H-level again and the reset operation is executed.

In the state of FIG. 6, after detecting that input voltage Vin reaches reference voltage VREF and changing output voltage VOUT to the H-level, namely, after the latch operation by latch circuit 160, output voltage VOUT can be maintained at the changed H-level without consuming current in current conversion circuit 140, minimum selector circuit 150, latch circuit 160, and output stage 170. That is, the current consumption of comparator 100 is only I1+I2=I3≈Itail in the series circuit of differential amplifier circuit 110, active load circuit 120, and current source circuit 130.

After latch circuit 160 executes the latch operation and the voltage at node N6 and output voltage VOUT are fixed to the H-level (VDD), namely, once the state in FIG. 5 is entered, the voltage state is maintained even in the state of Vin<VREF as described in FIG. 4. As described with reference to FIG. 4, because both current I6$p$ by transistor PM6 and current I5 by minimum selector circuit 150 become zero according to current I1=0, both nodes N5 and N6 are maintained at the latched voltages.

Figure 7:
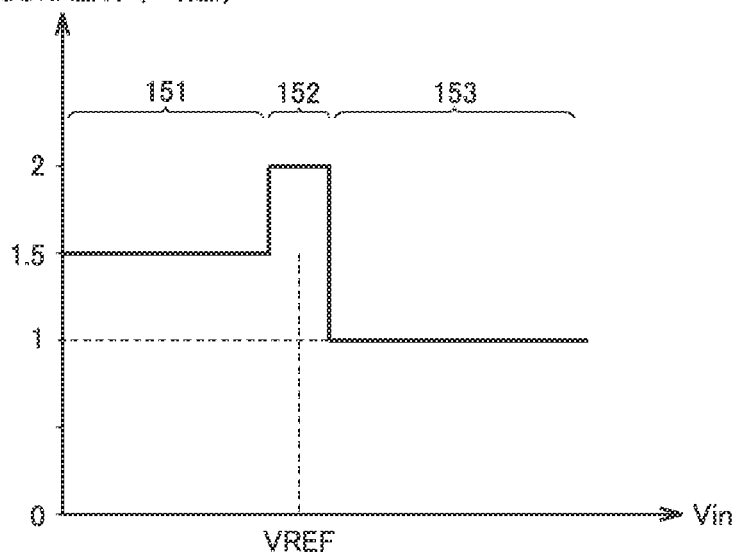
FIG. 7 is a conceptual graph illustrating current consumption of the comparator with respect to an input voltage.

FIG. 7 is a conceptual graph illustrating the current consumption of comparator 100 with respect to input voltage Vin. A vertical axis in FIG. 7 indicates a coefficient indicating how many times the current consumption of comparator 100 is Itail.

With reference to FIG. 7, in a voltage range 151 of Vin<VREF, it is in a standby state to detect that input voltage Vin reaches reference voltage VREF. As described with reference to FIG. 4, the current consumption of comparator 100 at this time is 1.5 times Itail by current source circuit 130.

In a voltage range 152 of Vin VREF, the time from the timing when input voltage Vin reaches reference voltage VREF to the time when output voltage VOUT changes, namely, the detection speed depends on the current consumption of comparator 100. In voltage range 152, as described with reference to FIG. 5, because the current is also consumed in latch circuit 160 and output stage 170, the current consumption of comparator 100 becomes twice Itail.

In a voltage range 153 of Vin>VREF, the one-shot operation of detecting that input voltage Vin reaches reference voltage VREF is completed, and output voltage VOUT is held until reset signal RST is set to the H-level next time. As described in FIG. 6, the current consumption of comparator 100 at this time is only Itail in differential amplifier circuit 110, active load circuit 120, and current source circuit 130. That is, it is understood that the current consumption after the completion of one-shot operation is significantly prevented.

As described above, according to the first embodiment, when the voltage difference between reference voltage Vin and reference voltage VREF becomes small, output voltage VOUT can be changed by positive feedback amplification using minimum selector circuit 150 and latch circuit 160. Furthermore, when the voltage difference between reference voltage Vin and reference voltage VREF is large, the current consumption by minimum selector circuit 150 and latch circuit 160 can be cut off. As a result, the power consumption of the one-shot type comparator detecting that the analog voltage (input voltage Vin) of one of the two inputs reaches reference voltage VREF of the other of the two inputs can be reduced.

Furthermore, according to comparator 100, output voltage VOUT changes at the timing when input voltage Vin intersects with reference voltage VREF without symmetrizing the circuit configuration. As a result, the high-precision (low-offset) one-shot type comparator can be configured without generating what is called a systematic offset.

In the configuration example of the first embodiment, power supply voltage VDD corresponds to one example of the "first voltage", and power supply node Np corresponds to one example of the "first power supply node". Furthermore, ground voltage VSS corresponds to one example of the "second voltage", and ground node Ns corresponds to one example of the "second power supply node". In addition, node N1 corresponds to one example of the "first node", node N2 corresponds to one example of the "second node", node N3 corresponds to one example of the "third node", node N5 corresponds to one example of the "output complementary node", and node N6 corresponds to one example of the "output node". Furthermore, current I1 corresponds to one example of the "first current", current I2 corresponds to one example of the "second current", current I3 corresponds to one example of the "third current", current I6$p$ corresponds to one example of the "first output current", and current I4$n$ corresponds to one example of the "second output current".

Furthermore, in the configuration example of the first embodiment, the N-type transistor corresponds to one example of the "first conductivity type" transistor, transistor NM1 corresponds to one example of the "first transistor", transistor NM2 corresponds to one example of the "second transistor", transistor NM0 corresponds to one example of the "third transistor", and transistor NM4 corresponds to one example of the "fourth transistor". Furthermore, in latch circuit 160, transistors NM5 to NM8 correspond to examples of each of the "eighth transistor" to the "eleventh transistor". Furthermore, the P-type transistor corresponds to one example of the "second conductivity type" transistor, transistor PM5 corresponds to one example of the "fifth transistor", transistor PM4 corresponds to one example of the "sixth transistor", and transistor PM6 corresponds to one example of the "seventh transistor".

First Modification of First Embodiment

Figure 8:
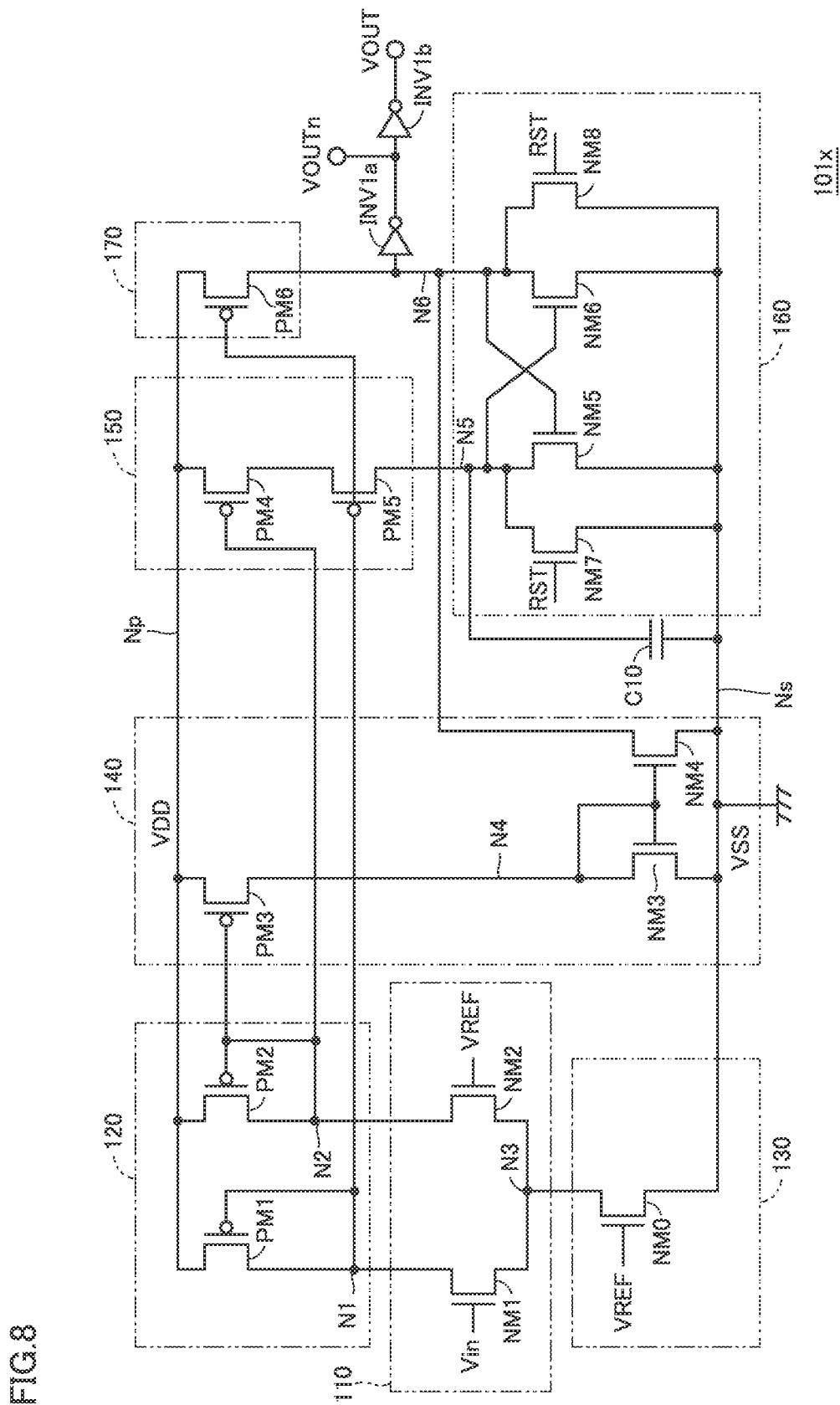
FIG. 8 is a circuit diagram illustrating a configuration example of a comparator according to a first modification of the first embodiment.

FIG. 8 is a circuit diagram illustrating a configuration example of a comparator according to a first modification of the first embodiment.

With reference to FIG. 8, a comparator 101$x$ of the first modification of the first embodiment is different from comparator 100 (FIG. 3) of the first embodiment in that latch circuit 160 further includes a capacitor C10. The capacitor C10 is connected between node N5 and ground node Ns. Because other configurations of comparator 101$x$ are similar to those of comparator 100 (FIG. 3) of the first embodiment, detailed description thereof will not be repeated.

In comparator 100 of FIG. 3, when a manufacturing variation, for example, a difference in a threshold voltage or the like of the transistors occurs between N-type transistors NM5 and NM6 or between P-type transistors PM4 to PM6 constituting latch circuit 160, there is a fear that output voltage VOUT changes from the L-level to the H-level by starting the positive feedback in latch circuit 160 at the timing deviated from the timing at which Vin=VREF is accurately satisfied.

Alternatively, because node N5 is in the high impedance state after the reset cancellation when reset signal RST changes to the L-level, there is a concern that latch circuit 160 starts the operation (positive feedback) at incorrect timing due to voltage fluctuation of node N5 due to a noise or the like.

On the other hand, according to comparator 101$x$ of the first modification of the first embodiment, the voltage at node N5 can be held at ground voltage VSS by the disposition of capacitor C10 until Vin=VREF is reliably satisfied after the reset cancellation. As a result, latch circuit 160 can be prevented from starting the operation (positive feedback) at erroneous timing. As a result, the detection accuracy of the comparator can be enhanced.

In the first modification of the first embodiment, there is a concern that the detection of the timing at which input voltage Vin reaches reference voltage VREF is delayed due to the disposition of capacitor C10. However, once latch circuit 160 starts the amplification operation, output voltage VOUT can be quickly changed from the L-level to the H-level. Therefore, by appropriately designing the capacitance value of capacitor C10, the above-described detection delay can be adjusted to a level at which there is no influence.

Second Modification of First Embodiment

Figure 18:
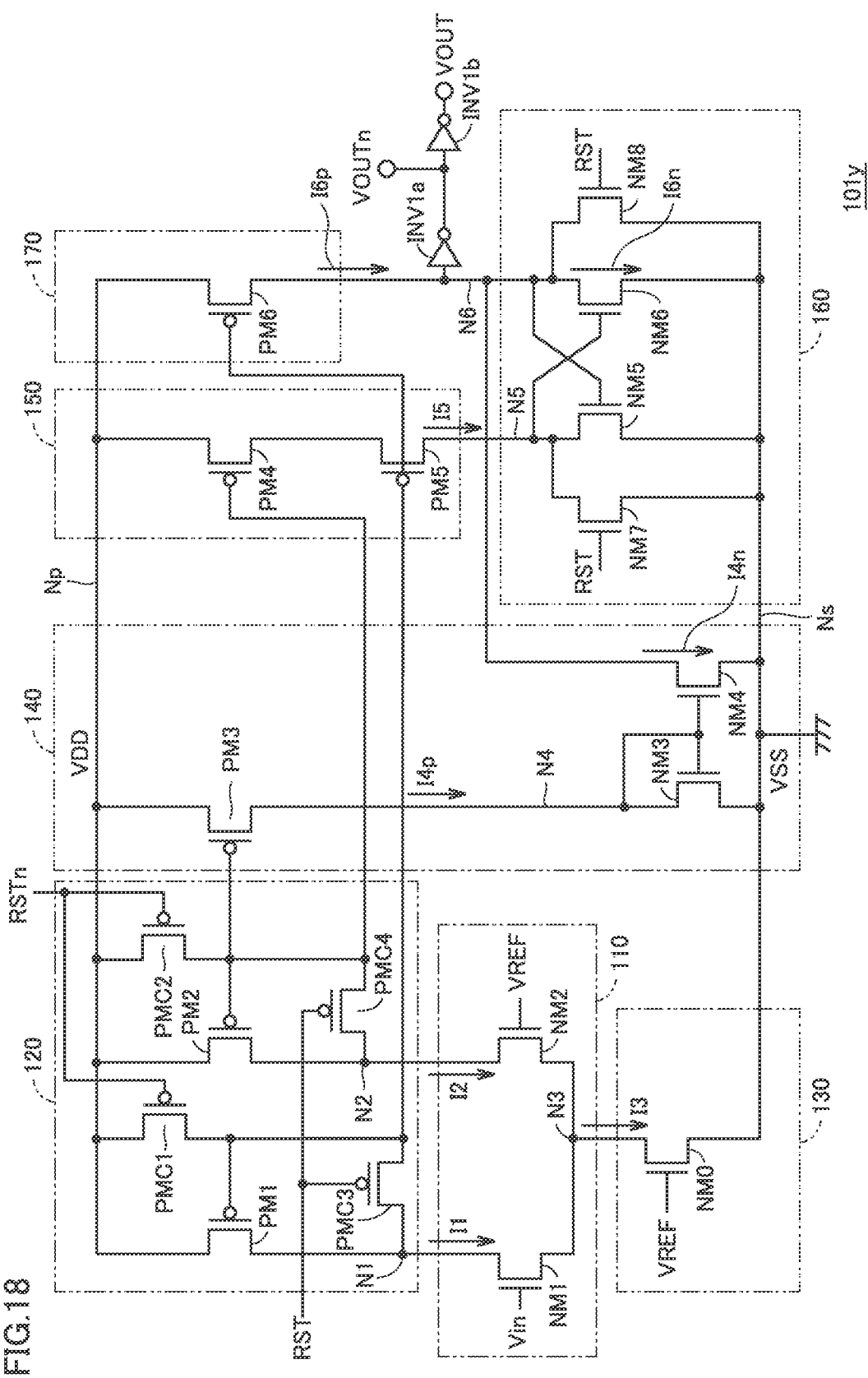
FIG. 18 is a circuit diagram illustrating a configuration example of a comparator according to a second modification of the first embodiment.

FIG. 18 is a circuit diagram illustrating a configuration example of a comparator according to a second modification of the first embodiment.

With reference to FIG. 18, a comparator 101$y$ of the second modification of the first embodiment is different from comparator 100 (FIG. 3) of the first embodiment in that active load circuit 120 further includes P-type transistors PMC1 to PMC4 cutting off the current during the reset operation.

Transistor PMC1 is connected between power node Np and the gate of transistor PM1. Transistor PMC2 is connected between power node Np and the gate of transistor PM2. Transistor PMC3 is connected between the gate of transistor PM1 and node N1. Transistor PMC4 is connected between the gate of transistor PM2 and node N2. Because other configurations of comparator 101$y$ are similar to those of comparator 100 (FIG. 3) of the first embodiment, detailed description thereof will not be repeated.

Reset signal RST is input to the gates of transistors PMC1 and PMC2. An inverted signal RSTn of reset signal RST is input to the gates of transistors PMC3 and PMC4.

Accordingly, during reset operation (RST=H-level), transistors PMC1 and PMC2 are turned on while transistors PMC3 and PMC4 are turned off. As a result, the gates of transistors PM1 and PM2 are disconnected from nodes N1 and N2, respectively, and are connected to power supply node Np (power supply voltage VDD). As a result, transistors PM1 and PM2 are reliably turned off.

On the other hand, during the circuit operation (RST=L-level) of comparator 101y after the reset cancellation, transistors PM1 and PMC2 are turned off while transistors PMC3 and PMC4 are turned on. Accordingly, as in FIG. 3, the gates of transistors PM1 and PM2 are connected to nodes N1 and N2, respectively, and are disconnected from power supply node Np. As a result, it is understood that the circuit operation of comparator 101y at RST=L-level is the same as that of comparator 100 of the first embodiment in FIG. 3.

As described above, in comparator 101y of the second modification of the first embodiment, it is possible to suppress the power consumption to almost zero (strictly speaking, the leakage current of the order less than or equal to nanoamperes (nA)) by cutting off the current path by transistors PM1 and PM2 of active load circuit 120 during the reset operation. The power consumption of the one-shot type comparator can further be reduced.

In FIG. 18, P-type transistors PM1 and PM2 in active load circuit 120 correspond to examples of the "twelfth transistor" and the "thirteenth transistor". In addition, the current path by each of diode-connected transistors PM1 and PM2 corresponds to examples of the "first current path" and the "second current path". Furthermore, one example of the "current interrupting mechanism" can be formed by P-type transistors PMC1 to PMC4.

Third Modification of First Embodiment

Figure 19A:
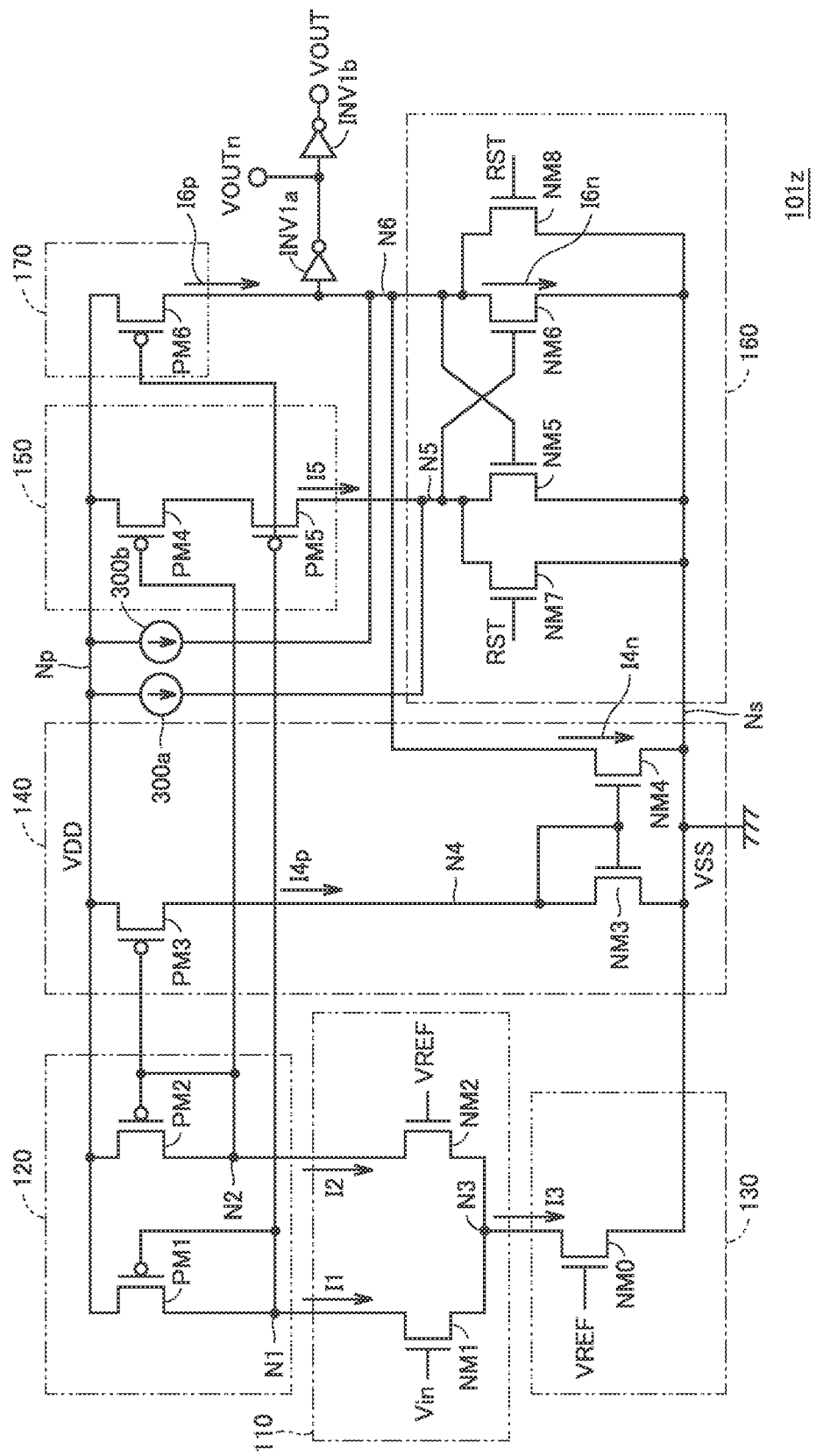
FIG. 19A is a circuit diagram illustrating a first configuration example of a comparator according to a third modification of the first embodiment.
Figure 19B:
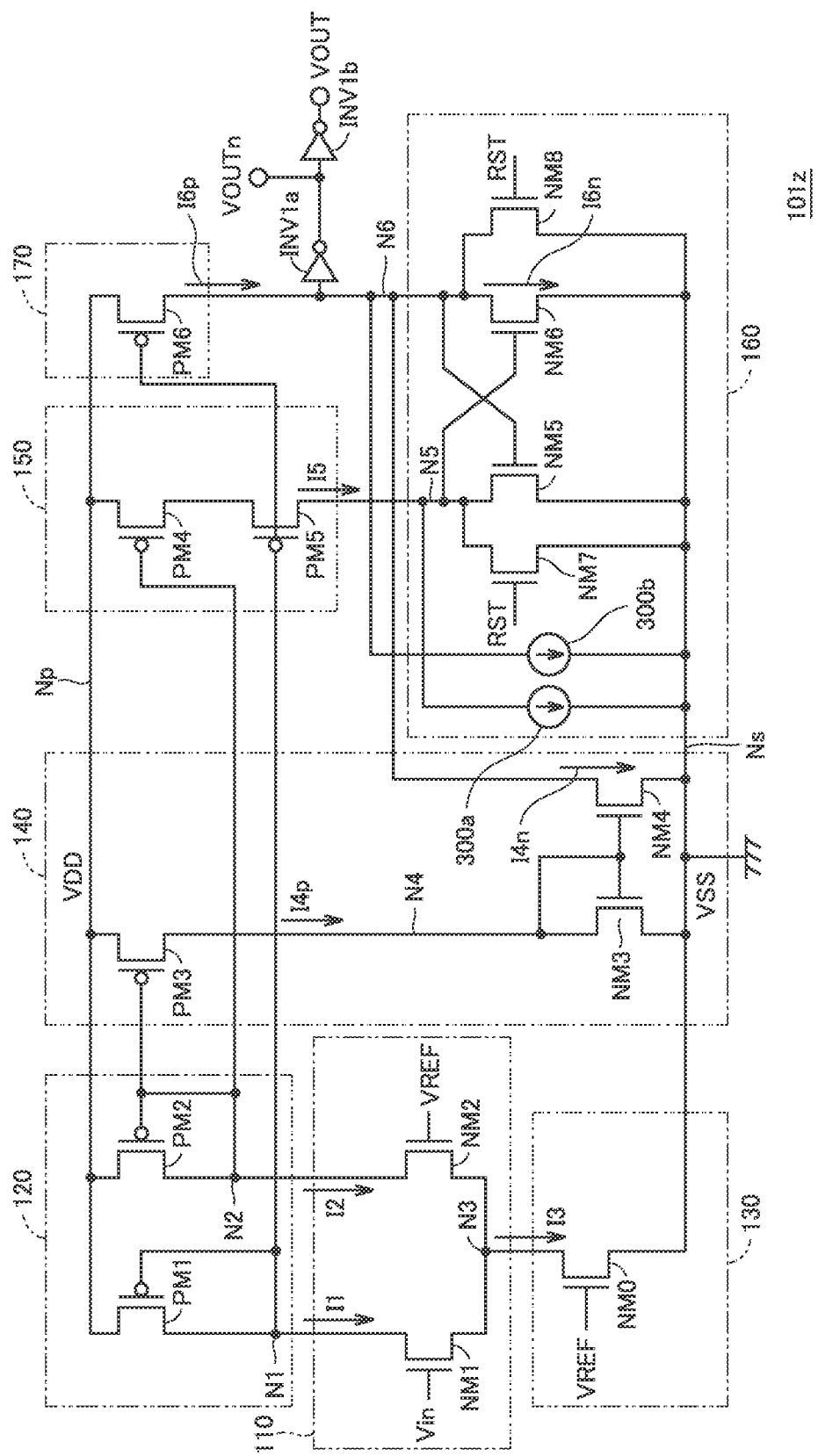
FIG. 19B is a circuit diagram illustrating a second configuration example of the comparator of the third modification of the first embodiment.

FIGS. 19A and 19B are circuit diagrams illustrating a configuration example of a comparator according to a third modification of the first embodiment.

With reference to FIG. 19A, a comparator 101z of the third modification of the first embodiment is different from comparator 100 (FIG. 3) of the first embodiment in further including current sources 300a and 300b. Current source 300a is disposed so as to supply a minute current to node N5, and current source 300b is disposed so as to supply a minute current to node N6. Because other configurations of comparator 101z are similar to those of comparator 100 (FIG. 3) of the first embodiment, detailed description thereof will not be repeated.

As described with reference to FIG. 4, when reset signal RST changes from the H-level to the L-level to cancel the reset operation, nodes N5 and N6 are set to HiZ (high impedance state) according to the turn-off of transistors NM7 and NM8. Thereafter, in comparator 100, latch circuit 160 executes the latch operation by the positive feedback according to the voltage difference generated at nodes N5 and N6 when input voltage Vin and reference voltage VREF intersect with each other, so that output voltage VOUT changes from the L-level to the H-level.

However, in comparator 100, while nodes N5 and N6 are in the HiZ period, there is a fear that latch circuit 160 executes the latch operation by the above-described positive feedback in response to the voltage difference between nodes N5 and N6 caused by the noise going around from power supply node Np, ground node Ns, or the like before input voltage Vin and reference voltage VREF intersect with each other. As a result, there is a concern that a malfunction of comparator 100 is generated, output voltage VOUT changing although input voltage Vin and reference voltage VREF do not intersect with each other in the malfunction.

In order to suppress the above-described malfunction, current sources 300a, 300b generate a minute bias current (nA order) operating transistors NM5, NM6 of latch circuit 160 in the sub-threshold region. By disposing current sources 300a, 300b, a minute current path by the bias current can be formed between each of nodes N5 and N6 and ground node Ns until latch circuit 160 performs the above-described latch operation after the cancellation of the reset operation (RST=L-level). As a result, the voltages at nodes N5 and N6 can be stabilized near the threshold voltages of transistors NM5 and NM6 by transistors NM5 and NM6 operating in the subthreshold region.

On the other hand, when input voltage Vin and reference voltage VREF intersect with each other after the reset cancellation, the potential difference is generated between nodes N5 and N6 due to the current difference between currents I5 and I6n, which is much larger than the bias current by current sources 300a, 300b. Therefore, at this time, similarly to the comparator 100 according to the first embodiment, the latch circuit 160 performs the latch operation by positive feedback, so that the output voltage VOUT changes.

Note that FIG. 19A illustrates a configuration example in which current sources 300a and 300b are connected between nodes N5 and N6 and power supply node Np. However, as illustrated in FIG. 19B, in comparator 101z of the third modification of the first embodiment, current sources 300a and 300b may be connected between nodes N5 and N6 and ground node Ns.

With reference to FIG. 19B, current source 300a is connected between ground node Ns and node N5, and current source 300b is connected between ground node Ns and node N6.

Current source 300a can operate transistor NM5 in the subthreshold region similarly to in FIG. 19A by generating the current smaller than the current supplied to node N5 by minimum selector circuit 150 (transistors PM4 and PM5 connected in series) until latch circuit 160 performs the latch operation after the cancellation of the reset operation (RST=L-level).

Similarly, current source 300b can operate transistor NM6 in the subthreshold region similarly to FIG. 19A by generating the current smaller than the current supplied to node N6 by output stage 170 (transistor PM6) until latch circuit 160 performs the latch operation after the cancellation of the reset operation (RST=L-level). For example, current sources 300a, 300b can be constituted by N-type transistors constituting the current mirror with transistor NM4.

Also in the configuration of FIG. 19B, by disposing current sources 300a, 300b, the voltages at nodes N5 and N6 can be stabilized by transistors NM5 and NM6 operating in the subthreshold region until latch circuit 160 performs the above-described latch operation after the cancellation of the reset operation (RST=L-level).

In FIGS. 19A and 19B, current source 300a corresponds to one example of the "first auxiliary current source", and current source 300b corresponds to one example of a "second auxiliary current source". Furthermore, transistors NM5 and NM6 correspond to examples of the "transistors constituting the cross-coupled circuit" in addition to the "eighth transistor" and the "ninth transistor".

As described above, in comparator 101z of the third modification of the first embodiment, transistors NM5 and NM6 constituting the cross-coupled circuit can be operated in the subthreshold region after the cancellation of the reset operation by the minute currents generated by current sources 300a, 300b. Thus, the malfunction caused by the change in the voltages of nodes N5 and N6 due to disturbance such as the noise can be prevented. Note that the first to third modification of the first embodiment can be combined with each other.

Second Embodiment

As described in the first embodiment, because current I3 (Itail) by current source circuit 130 is the passage current of differential amplifier circuit 110, current I3 affects the detection speed of input voltage Vin. Through voltage range 151 to 153 (FIG. 7) of input voltage Vin, the consumption current of the comparator is indicated by a multiple of current Itail. Accordingly, in a second embodiment, a configuration in which current I3 by current source circuit 130 is variably controlled according to input voltage Vin will be described.

Figure 9:
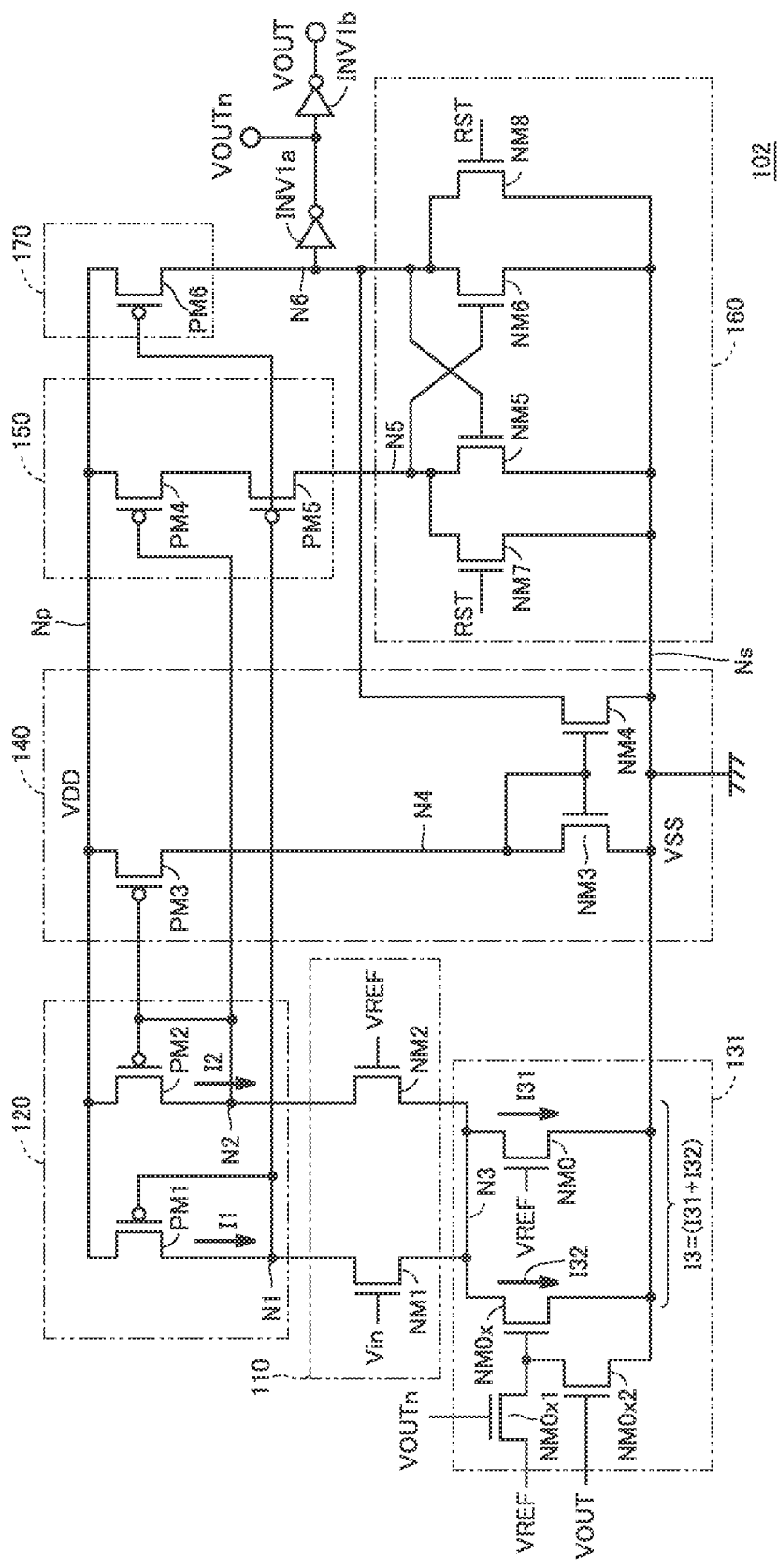
FIG. 9 is a circuit diagram illustrating a configuration example of a comparator according to a second embodiment.

FIG. 9 is a circuit diagram illustrating a configuration example of a comparator of the second embodiment.

With reference to FIG. 9, a comparator 102 of the second embodiment is different from comparator 100 (FIG. 3) of the first embodiment in that a current source circuit 131 is disposed instead of current source circuit 130. Because the circuit configurations of other part of comparator 102 is similar to those of comparator 100 (FIG. 3) of the first embodiment, detailed description thereof will not be repeated.

Current source circuit 131 further includes N-type transistors NM0x, NM0x1, NM0x2 in addition to N-type transistor NM0 similar to current source circuit 130. Transistor NM0x is connected between node N3 and ground node Ns in parallel with transistor NM0. Therefore, current I3 by current source circuit 131 is indicated by the sum of current I31 of transistor NM0 and current I32 of transistor NM0x (I3=I31+I32).

Transistors NM0x1 and NM0x2 are connected to the gate of transistor NM0x. Voltage VOUTn is input to the gate of transistor NM0x1. Output voltage VOUT is input to the gate of transistor NM0x2. Therefore, transistors NM0x1 and NM0x2 are complementarily turned on and off.

Specifically, in a period in which voltage VOUTn is set to the H-level while output voltage VOUT is set to the L-level according to reset signal RST=H-level, transistor NM0x1 is turned on while transistor NM0x2 is turned off. Therefore, when a constant voltage (for example, reference voltage VREF) common to transistor NM0 is input to the gate of transistor NM0x to generate current I32.

On the other hand, in a period in which output voltage VOUT is set to the H-level while voltage VOUTn is set to the L-level, transistor NM0x2 is turned on while transistor NM0x1 is turned off. Therefore, ground voltage VSS is input to the gate of transistor NM0x. As a result, because transistor NM0x is turned off, current I32 becomes zero.

Figure 10:
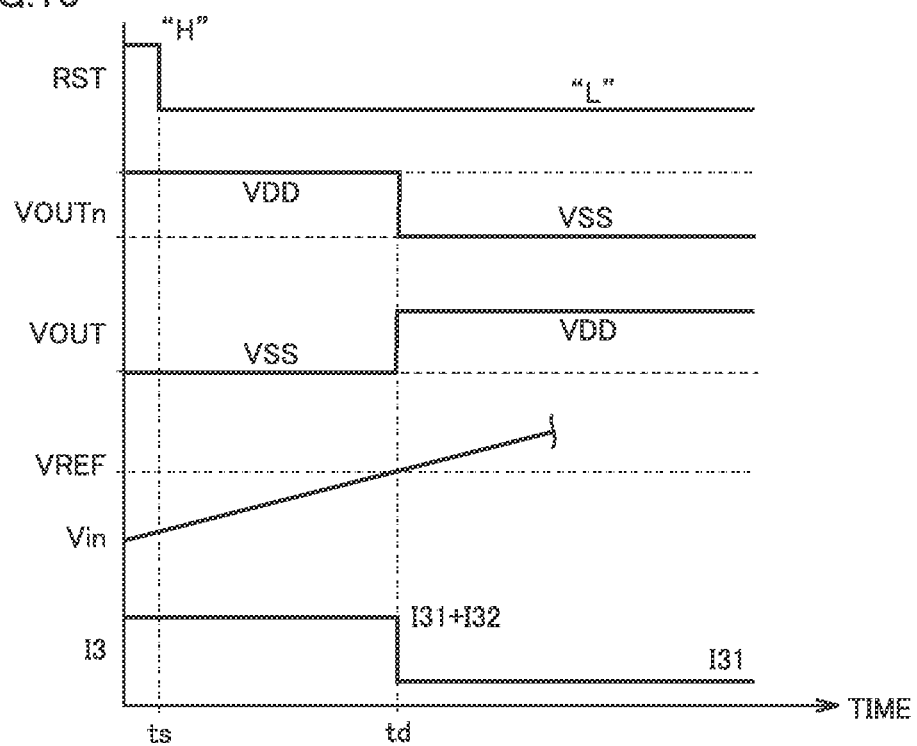
FIG. 10 is a waveform chart illustrating a comparator operation example of the second embodiment.

FIG. 10 is a waveform chart illustrating the operation of comparator 102 in FIG. 9.

With reference to FIG. 10, when the reset operation is canceled at time ts, the comparator 102 starts the operation. As described with reference to FIG. 2, in the period from time ts to time td until the input voltage Vin intersects with the reference voltage VREF, the output voltage VOUT=L level and the voltage VOUTn=H level. The period from time ts to time td corresponds to voltage range 151 and a part of voltage range 152 (range of Vin<VREF) in FIG. 7. During this period, the constant voltage (reference voltage VREF) is supplied to the gates of transistors NM0 and NM0x. Accordingly, current I3 of current source circuit 131 is I3=I31+I32.

On the other hand, in the period after time td when input voltage Vin reaches reference voltage VREF, output voltage VOUT=H-level and voltage VOUTn=L-level. The period after time td corresponds to voltage range 153 and a part of voltage range 152 (range of Vin>VREF) in FIG. 7. During this period, the constant voltage (reference voltage VREF) is supplied to transistor NM0 while transistor NM0x is turned off. Accordingly, current I3 of current source circuit 131 is I3=I31, and current I3 decreases.

As a result, in the comparator of the second embodiment, until it is detected that input voltage Vin intersects with reference voltage VREF (input voltage Vin reaches reference voltage VREF), the detection speed of the one-shot type comparator can be increased by increasing current I3 of current source circuit 131 as compared with after the detection. In addition, the low power consumption effect can be enhanced by narrowing current I3 after the detection.

Currents I31 and I32 can be adjusted by the transistor sizes of transistors NM0 and NM0x. For example, when current I31 in FIG. 9 is made smaller than current I3 of the first embodiment (FIG. 3) and current I31+I32 in FIG. 9 is adjusted to be higher than current I3 of the first embodiment, both improvement of the detection speed and reduction of the power consumption can be achieved as compared with the first embodiment.

Modification of Second Embodiment

Figure 11:
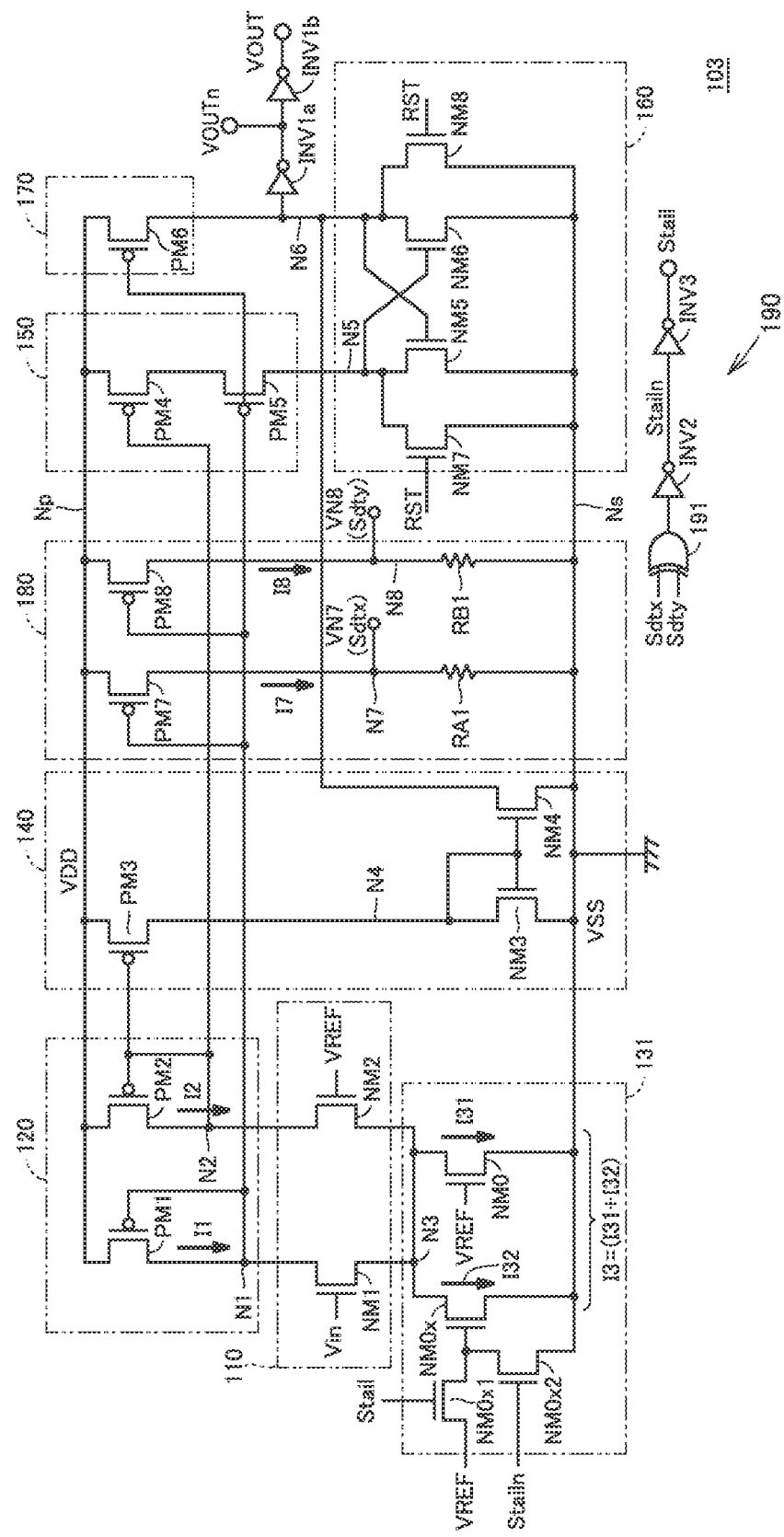
FIG. 11 is a circuit diagram illustrating a configuration example of a comparator according to a modification of the second embodiment.

FIG. 11 is a circuit diagram illustrating a configuration example of a comparator according to a modification of the second embodiment.

With reference to FIG. 11, a comparator 103 of the modification of the second embodiment further includes an input voltage detection circuit 180 and a current control signal generation circuit 190 as compared with comparator 102 of the second embodiment. Furthermore, in current source circuit 131 including transistors NM0, NM0x, NM0x1, NM0x2 similarly to FIG. 9, control signal from the current control signal generation circuit 190 is input to the gates of transistors NM0x1 and NM0x2. Because the circuit configurations of other part of comparator 103 is similar to those of comparator 102 (FIG. 9) of the second embodiment, detailed description thereof will not be repeated.

Current control signal generation circuit 190 includes P-type transistors PM7 and PM8 and resistive elements RA1 and RB1. Transistor PM7 and resistance element RA1 are connected in series between power supply node Np and ground node Ns through a node N7. Similarly, transistor PM8 and resistive element RB1 are connected in series between power supply node Np and ground node Ns through a node N8.

The gates of transistors PM7 and PM8 are connected to the gate of P-type transistor PM1 through which current I1 passes. Accordingly, currents I7 and I8 proportional to current I1 flow through transistors PM7 and PM8, respectively. In node N7, voltage VN7 according to the product of current I7 and the resistance value of resistance element RA1 is generated. Similarly, voltage VN8 according to the product of current I8 and the resistance value of resistive element RB1 is generated at node N8. As a result, voltages VN7 and VN8 are proportional to current I1 generated in differential amplifier circuit 110 according to input voltage Vin.

Current control signal generation circuit 190 includes a logic gate 191 and inverters INV2, INV3. Logic gate 191 outputs an exclusive OR (XOR) of control signals Sdtx and Sdty.

Control signal Sdtx is a signal obtained by binary conversion of voltage VN7. The resistance value of resistive element RA1 is adjusted such that Sdtx=L-level when Vin is less than or equal to a determination voltage Vx (Vx<VREF), while Sdtx=H-level in the case of Vin>Vx. Similarly, control signal Sdty is a signal obtained by binary conversion of voltage VN8. The resistance value of resistive element RB1 is adjusted such that Sdty=L-level when Vin is less than or equal to a determination voltage Vy (Vy>VREF), while and Sdty=H-level in the case of Vin>Vy.

A control signal Stail has the same signal level as the output signal of logic gate 191, and is input to the gate of transistor NM0x1 of current source circuit 132. On the other hand, a control signal Stailn having a signal level opposite to control signal Stail is input to the gate of transistor NM0x2 of current source circuit 132.

Figure 12:
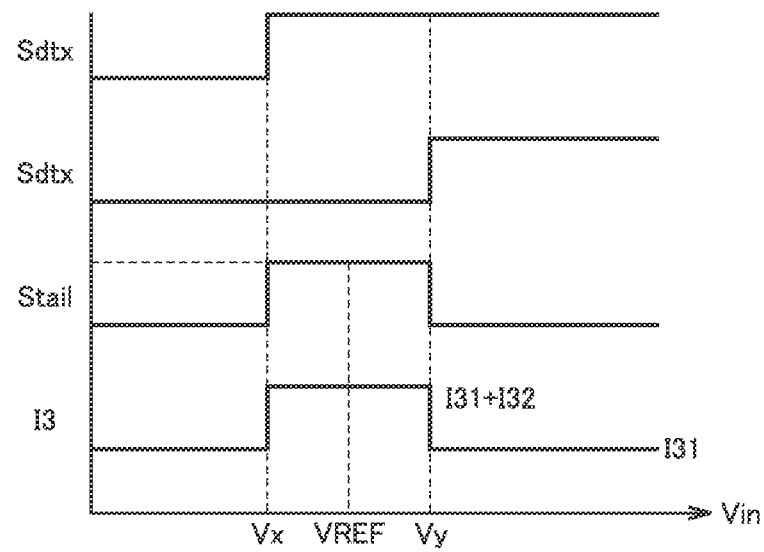
FIG. 12 is a waveform chart illustrating operation of the comparator of the modification of the second embodiment.

FIG. 12 is a waveform chart illustrating operation of the comparator of the modification of the second embodiment.

With reference to FIG. 12, in the range of input voltage Vin≤Vx, because both control signals Sdtx and Sdty are at the L-level, control signal Stail is at the L-level, and control signal Stailn is at the H-level. Therefore, ground voltage VSS is input to the gate of transistor NM0x by turning on transistor NM0x2 while turning off transistor NM0x1. As a result, transistor NM0x is turned off, and current I3 by current source circuit 131 is generated only by transistor NM0 (I3=I31).

In the range of Vx<Vin<Vy, because control signal Sdtx is at the H-level while control signal Sdty is at the L-level, control signal Stail is at the H-level, and control signal Stailn is at the L-level. Therefore, reference voltage VREF is input to the gate of transistor NM0x by turning on transistor NM0x1 while turning off transistor NM0x2. As a result, current I3 by current source circuit 131 is generated by both transistors NM0 and NM0x (I3=I31+I32).

In the range of input voltage Vin>Vy, because both control signals Sdtx and Sdty are at the H-level, control signal Stail is at the L-level, and control signal Stailn is at the H-level. Therefore, similarly to the case of Vin<Vx, the transistor NM0x is turned off, and the current I3 by the current source circuit 131 is generated only by the transistor NM0 (I3=I31).

As a result, in the comparator of the modification of the second embodiment, when input voltage Vin is within a predetermined voltage range (Vx<Vin<Vy) including reference voltage VREF, the detection speed of the one-shot type comparator can be increased by increasing current I3 of current source circuit 131 as compared with when input voltage Vin is outside the voltage range. In addition, the low power consumption effect can be enhanced by narrowing current I3 in the case of Vin<Vx and Vin>Vy. Currents I31 and I32 can be adjusted by the transistor sizes of transistors NM0 and NM0x similarly to the second embodiment. Transistor NM0x in the second embodiment and the modification thereof corresponds to one example of the "first auxiliary transistor".

The second embodiment and the modifications thereof can be combined with at least one of the first modification (capacitor C10), the second modification (transistors PMC1 to PMC4), and the third modification (current sources 300*a* and 300*b*) of the first embodiment. For example, when combined with the first modification of the first embodiment, each of comparators 102 (FIG. 9) and 103 (FIG. 11) can have a circuit configuration in which capacitor C10 (FIG. 8) is further provided between node N5 and ground node Ns. In addition, in the case of being combined with the third modification of the first embodiment, in each of comparators 102 (FIG. 9) and 103 (FIG. 11), a circuit configuration in which current sources 300*a* and 300*b* (FIG. 19A or 19B) are connected to nodes N5 and N6 can be adopted.

In particular, in comparator 102 (FIG. 9) of the second embodiment, the current consumption of current source circuit 131 in the period of output voltage VOUT=L-level increases, so that it is preferable to combine with the second modification of the first embodiment. Specifically, in active load circuit 120, transistors PMC1 to PMC4 similar to those in FIG. 18 are preferably disposed with respect to the gates of transistors PM1, PM2. With such the configuration, at the time of the reset operation (RST=H-level) in which output voltage VOUT is fixed to the L-level, by cutting off the current path by transistors PM1, PM2, the current consumption of current source circuit 131 can also be made substantially zero. Also in comparator 103 (FIG. 11) of the modification of the second embodiment, it is possible to combine the second modification of the first embodiment by disposing transistors PMC1 to PMC4 similarly to FIG. 18.

Third Embodiment

Figure 13:
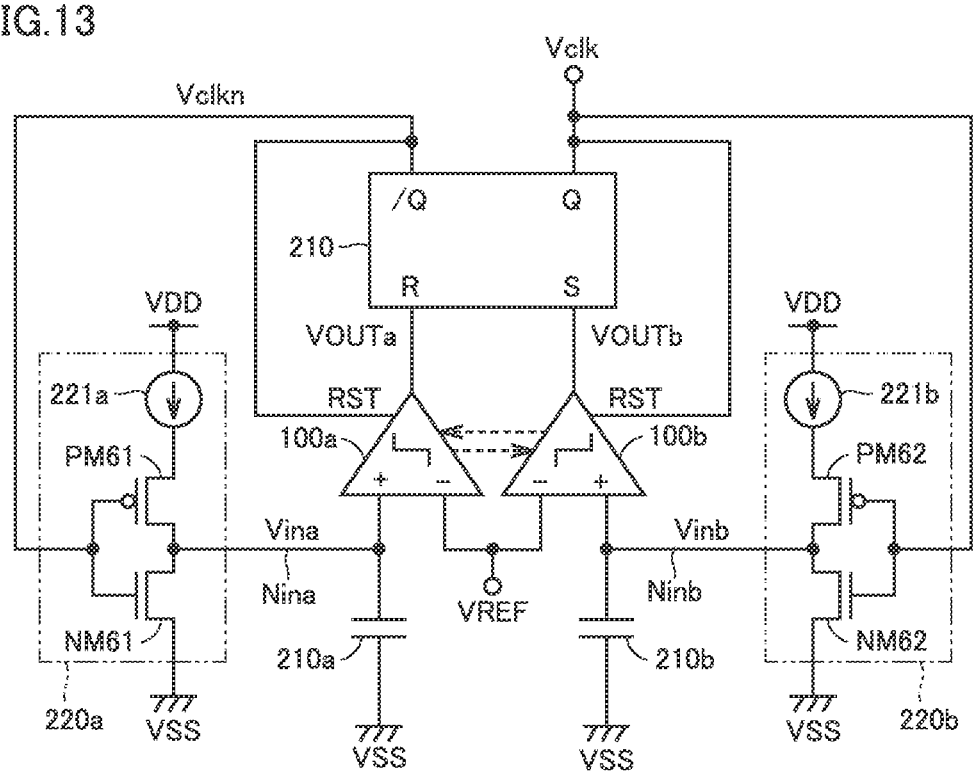
FIG. 13 is a circuit diagram illustrating a configuration example of an oscillator according to a third embodiment.

FIG. 13 is a circuit diagram illustrating a configuration example of an oscillator according to a third embodiment.

With reference to FIG. 13, an oscillator 200 of the present embodiment includes comparators 100*a*, 100*b*, an RS type flip-flop 210, capacitors 210*a*, 210*b*, and charge-discharge control circuits 220*a*, 220*b*. Comparators 100, 101, 101*x* to 101*z*, 102, 103 of the first and second embodiments and their modifications can be applied to comparators 100*a*, 100*b*. As described later, oscillator 200 generates clock voltages Vclk and Vclkn that periodically repeat the H-level (VDD) and the L-level (VSS) using the output signals of two comparators 100*a*, 100*b* operating alternately as input of flip-flop 210. Flip-flop 210 can be configured by an RS flip-flop.

In flip-flop 210, output voltage VOUTb of comparator 100*b* is input to an S (set) terminal, and output voltage VOUTa of comparator 100*a* is input to a R (reset) terminal. Clock voltage Vclk output from a Q terminal is set to the H-level when the input signal of the S terminal changes from the L-level to the H-level, and is set to the L-level when the input signal of an R terminal changes from the L-level to the H-level. At other timings, clock voltage Vclk maintains the current level. Clock voltage Vclkn in which the logic level of clock voltage Vclk is inverted is output from a/Q terminal.

Capacitors 210*a*, 210*b* having the same capacitance value are connected to input nodes Nina, Ninb of comparators 100*a*, 100*b*. Capacitor 210*a* is charged and discharged according to clock voltage Vclkn by charge-discharge control circuit 220*a*. Charge-discharge control circuit 220*a* includes a current source 221*a*, a P-type transistor PM61, and an N-type transistor NM61. Current source 221*a* and transistor PM61 are connected in series between power supply node Np and input node Nina. Transistor NM61 is connected between input node Nina and ground node Ns. Therefore, in the case of Vclkn=L-level (Vclk=H-level), capacitor 210*a* is charged with the constant current by current source 221*a*. On the other hand, in the case of Vclkn=H-level (Vclk=L-level), capacitor 210*a* is pulled down by transistor NM61.

On the other hand, capacitor 210*b* is charged and discharged according to clock voltage Vclk by charge-discharge control circuit 220*b*. Charge-discharge control circuit 220*b* includes a current source 221*b*, a P-type transistor PM62, and an N-type transistor NM62. The output currents of current sources 221*a*, 221*b* are designed to have the same value. Current source 221*b* and transistor PM62 are connected in series between power supply node Np and input node Ninb. Transistor NM62 is connected between input node Ninb and ground node Ns. Therefore, contrary to capacitor 210*a*, capacitor 210*b* is charged with the constant current in the case of Vclk=L-level (Vclkn=H-level), and is pulled down in the case of Vclk=H-level (Vclkn=L-level). In this manner, capacitors 210*a*, 210*b* are complementarily and alternately charged and discharged according to the level transition of clock voltage Vclk (Vclkn).

Figure 14:
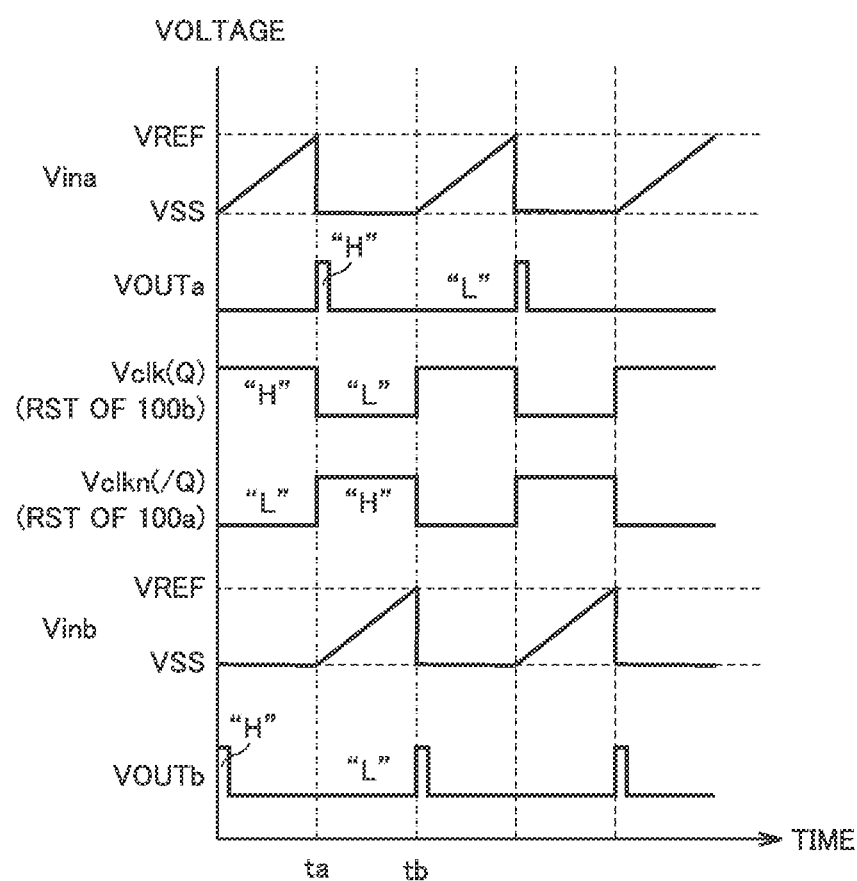
FIG. 14 is a waveform diagram illustrating an operation example of the oscillator of the third embodiment.

FIG. 14 is a waveform chart illustrating an operation example of the oscillator of the third embodiment.

With reference to FIG. 14, an input voltage Vina, which is the voltage at input node Nina connected to the (+) side input terminal of comparator 100a, increases at a constant rate during the H-level period of clock voltage Vclk while being set to ground voltage VSS during the L-level period of clock voltage Vclk. On the other hand, an input voltage Vinb, which is the voltage at input node Ninb connected to the (+) side input terminal of comparator 100b, increases at a constant rate during the L-level period of clock voltage Vclk, and is set to ground voltage VSS during the H-level period of clock voltage Vclk. In this manner, each time the level of clock voltage Vclk (Vclkn) transitions, input voltages Vina, Vinb are controlled such that voltage change periods at the same rate that change (rise) toward reference voltage VREF are alternately provided.

Referring again to FIG. 13, reference voltage VREF is input to the input terminals on the (−) side of comparators 100a and 100b. Furthermore, the /Q output (clock voltage Vclkn) of flip-flop 210 is used as reset signal RST of comparator 100a. Conversely, the Q output (clock voltage Vclk) of flip-flop 210 is set as reset signal RST of comparator 100b. As a result, because reset signal RST input to each of comparators 100a, 100b has mutually opposite logic levels, comparators 100a and 100b operate alternately.

In the L-level period of clock voltage Vclkn, a voltage change period in which input voltage Vina rises toward reference voltage VREF is provided, and comparator 100a executes the circuit operation of detecting timing at which input voltage Vina reaches reference voltage VREF. On the other hand, H-level reset signal RST according to clock voltage Vclk is input to comparator 100b, and comparator 100b enters the reset state. Since output voltage VOUTa of comparator 100a is input to the R terminal of flip-flop 210, the input signal of the R terminal is at the L-level when the reset of comparator 100a is canceled, is maintained at the L-level during Vina<VREF, and changes to the H-level when Vina reaches VREF.

When output voltage VOUTa of comparator 100a changes from the L-level to the H-level at the timing (for example, time ta) when input voltage Vina reaches reference voltage VREF, accordingly the H-level signal is input to the R terminal of flip-flop 210, so that clock voltage Vclk is set to the L-level while clock voltage Vclkn is set to the H-level.

Accordingly, at time ta, as clock voltage Vclkn is set to the H-level, reset signal RST becomes the H-level, so that comparator 100a executes the reset operation. Thus, output voltage VOUTa changes to the L-level according to the reset operation after the period corresponding to the signal propagation delay elapses. While clock voltage Vclkn is at the H-level (Vclk=L-level), output voltage VOUTa is maintained at the L-level. As a result, output voltage VOUTa indicates a one-shot pulse-like voltage waveform having the H-level period corresponding to a signal propagation delay until the reset operation is started, starting from the timing at which input voltage Vina intersects with reference voltage VREF.

On the other hand, after time ta, as clock voltage Vclkn is set to the H-level and clock voltage Vclk is set to the L-level, capacitor 210a is pulled down and capacitor 210b is charged at a constant rate. Furthermore, reset signal RST of comparator 100b is set to the L-level while comparator 100a is reset. As a result, in the L-level period (for example, the period from time ta to time tb) of clock voltage Vclk, the voltage change period in which input voltage Vinb rises toward reference voltage VREF is provided, and comparator 100b executes a circuit operation of detecting timing at which input voltage Vinb reaches reference voltage VREF.

Since the output voltage VOUTb of the comparator 100b is input to the S terminal of the flip-flop 210, the input signal of the S terminal is at the L level when the reset of the comparator 100b is canceled, is maintained at the L level while Vinb<VREF, and changes to the H level when Vinb reaches VREF.

At time tb, when input voltage Vinb reaches reference voltage VREF, output voltage VOUTb of comparator 100b changes from the L-level to the H-level. In response to this, the H-level signal is input to the S terminal of flip-flop 210, so that clock voltage Vclk is set to the H-level and clock voltage Vclkn is set to the L-level.

Therefore, at time tb, reset signal RST becomes the H-level depending on clock voltage Vclk is set to the H-level, so that comparator 100b executes the reset. Thus, output voltage VOUTb changes to the L-level according to the reset operation after the period corresponding to the signal propagation delay elapses. Then, output voltage VOUTb is maintained at the L-level while clock voltage Vclk is at the H-level. As a result, output voltage VOUTb also illustrates a one-shot pulse-like voltage waveform having the H-level period corresponding to the signal propagation delay until the reset operation is started, starting from the timing at which input voltage Vinb intersects with reference voltage VREF.

After time tb, the circuit state before time to is reproduced, the charge of capacitor 210a is started, and the voltage change period of the input voltage Vina is provided again. In the voltage change period of input voltage Vina from time tb, as described above, comparator 100b is reset while comparator 100a executes the circuit operation of detecting the timing at which input voltage Vina reaches reference voltage VREF.

By repeating such the periodic operation, it is possible to generate the clock signal having the constant period according to the voltage change rate of capacitors 210a, 210b by clock voltages Vclk and Vclkn through the alternate operation of two comparators 100a, 100b.

According to the oscillator of the third embodiment, the relaxation oscillator can be configured using two comparators 100a, 100b. As described above, because the relaxation oscillator can be implemented by a CMOS circuit, the relaxation oscillator is more advantageous in terms of the cost and integration than a crystal oscillator and an LC oscillator, and is also suitable for intermittent operation for reducing the power consumption.

On the other hand, in the relaxation oscillator, in order to accurately detect the timing at which input voltages Vina, Vinb reach reference voltage VREF and generate a highly accurate clock signal under high frequency, there is a concern about an increase in power consumption due to a high frequency operation of the comparator.

On the other hand, according to the relaxation oscillator to which the one-shot type comparator according to the present embodiment is applied, the timing at which input voltages Vina, Vinb reach reference voltage VREF can be high-accurately detected with low power consumption. As a result, the low power consumption can be achieved in the relaxation oscillator using the comparator.

Fourth Embodiment

In a fourth embodiment, a configuration variably controlling current I3 by the current source circuit described in the second embodiment in the configuration applied to two comparators operating alternately will be further described.

Figure 15:
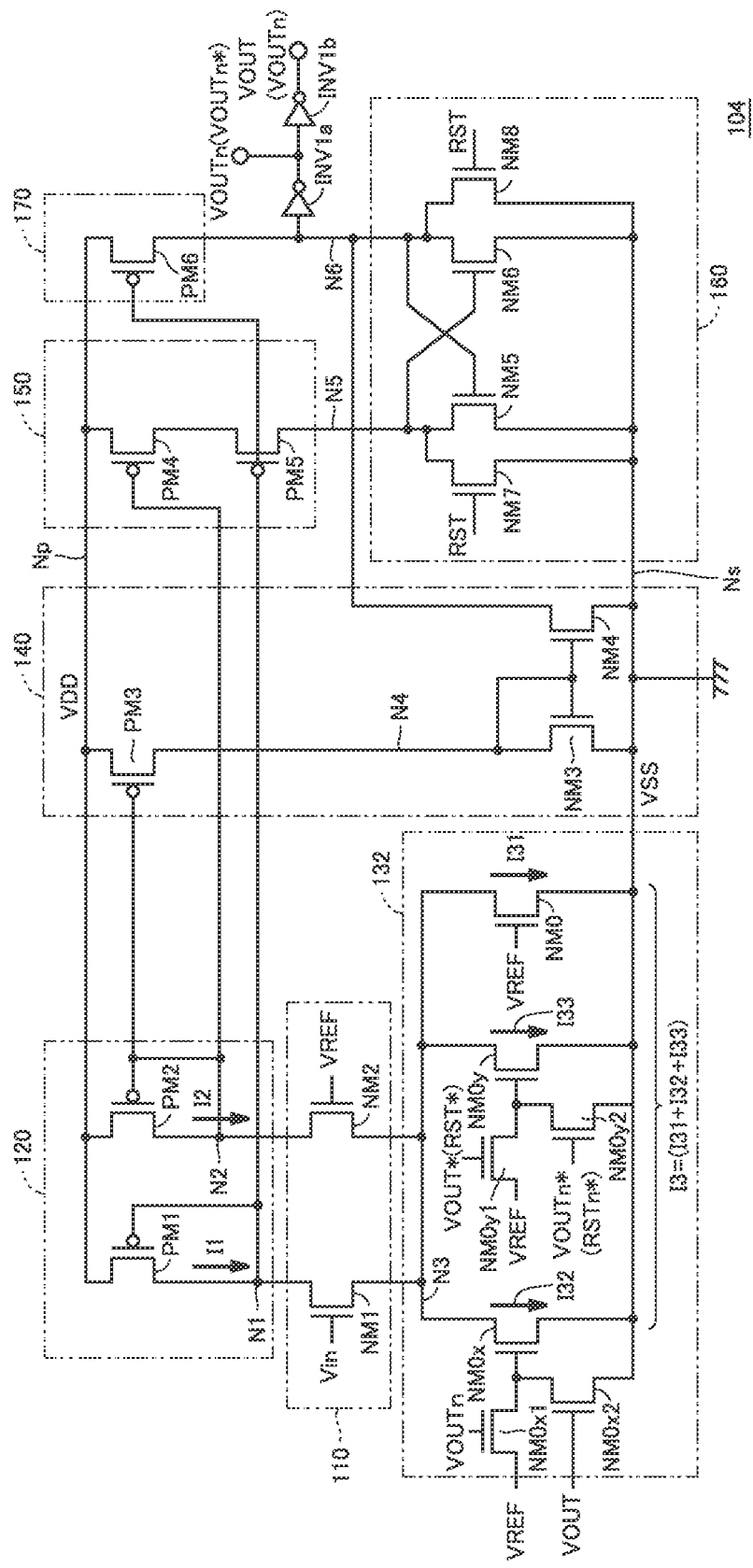
FIG. 15 is a circuit diagram illustrating a configuration example of a comparator according to a fourth embodiment.

FIG. 15 is a circuit diagram illustrating a configuration example of a comparator according to the fourth embodiment.

With reference to FIG. 15, a comparator 104 of the fourth embodiment is different from comparator 102 (FIG. 9) of the second embodiment in that a current source circuit 132 is disposed instead of current source circuit 131. Because the circuit configuration of other part of comparator 104 is similar to that of comparator 102 (FIG. 9) of the second embodiment, namely, comparator 100 of the first embodiment, detailed description will not be repeated.

Current source circuit 132 further includes an N-type transistor NM0y in addition to N-type transistors NM0 and NM0x similar to current source circuit 131 (FIG. 9). Transistor NM0y is connected between node N3 and ground node Ns in parallel to transistors NM0 and NM0x. Therefore, current I3 by current source circuit 132 is indicated by the sum of current I31 of transistor NM0, current I32 of transistor NM0x, and current I33 of transistor NM0y (I3=I31+I32+I33).

Transistors NM0x1, NM0x2 similar to those in FIG. 9 are connected to the gate of transistor NM0x. Therefore, when output voltage VOUT of comparator 104 in FIG. 15 is at the L-level (that is, the period until Vin intersects with VREF after the reset cancellation), transistor NM0x generates current I32 according to reference voltage VREF by turning on transistor NM0x1 (turning off NM0x2). On the other hand, when output voltage VOUT of comparator 100 in FIG. 15 is at the H-level (that is, the period after Vin reaches VREF after the reset cancellation), transistor NM0x2 is turned on (NM0x1 is turned off), and transistor NM0x is turned off (I32=0).

Transistors NM0y 1, NM0y2 are connected to the gate of transistor NM0y. The voltage signal that is at the H-level during a non-operating period (for example, at the time of resetting) of a comparator 104* (not illustrated) that alternately operates with comparator 104 in FIG. 12 is input to the gate of transistor NM0y 1. On the other hand, the voltage signal that becomes the H-level during the operation period (for example, at the time of non-reset) of comparator 104* (not illustrated) is input to the gate of transistor NM0y2. That is, signals at logic levels opposite to each other are input to the gate of transistor NM0y1 and the gate of transistor NM0y2. For example, the relationship between comparators 104 and 104* corresponds to the relationship between comparators 100a and 100b in FIG. 13.

Therefore, output voltage VOUT* of comparator 104* that alternately operates with comparator 104 in FIG. 14 or a reset signal RST* can be input to the gate of transistor NM0y1. Conversely, VOUTn* (the inversion level of output voltage VOUT) or RSTn* (the inversion level of reset signal RST*) of comparator 104* can be input to the gate of transistor NM0y2.

When each of output voltages VOUT, VOUTn of comparator 104,104* is maintained at the H-level even after the detection of Vin=VREF (latch operation period), output voltages VOUT* and VOUTn* of comparator 104* are input to the gates of transistors NM0y1 and NM0y2, so that transistor NM0y receives reference voltage VREF to the gate to generate current I33 in the non-operation period (latch operation period) of comparator 104*. On the other hand, in the period of Vin<VREF (that is, the operation period of comparator 104*) in which comparator 104* attempts to detect the timing at which Vin reaches VREF, ground voltage VSS is input to the gate of transistor NM0y, and transistor NM0y is turned off (I33=0).

On the other hand, when output voltages VOUTa, VOUTb have the one-shot pulse shape as in comparators 100a, 100b described in FIGS. 13 and 14, it is preferable to input reset signal RST* of the alternately operating comparator and inverted signal RSTn* thereof to the gates of transistors NM0y1 and NM0y2. In this way, in the non-operating period of comparator 104* at RST*=H-level, transistor NM0y receives reference voltage VREF input to the gate thereof and generates current I33. Conversely, in the operation period of comparator 104* in which RST*=L-level (RSTn*=H-level), ground voltage VSS is input to the gate of transistor NM0y, and transistor NM0y is turned off (I33=0).

As a result, in the comparator of the fourth embodiment, current I3 of comparator 104 can be reduced by setting current I33 of transistor NM0y to zero during the operation period of the comparator of the phase operating alternately. As a result, the power consumption of the comparator can further be reduced. Note that current source circuit 132 can be configured only with a current control function according to the operation of comparator 104* that operates alternately without disposing transistors NM0x, MN0x1, MN0x2. Alternatively, in current source circuit 132, transistors NM0x, MN0x1, MN0x2 can be controlled using control signal Stail and control signal Stailn in FIG. 11 similarly to the modification of the second embodiment.

Transistor NM0y of the fourth embodiment corresponds to one example of the "second auxiliary transistor". Comparator 104 of the fourth embodiment can be used as two comparators 100a, 100b constituting oscillator 200 of the third embodiment by mutually transmitting VOUTn obtained by inverting output voltage VOUT between comparators 100a, 100b as indicated by a dotted line in FIG. 13.

Also in the fourth embodiment, at least one of the first modification (capacitor C10), the second modification (transistors PMC1 to PMC4), and the third modification (current sources 300a, 300b) of the first embodiment can be combined. For example, in comparator 104 (FIG. 15), by adopting a circuit configuration in which capacitor C10 is further provided between node N5 and ground node Ns, whereby the fourth embodiment and the first modification of the first embodiment can be combined. Alternatively, in comparator 104, by adopting a circuit configuration in which current sources 300a and 300b (FIG. 19A or 19B) are connected to nodes N5 and N6, whereby the fourth embodiment and the third modification of the first embodiment can be combined.

Furthermore, in active load circuit 120 of comparator 104, transistors PMC1 to PMC4 similar to those in FIG. 18 are disposed with respect to the gates of transistors PM1, PM2, whereby the fourth embodiment and the second modification of the first embodiment can be combined. Accordingly, the low power consumption can further be achieved.

Fifth Embodiment

In the first to fourth embodiment, the circuit configuration of the one-shot type comparator that detects the timing at which rising input voltage Vin reaches reference voltage VREF has been described. However, a similar circuit configuration of a one-shot type comparator that detects the timing at which falling input voltage Vin reaches reference voltage VREF can also be configured.

Figure 16:
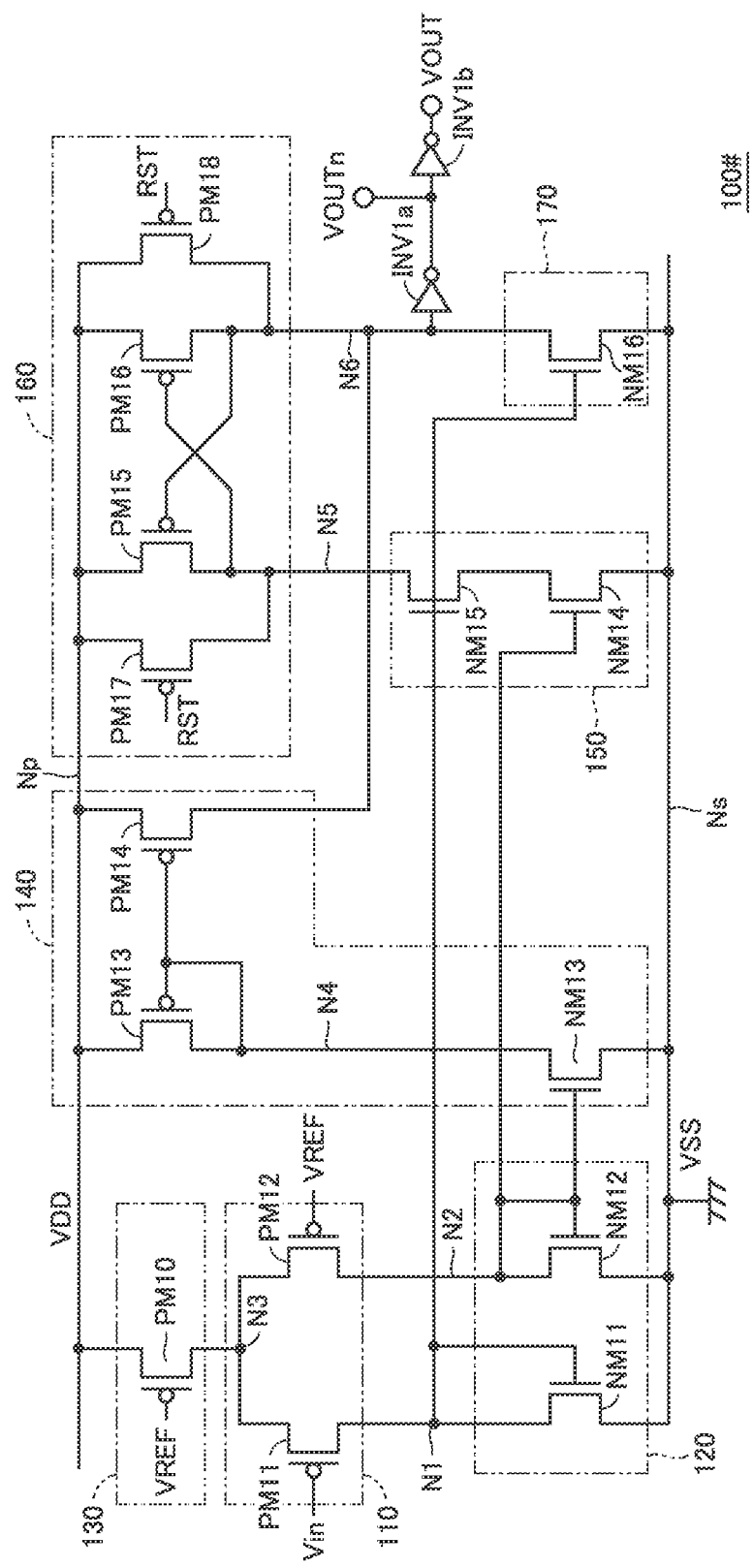
FIG. 16 is a circuit diagram illustrating a configuration example of a comparator according to a fifth embodiment.

FIG. 16 is a circuit diagram illustrating a configuration example of a comparator 100 # according to a fifth embodiment.

With reference to FIG. 16, comparator 100 # of the fifth embodiment includes differential amplifier circuit 110, active load circuit 120, current source circuit 130, current conversion circuit 140, minimum selector circuit 150, latch circuit 160, and output stage 170, which are similar to comparator 100 in FIG. 3.

In comparator 100 #, the connection relationship between differential amplifier circuit 110, active load circuit 120, current source circuit 130, current conversion circuit 140, minimum selector circuit 150, latch circuit 160, and output stage 170 and power supply node Np and ground node Ns is opposite to that of comparator 100. Furthermore, in comparator 100 #, the conductivity type of the transistor constituting each of differential amplifier circuit 110, active load circuit 120, current source circuit 130, current conversion circuit 140, minimum selector circuit 150, latch circuit 160, and output stage 170 is opposite to that of comparator 100. A specific circuit configuration example will be described below.

Active load circuit 120 includes N-type transistors NM11, NM12. Transistors NM11 and NM12 are connected between ground node Ns and nodes N1 and N2, respectively. The gate of transistor NM11 is connected to node N1, and the gate of transistor NM12 is connected to node N2. That is, each of transistors NM11 and NM12 functions as the diode having the side of ground node Ns as the cathode.

Differential amplifier circuit 110 includes P-type transistors PM11, PM12. Transistor PM11 is connected between nodes N1 and N3, and receives input voltage Vin (FIG. 1) at the gate. Transistor PM12 is connected between nodes N2 and N3, and receives reference voltage VREF (FIG. 1) at the gate.

Current source circuit 130 includes a P-type transistor PM10 connected between power supply node Np and node N3. The constant voltage (for example, reference voltage VREF) is input to the gate of transistor PM10.

Current conversion circuit 140 includes an N-type transistor NM13 and P-type transistors PM13, PM14. Transistor NM13 is connected between ground node Ns and node N4. The gate of transistor NM13 is connected to node N2 in common with the gate of transistor NM12. Therefore, transistor NM13 forms the current mirror with transistor NM12.

Transistor PM13 is connected between node N4 and power supply node Np, and transistor PM14 is connected between node N6 and power supply node Np. The gates of transistors PM13 and PM14 are commonly connected to node N4. That is, transistor PM13 is diode-connected, and transistor PM14 forms the current mirror with transistor PM13.

Minimum selector circuit 150 includes N-type transistors NM14 and NM15 connected in series between ground node Ns and node N5. The gate of transistor NM14 is connected to node N2. The gate of transistor NM15 is connected to node N1.

Output stage 170 includes an N-type transistor NM16 connected between ground node Ns and node N6. The gate of transistor NM16 is connected to node N1.

Latch circuit 160 includes P-type transistors PM15 to PM18. Transistors PM15 and PM17 are connected in parallel between node N5 and power supply node Np. Transistors PM16 and PM18 are connected in parallel between node N6 and power supply node Np. Reset signal RST is input to the gates of transistors PM17 and PM18. The gate of transistor PM15 is connected to node N6. The gate of transistor PM16 is connected to node N5.

Figure 17:
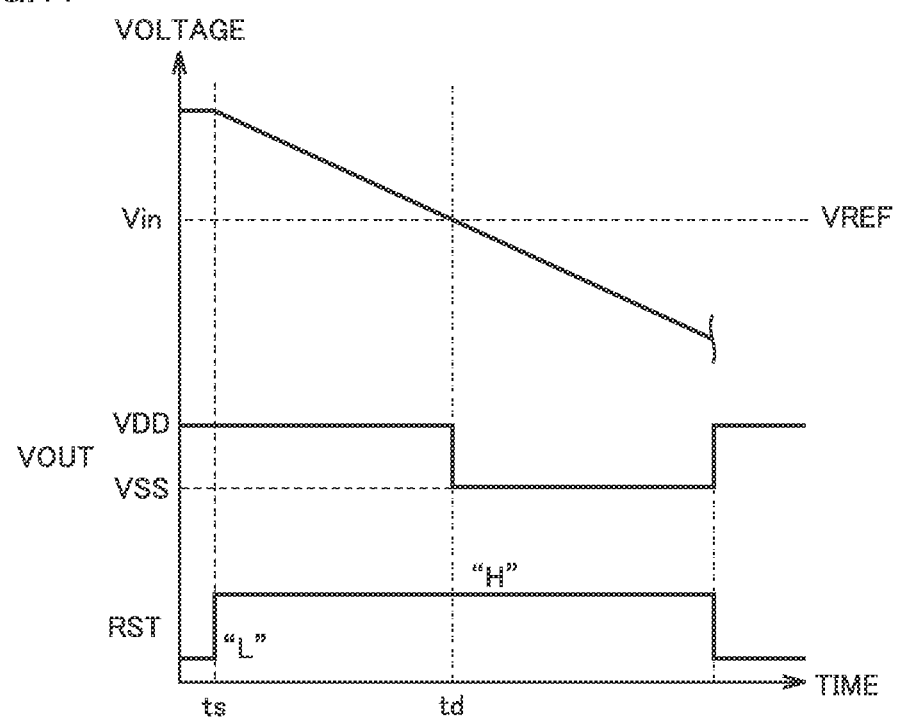
FIG. 17 is a waveform chart illustrating an operation example of the comparator of the fifth embodiment.

FIG. 17 is a waveform chart illustrating an operation example of comparator 100 # in FIG. 16.

With reference to FIG. 17, contrary to FIG. 2, reset signal RST is set to the L-level during the non-operation period of comparator 100 #, and is set to the H-level during the operation period of comparator 100 #. In the L-level period of reset signal RST, in FIG. 16, because node N6 is electrically connected to power supply node Np by turning on transistors PM17 and PM18, the voltage at node N6 is fixed to VDD, and output voltage VOUT of comparator 100 # is reset to the H-level (VOUT=VDD).

When reset signal RST changes from the L-level to the H-level at time ts, the reset operation is canceled and comparator 100 # starts the circuit operation. In the example of FIG. 17, input voltage Vin is higher than reference voltage VREF at time ts, and gradually decreases after time ts.

During the period from time ts to time td until input voltage Vin intersects with reference voltage VREF (that is, Vin>VREF), output voltage VOUT is maintained at the H-level (VOUT=VDD) at the time of the reset. When input voltage Vin intersects with reference voltage VREF at time td, output voltage VOUT changes from the reset H-level to the L-level.

After time td when output voltage VOUT changes to the L-level, output voltage VOUT is maintained at the L-level until reset signal RST changes to the L-level next time. Then, when the reset signal is set to the L-level, output voltage VOUT changes to the H-level again. Thereafter, the operation after time ts is repeated.

In comparator 100 #, the current consumption in each of the period of Vin>VREF, the period of Vin VREF, and the period of Vin<VREF is similar to each of the period of Vin<the period of VREF (FIG. 4), the period of Vin VREF (FIG. 5), and the period of Vin>VREF (FIG. 6) in comparator 100.

Therefore, according to comparator 100 #, it is possible to detect that input voltage Vin intersects with reference voltage VREF in the situation where input voltage Vin decreases. That is, according to the present embodiment and the modification thereof, in both of the application in which input voltage Vin rises from the voltage lower than reference voltage VREF and the application in which input voltage Vin falls from the voltage higher than reference voltage VREF, the power consumption of the high-precision (low offset) one-shot type comparator detecting that the analog voltage (input voltage Vin) of one of the two inputs intersects with reference voltage VREF that is the other of the two inputs can be reduced.

In the present embodiment, the example in which output voltage VOUT according to the voltage at node N6 is set to the same voltage level as the voltage level (H- or L-level) of node N6 has been described. However, output voltage VOUT can be designed to be set to the voltage level (H- or L-level) opposite to node N6 by changing the number of inverters connected to the subsequent stage of node N6.

In comparator 100 # of the fifth embodiment, contrary to the first to fourth embodiments, ground voltage VSS corresponds to one example of the "first voltage", and ground node Ns corresponds to one example of the "first power supply node". Further, power supply voltage VDD corresponds to one example of the "second voltage", and power supply node Np corresponds to one example of the "second power supply node".

Furthermore, in the configuration example of the fifth embodiment, the P-type transistor corresponds to the "first conductivity type" transistor, and transistor PM11 corresponds to one example of the "first transistor", transistor PM12 corresponds to one example of the "second transistor", transistor PM10 corresponds to one example of the "third transistor", and transistor PM14 corresponds to one example of the "fourth transistor". Furthermore, in latch circuit 160, transistors PM15 to PM18 correspond to one example of the "eighth transistor" to the "eleventh transistor". Further, the N-type transistor corresponds to the "second conductivity type" transistor, transistor NM15 corresponds to one example of the "fifth transistor", transistor NM14 corresponds to one example of the "sixth transistor", and transistor NM16 corresponds to one example of the "seventh transistor".

Also in comparator 100 #(FIG. 16) of the fifth embodiment, at least one of the first modification (capacitor C10), the second modification, and the third modification (current sources 300a, 300b) of the first embodiment can be combined. For example, in comparator 100 #, by adopting the circuit configuration in which capacitor C10 is further provided between node N5 and power supply node Np, the fifth embodiment and the first modification of the first embodiment can be combined.

Alternatively, also in comparator 100 #(FIG. 16), current sources 300a and 300b similar to those in FIG. 19A or 19B can be connected between nodes N5 and N6 and ground node Ns or power supply node Np. With this configuration, transistors PM15 and PM16 of latch circuit 160 can be operated in the subthreshold region by the minute bias current generated by current sources 300a, 300b until latch circuit 160 performs the above-described latch operation after the cancellation of the reset operation (RST=L-level). That is, the fifth embodiment and the third modification of the first embodiment can be combined. In this case, transistors PM15 and PM16 correspond to one example of the "transistor constituting the cross-coupled circuit" in addition to the "eighth transistor" and the "ninth transistor".

Figure 20:
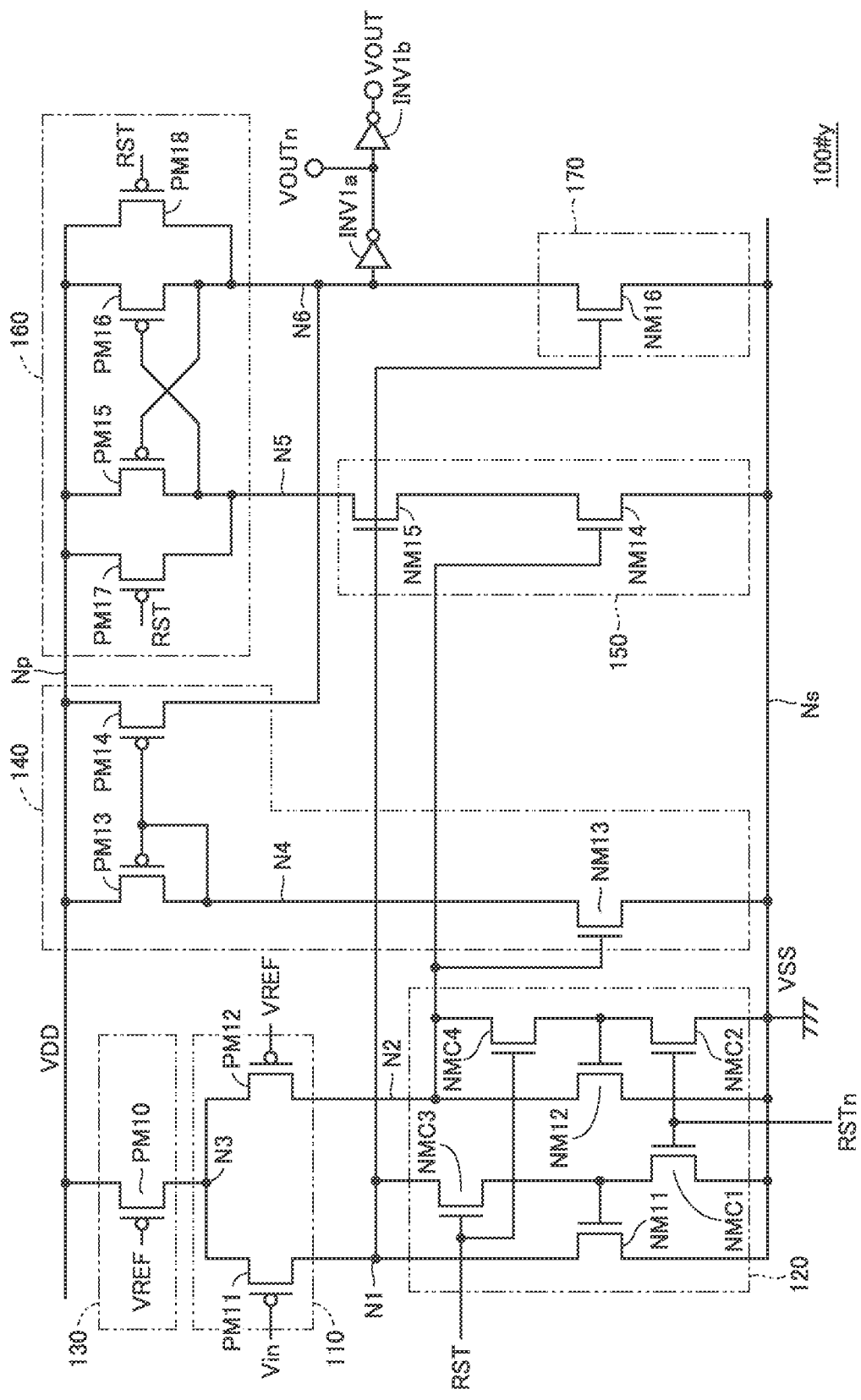
FIG. 20 is a circuit diagram illustrating a configuration example of a comparator according to a combination of the fifth embodiment and the second modification of the first embodiment.

Furthermore, as illustrated in FIG. 20, in active load circuit 120 of comparator 100 #, N-type transistors NMC1 to NMC4 are disposed with respect to the gates of transistors NM11 and NM12, so that a comparator 100 #y obtained by combining the second modification of the first embodiment with the fifth embodiment can be implemented. Specifically, transistors NMC1 and NM2 are turned on during the reset operation (RST=L-level) to connect the gates of NM1 and NM2 to ground node Ns, and turned off during the circuit operation (RST=H-level). On the other hand, while transistors NMC3 and NMC4 are turned off during the reset operation (RST=L-level), the gates of NM11 and NM12 are connected to ground node Ns during the circuit operation (RST=H-level) similarly to FIG. 16.

In FIG. 20, N-type transistors NM11 and NM12 in active load circuit 120 correspond to one example of the "twelfth transistor" and the "thirteenth transistor". In addition, the current paths of diode-connected transistors NM11 and NM12 correspond to examples of the "first current path" and the "second current path", respectively. Further, one example of the "current interrupting mechanism" can be formed by transistors NMC1 to NMC4.

Furthermore, in comparator 100 #, current source circuits 131, 132 including a plurality of P-type transistors connected in parallel between node N3 and power supply node Np can be disposed instead of current source circuit 130 by combination with the second embodiment, the modification of the second embodiment, or the fourth embodiment.

Furthermore, according to the third embodiment, two comparators 100# (including the combination with each of the above-described embodiments) of the fifth embodiment are disposed and operated alternately, whereby the oscillator corresponding to FIG. 13 can be configured. In this case, it is understood that the input voltages of two comparators 100 # are controlled such that voltage change periods that decrease toward reference voltage VREF are alternately generated.

In the third and fourth embodiments, the application (typically, the oscillator) in which two comparators of the present embodiment are used to operate alternately in a complementary manner has been described. However, the comparator can be used alone. In this case, the one-shot type comparator detecting that input voltage Vin increases or decreases and reaches reference voltage VREF can be configured after the operation period is defined by reset signal RST from the outside of the comparator. A usage mode of such the comparator is suitable for applications such as over current protection (OCP), energy harvesting, or a wireless sensor network in which the detection operation is executed at a specific timing and extremely low power consumption is desired in other periods.

Sixth Embodiment

In the sixth embodiment, as an example of an application different from the oscillator, a configuration example of a power converter using the one-shot type comparator according to the present embodiment, more particularly, a switching regulator type DC-DC converter will be described. As an example, a configuration example of a DC-DC converter of pulse frequency modulation (PFM) control will be described below.

Figure 21:
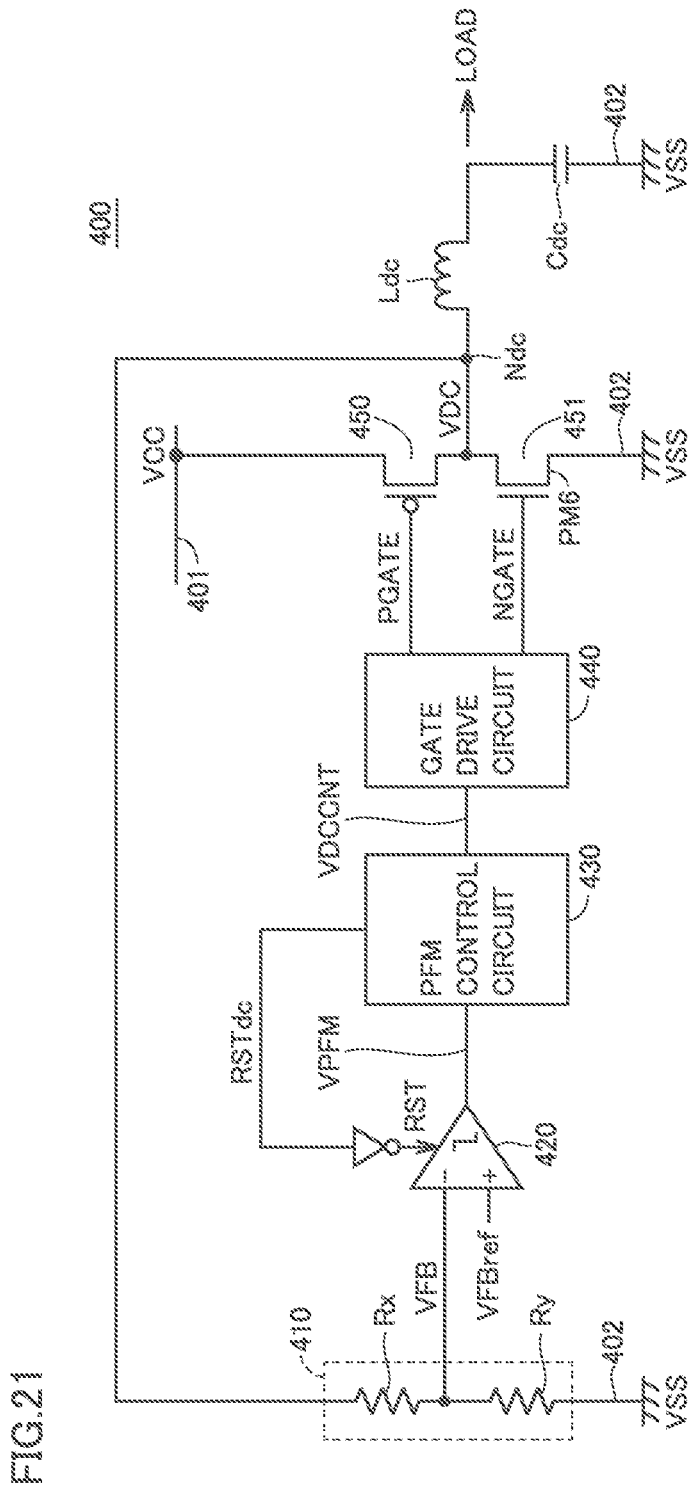
FIG. 21 is a schematic diagram illustrating a circuit configuration example of a DC-DC converter that is a representative example of a power converter according to a sixth embodiment.

FIG. 21 is a schematic diagram illustrating a circuit configuration example of the DC-DC converter that is a representative example of the power converter of the sixth embodiment.

With reference to FIG. 21, a DC-DC converter 400 of the sixth embodiment includes a voltage feedback circuit 410, a one-shot type comparator 420, a PFM control circuit 430, a gate drive circuit 440, a P-type semiconductor switching element (hereinafter, also simply referred to as a "switching element") 450, and an N-type switching element 451.

Switching element 450 is connected between a power supply wiring 401 that supplies power supply voltage VCC and a DC output node Ndc, and turned on and off according to gate drive signal PGATE from gate drive circuit 440. A DC output voltage VDC of DC output node Ndc is smoothed by an inductor Ldc and a capacitor Cdc and supplied to a load (not illustrated). Switching element 450 corresponds to one example of the "drive switching element".

Specifically, switching element 450 supplies the current increasing output voltage VDC from power supply wiring 401 to the DC output node Ndc by being turned on in the L level period of the gate drive signal PGATE.

On the contrary, in the H-level period of gate drive signal PGATE, switching element 450 is turned off, and the current path from power supply wiring 401 to DC output node Ndc is cut off. In an off-period of switching element 450, DC output voltage VDC decreases according to the power consumption by the load. In this manner, DC-DC converter 400 executes the power conversion converting DC voltage VCC of power supply wiring 401 into DC output voltage VDC by the on and off control of switching element 450. That is, DC voltage VCC corresponds to one example of the "first DC voltage", and DC output voltage VDC corresponds to one example of the "second DC voltage". In addition, DC output node Ndc corresponds to one example of the "DC voltage output node".

Switching element 451 is connected between DC output node Ndc and a ground wiring 402, and turned on and off according to a gate drive signal NGATE from gate drive circuit 440. Switching element 451 is disposed to form the current path (that is, a reflux path) including DC output node Ndc, inductor Ldc, the load, and ground wiring 402 in the off-period of switching element 450. With this reflux path, current supply to the load can be continued using the stored energy of inductor Ldc even in the off-period of switching element 450. In addition, capacitor Cdc avoids a rapid decrease in a supply voltage VDCOUT to the load.

Therefore, switching element 451 is basically turned on and off complementarily to switching element 450. However, when on and off of switching elements 450 and 451 are switched, a dead time in which both switching elements 450 and 451 are turned off is provided such that a through current between power supply wiring 401 and ground wiring 402 is not generated. As described above, switching element 451 corresponds to one example of the "semiconductor element" for reflux.

Switching element 451 can be replaced with a diode having an anode connected to DC output node Ndc. In this case, the diode constitutes one example of the "semiconductor element" for reflux.

DC-DC converter 400 performs control to maintain DC output voltage VDC greater than or equal to a target voltage VDCref by turning on switching element 450 according to the decrease in DC output voltage VDC. Thus, DC-DC converter 400 can be operated such that a supply voltage VDCOUT to the load does not become lower than target voltage VDCref.

Voltage feedback circuit 410 can be configured by a voltage dividing circuit using resistance elements Rx and Ry connected in series between power supply wiring 401 and ground wiring 402. When electric resistance values of resistance elements Rx and Ry are also expressed as Rx and Ry, a voltage division ratio Rk of the voltage dividing circuit is expressed as Rk=Ry/(Rx+Ry) (0<Rk<1.0).

Accordingly, a feedback voltage VFB output from voltage feedback circuit 410 is expressed by VFB=Pk·VDC using Rk.

Any one of the comparators described in the first to fifth embodiment can be applied to comparator 420. However, as will be clear from the following description, comparator 420 is disposed to detect the decrease in feedback voltage VFB (DC output voltage VDC). Accordingly, a description will be given on the assumption that comparator 100 # of the fifth embodiment that executes the operation in FIG. 17 is applied to comparator 420.

Comparator 420 operates using feedback voltage VFB and target voltage VFBref as input voltage Vin and reference voltage VREF in FIG. 17, respectively. Target voltage VFBref input to comparator 420 is set to VFBref=Rk·VDCref so as to correspond to target voltage VDCref of DC output voltage VDC.

Comparator 420 outputs output voltage VOUTn in FIG. 16 as a control signal VPFM. Accordingly, contrary to output voltage VOUT in FIG. 17, control signal PFM is set to the L-level during the reset operation and during the period of VFB>VFBref after the cancelation of the reset operation. On the other hand, when feedback voltage VFB decreases to target voltage VFBref after the cancellation of the reset operation, control signal VPFM changes from the L-level to the H-level. Comparator 420 corresponds to one example of the "output voltage monitoring comparator".

PFM control circuit 430 generates a DC voltage control signal VDCCNT in response to control signal VPFM from comparator 420. Gate drive circuit 440 generates gate drive signals PGATE and NGATE according to DC voltage control signal VDCCNT. One example of the "voltage control circuit" can be configured by PFM control circuit 430 and gate drive circuit 440.

Figure 22:
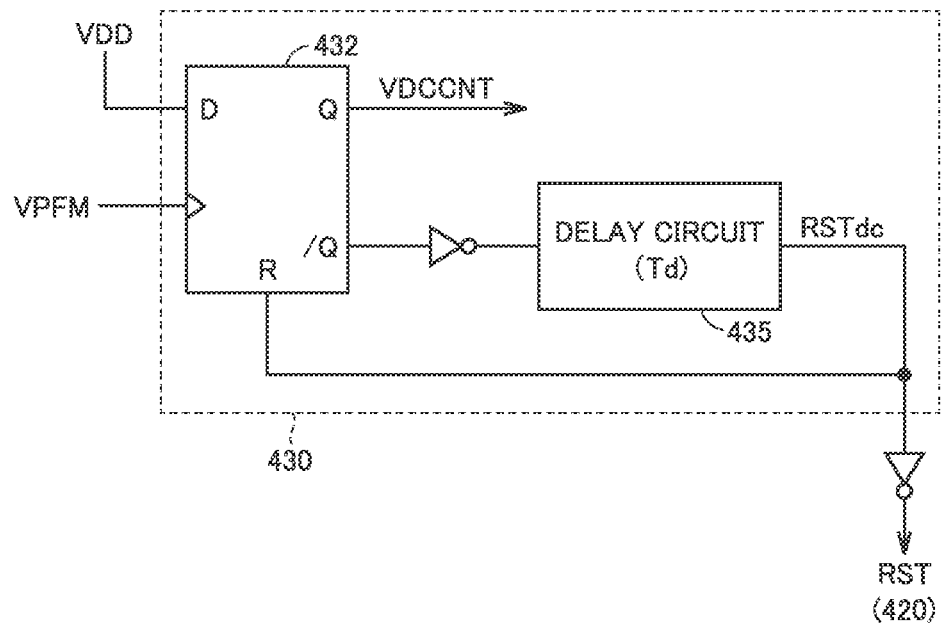
FIG. 22 is a block diagram illustrating a configuration example of a PFM control circuit in FIG. 21.

FIG. 22 illustrates a configuration example of PFM control circuit 430.

As illustrated in FIG. 22, PFM control circuit 430 includes a D type flip-flop 432 and a delay circuit 435.

Power supply voltage VDD common to comparator 420 is input to the D terminal of flip-flop 432. Control signal VPFM from comparator 420 is input to the clock terminal. When control signal VPFM input to the clock terminal changes from the L-level to the H-level, flip-flop 432 reads power supply voltage VDD (H-level) input to the D terminal and sets DC voltage control signal VDCCNT output from the Q terminal to the H-level.

Delay circuit 435 outputs, as a reset signal RSTdc of the flip-flop 432, a signal obtained by inverting the output signal from the/Q terminal of flip-flop 432, namely, a signal obtained by giving a predetermined delay time Td to a signal of the same phase as DC voltage control signal VDCCNT. Therefore, in response to the change of reset signal RSTdc from the L-level to the H-level, DC voltage control signal VDCCNT of the Q terminal is set to the L-level.

Furthermore, an inverted signal of reset signal RSTdc is input to comparator 420 as reset signal RST of comparator 100 # in FIG. 16. As a result, when reset signal RSTdc changes from the L-level to the H-level, comparator 420 executes the reset operation, whereby control signal VPFM is maintained at the L-level after the reset of flip-flop 432.

Figure 23:
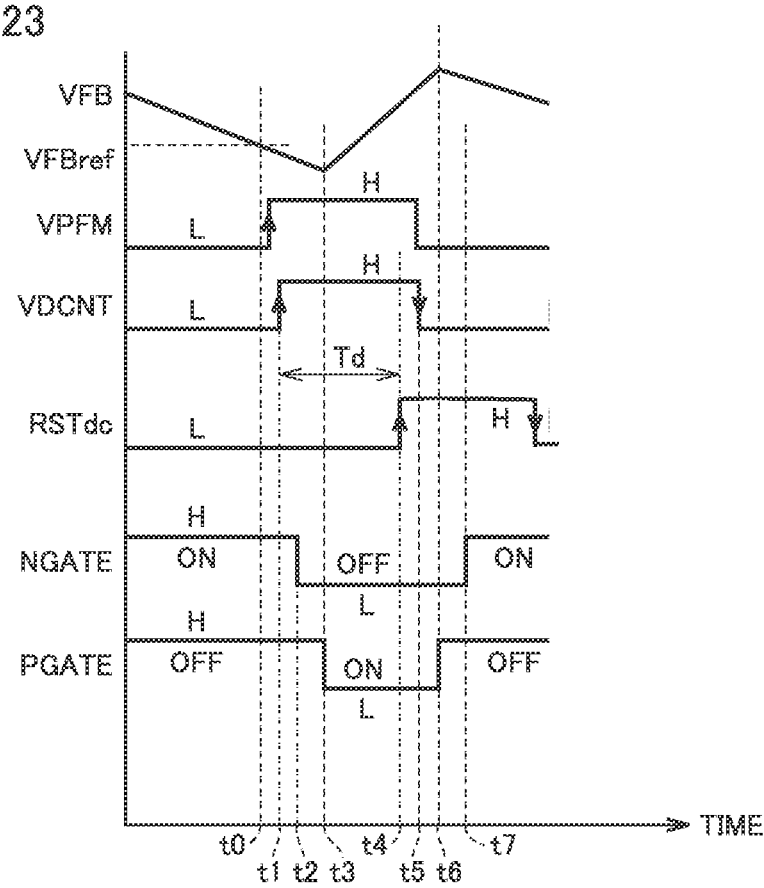
FIG. 23 is an operation waveform chart illustrating the PFM control circuit and a gate drive circuit in FIG. 21.

FIG. 23 illustrates operation waveform examples of PFM control circuit 430 and gate drive circuit 440 corresponding to the change in feedback voltage VFB of DC output voltage VDC.

In the example of FIG. 23, in the period before time t0, because gate drive signals PGATE and NGATE are set to the H-level, switching element 450 is turned off. Therefore, as the DC output voltage VDC decreases due to power consumption at the load, the feedback voltage VFB also decreases. Because reset signal RSTdc is at the L-level, reset signal RST of comparator 420 (comparator 100 #) is set to the H-level. For this reason, comparator 420 cancels the reset operation and monitors the timing at which feedback voltage VFB (input voltage Vin in FIG. 16) intersects with target voltage VFBref (reference voltage VREF in FIG. 16). In this period, control signal VPFM is set to the L-level.

When feedback voltage VFB decreases to target voltage VFBref at a time t0, control signal VPFM changes from the L-level to the H-level in response to the change in output voltage VOUT of comparator 420. In response to this, at time t1, DC voltage control signal VDCCNT output from the Q terminal of flip-flop 432 of PFM control circuit 430 changes from the L-level to the H-level. Between times t0 and t1, the delay due to the signal transmission and the signal processing is generated.

PFM control circuit 430 changes reset signal RSTdc from the L-level to the H-level at a time t4 when delay time Td by delay circuit 435 elapses from time t1. In response to this, at a time t5, DC voltage control signal VDCCNT is reset to the L-level. Furthermore, because comparator 420 also executes the reset operation in response to reset signal RSTdc, control signal VPFM is also returned to the L-level. Reset signal RSTdc is returned to the L-level at timing when delay time Td elapses from time t5 at which DC voltage control signal VDCCNT changes to the L-level. The delay due to the signal transmission and signal processing is also generated between times t4 and t5.

Setting of gate drive signals PGATE, NGATE according to DC voltage control signal VDCCNT by gate drive circuit 440 will be described below.

Figure 24:
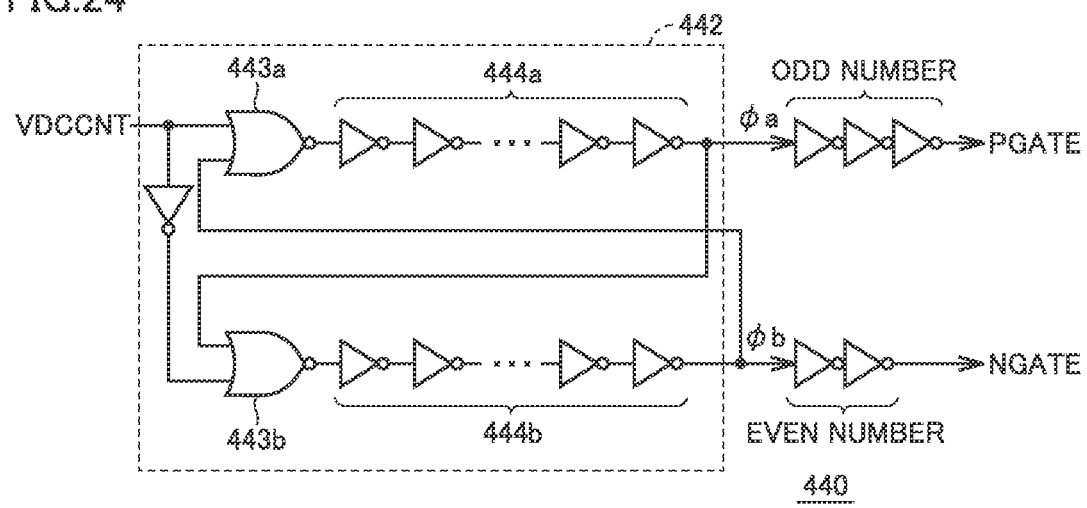
FIG. 24 is a circuit diagram illustrating a configuration example of the gate drive circuit in FIG. 21.

FIG. 24 illustrates a configuration example of gate drive circuit 440.

As illustrated in FIG. 24, gate drive circuit 440 includes a non-overlapping clock generation circuit 442 to which DC voltage control signal VDCCNT is input. Non-overlapping clock generation circuit 442 includes NOR gates 443$a$, 443$b$ and inverter stages 444$a$, 444$b$. Each of inverter stages 444$a$, 444$b$ includes an even number of inverters connected in series. Inverter stage 444$a$ outputs a control signal φa, and inverter stage 444$b$ outputs a control signal φb.

VDCCNT that is the input signal and control signal φb are input to NOR gate 443$a$. The output signal of NOR gate 443$a$ is input to inverter stage 444$a$. The inverted signal of VDCCNT that is the input signal and control signal φa are input to NOR gate 443$b$. The output signal of NOR gate 443$b$ is input to inverter stage 444$b$.

Figure 25:
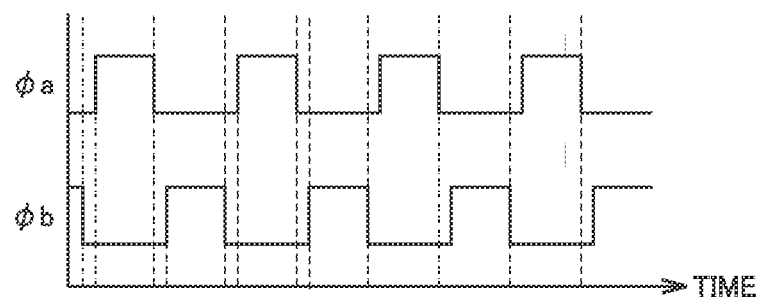
FIG. 25 is a waveform chart illustrating operation of a non-overlapping clock generation circuit in FIG. 24.

FIG. 25 is a waveform diagram illustrating control signals φa and φb output from non-overlapping clock generation circuit 442.

As illustrated in FIG. 25, control signals φa and φb generated as non-overlapping clocks are alternately set to the L-level and the H-level according to the transition between the L-level and the H-level of DC voltage control signal VDCCNT that is the input signal. Furthermore, a non-overlapping period in which control signals φa and φb are set to the L-level is provided in control signals φa and φb. The length of the non-overlapping period corresponds to the transmission delay time by inverter stages 444$a$, 444$b$, so that the length of the non-overlapping period can be adjusted by the number of inverters (even number).

Referring to FIG. 24 again, gate drive circuit 440 amplifies control signal φa by an odd number of inverters to generate a gate drive signal PGATE. Similarly, gate drive circuit 440 amplifies control signal φb by an even number of inverters to generate a gate drive signal NGATE. Accordingly, gate drive signal PGATE input to the gate of P-type switching element 450 has the phase opposite to that of control signal φa. On the other hand, gate drive signal NGATE input to the gate of N-type switching element 451 is in the same phase as that of control signal φb.

With reference to FIG. 23 again, according to the transition of DC voltage control signal VDCCNT to the H-level at time t1, gate drive signal NGATE changes from the H-level to the L-level at time t2 before gate drive signal PGATE. Thus, switching element 451 is turned off.

At time t3 when the non-overlap period elapses from time t2, gate drive signal PGATE changes from the H-level to the L-level. In response to this, P-type switching element 450 is turned on. From time t3, DC output voltage VDC and feedback voltage VFB increase by providing the ON period of switching element 450.

When DC voltage control signal VDCCNT changes from the H-level to the L-level at time t5 according to delay time Td, gate drive signal PGATE changes from the L-level to the H-level before gate drive signal NGATE at time t6. As a result, switching element 450 is turned off.

At a time t7 when the non-overlap period elapses from time t6, gate drive signal NGATE changes from the L-level to the H-level. In response to this, N-type switching element 450 is turned on. As a result, the reflux path is formed during the off-period of switching element 450. After time t5, because the current supply from power supply wiring 401 to DC output node Ndc is stopped, DC output voltage VDC and feedback voltage VFB start to decrease.

Then, when reset signal RSTdc is returned to the L-level again, the state similar to that before time t0 is reproduced, and the control providing the ON period of switching element 450 having the length corresponding to delay time Td (the power supply period from power supply wiring 401) is repeatedly executed every time comparator 420 detects the decrease in feedback voltage VFB (DC output voltage VDC). Accordingly, by maintaining DC output voltage VDC greater than or equal to target voltage VDCref, the power conversion operation of DC-DC converter 400 can be performed such that supply voltage VDCOUT to the load does not become lower than target voltage VDCref.

In this manner, DC-DC converter 400 executes what is called PFM control in which the on and off cycle of switching element 450 changes depending on the decreasing speed of DC output voltage VDC. In general, pulse width modulation (PWM) control and PFM control are known as the switching regulator type DC-DC converter. The PWM control controls an ON period ratio within a certain ON and OFF cycle of the semiconductor switching element, and is generally applied to the case where the load current is large and high-speed control is required. That is, because the comparator used for the PWM control is required to constantly operate to perform the voltage comparison operation, the one-shot type comparator described in the present embodiment is not suitable.

On the other hand, the PFM control is suitable for a light load application with a small load current, and operates the DC-DC comparator so as to provide the power supply period according to the decrease in the DC output voltage. Therefore, because the comparator used for the PFM control performs a one-shot type operation detecting the voltage drop, the comparator according to the present embodiment is suitable.

Therefore, according to the DC-DC converter of the sixth embodiment, the power consumption can be suppressed by monitoring the timing at which the DC output voltage VDC decreases to the target voltage using the comparator of the present embodiment, and controlling the semiconductor switching element according to the output of the comparator.

In particular, in the application of the light load having the small load power, the influence of the power consumption in the control circuit including the comparator on the power conversion efficiency increases, but the power conversion efficiency can be significantly improved by applying the comparator according to the present embodiment in which the power consumption is reduced.

Modification of Sixth Embodiment

The DC-DC converter described in the sixth embodiment is often used as a power supply of a system or a large scale integrated-circuit (LSI). Thus, the DC-DC converter is required to have a safety control function preventing an abnormal power supply voltage from being supplied to these loads.

For such the safety control, a function of detecting that monitoring target values such as the voltage, the current, and the temperature reaches determination values for abnormality detection is required, so that the comparator is applied. because the comparator performs the operation in which the output voltage changes only when the abnormality is generated, preferably the power consumption in other standby states is prevented as much as possible. In addition, because the comparator used for the safety control is required to have a function of detecting the intersection of the voltage value according to the monitoring target value and the voltage according to the abnormality determination value, the one-shot type comparator of the present embodiment with low power consumption can be applied.

Figure 26:
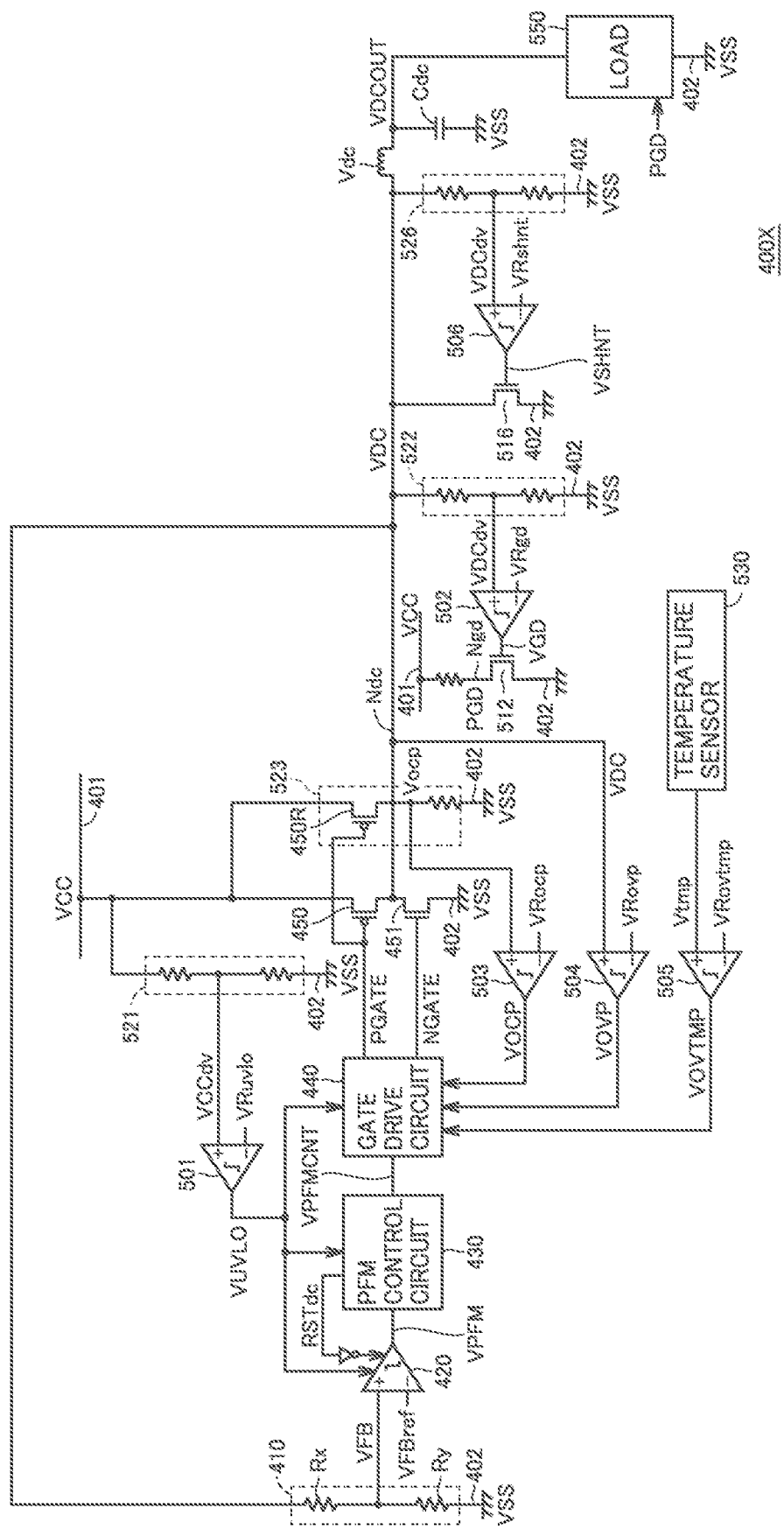
FIG. 26 is a schematic diagram illustrating a circuit configuration example of a DC-DC converter according to a modification of the sixth embodiment.

FIG. 26 illustrates a circuit configuration of a DC-DC converter according to a modification of the sixth embodiment.

As illustrated in FIG. 26, a DC-DC converter 400X of the modification of the sixth embodiment further includes comparators 501 to 506 constituting a safety control circuit, N-type transistors 512, 516, voltage dividing circuits 521, 522, 526, a current detection circuit 523, and a temperature sensor 530, in addition to the configuration of DC-DC converter 400 in FIG. 21.

Any one of the comparators described in the first to fifth embodiment can be applied to each of comparators 501 to 506. However, as will be apparent from the following description, because each of comparators 501 to 506 is disposed to detect the increase in the voltage indicating the monitoring target value, it is preferable to apply any one of comparators 100 to 104 of the first to fourth embodiments that executes the operation in FIG. 2. In the following description, it is assumed that comparator 100 of the first embodiment is applied.

The configuration and operation of the safety control circuit configured by each of comparators 501 to 506 will be described below.

Comparator 501 is disposed to implement what is called an under voltage lockout (UVLO) function of preventing an abnormal DC output voltage VDC (VDCOUT) from being supplied to load 550 by the operation of DC-DC converter 400X in the state where power supply voltage VCC that is the input voltage is insufficient. Voltage dividing circuit 521 is connected between power supply wiring 401 and ground wiring 402, and outputs a monitoring voltage VCCdv obtained by dividing power supply voltage VCC.

Comparator 501 (comparator 100) operates with monitoring voltage VCCdv and the determination voltage VRuvlo as the input voltage Vin and the reference voltage VREF in FIG. 2. Determination voltage VRuvlo input to comparator 501 can be set according to the multiplication value of the allowable lower limit value of power supply voltage VCC in DC-DC converter 400X and the voltage division ratio of voltage dividing circuit 521.

Comparator 501 outputs output voltage VOUT in FIG. 2 as safety control signal VUVLO. Therefore, when the reset operation of comparator 501 is canceled during activation of DC-DC converter 400X, safety control signal VUVLO is set to the L-level until monitoring voltage VCCdv reaches determination voltage VRuvlo at rising of power supply voltage VCC. On the other hand, when monitoring voltage VCCdv rises to determination voltage VRuvlo, comparator 501 detects that monitoring voltage VCCdv and determination voltage VRuvlo intersect with each other, whereby safety control signal VUVLO changes to the H-level.

Safety control signal VUVLO can be transmitted to comparator 420, PFM control circuit 430, and gate drive circuit 440 that execute the PFM control. For example, comparator 420, PFM control circuit 430, and gate drive circuit 440 can be configured to stop the operation when safety control signal VUVLO is at the L-level, and operate when safety control signal VUVLO is at the H-level. That is, in DC-DC converter 400X, when safety control signal VUVLO output from comparator 501 changes from the L-level to the H-level, the generation of DC output voltage VDC is started.

Thus, the safety control circuit using comparator 501 can prevent abnormal DC output voltage VDC (VDCOUT) from being supplied to load 550 by the operation of DC-DC converter 400X while the input voltage (power supply voltage VCC) is insufficient. That is, comparator 501 corresponds to one example of the "input voltage monitoring comparator".

Comparator 502 is disposed to generate a safety control signal PGD preventing the abnormality caused by the operation of load 550 while the output voltage of DC-DC converter 400X is not sufficiently increased. A voltage dividing circuit 522 is connected between DC output node Ndc and ground wiring 402, and outputs a monitoring voltage VDCdv obtained by dividing DC output voltage VDC.

A determination voltage VRgd input to comparator 502 can be set according to the multiplication value of the lower limit value of DC output voltage VDC (VDCOUT) at which the operation of load 550 is allowed and the voltage division ratio of voltage dividing circuit 522.

Comparator 502 (comparator 100) operates using monitoring voltage VDCdv and determination voltage VRgd as input voltage Vin and reference voltage VREF in FIG. 2. Comparator 502 outputs output voltage VOUTn in FIG. 2 to the gate of N-type transistor 512 as control signal VGD. Transistor 512 is connected between a node Ndg where safety control signal PGD is generated and ground wiring 402. Node Ndg is connected to power supply wiring 401 (power supply voltage VCC) through the resistance element.

When the reset operation of comparator 502 is canceled during the activation of DC-DC converter 400X, H-level control signal VGD is input to the gate of transistor 512 during the period until monitoring voltage VDCdv reaches determination voltage VRgd (VRgd>VDCdv) at the rising of DC output voltage VDC. In this period, because transistor 512 is turned on, safety control signal PGD is set to the L-level.

On the other hand, when monitoring voltage VDCdv rises to determination voltage VRgd, comparator 502 detects that monitoring voltage VDCdv and determination voltage VRgd intersect with each other, thereby changing control signal VGD from the H-level to the L-level. In response to this, transistor 512 is turned off, so that safety control signal PGD is set to the H-level.

Safety control signal PGD can be transmitted to load 550 of DC-DC converter 400X. For example, load 550 can be configured to stop the operation when safety control signal PGD is at the L-level, and operate when safety control signal PGD is set to the H-level. That is, the operation permission of load 550 is generated by setting safety control signal PGD to the H-level.

Thus, the safety control circuit using comparator 502 can prevent an abnormality caused by the operation of load 550 in the state where the output voltage of DC-DC converter 400X does not sufficiently rise. That is, comparator 502 corresponds to one example of the "output activation monitoring comparator".

Comparator 503 is disposed to implement what is called over current protection (OCP) function of protecting the circuit when an overcurrent is generated due to a short circuit, thermal runaway, or the like. Current detection circuit 523 outputs a monitoring voltage Vocp corresponding to the passing current of switching element 450.

Current detection circuit 523 includes a P-type replica transistor 450R and a resistance element that are connected in series between power supply wiring 401 and the ground wiring. Replica transistor 450R is manufactured so as to have the same characteristic as that of switching element 450. The gate of replica transistor 450R is connected to the gate of switching element 450. As a result, the current proportional to the passing current of switching element 450 is generated in the series circuit of replica transistor 450R and the resistance element. Because monitoring voltage Vocp is equivalent to the voltage drop amount in the resistance element due to the current of the series circuit, it is understood that monitoring voltage Vocp is the value obtained by multiplying the passage current of switching element 450 by a proportional coefficient (voltage-current conversion ratio).

Comparator 503 (comparator 100) operates with monitoring voltage Vocp and a determination voltage VRocp as input voltage Vin and reference voltage VREF in FIG. 2. Determination voltage VRocp input to comparator 503 can be set according to the multiplication value of the determination value of the overcurrent and the voltage-current conversion ratio in current detection circuit 523.

The comparator 503 outputs output voltage VOUT in FIG. 2 as safety control signal VOCP. Therefore, when the reset operation is canceled during the operation of the DC-DC converter 400X, the comparator 503 sets the safety control signal VOCP to the L level when the monitoring voltage Vocp does not reach the determination voltage VRocp and no overcurrent occurs.

On the other hand, when monitoring voltage Vocp rises to determination voltage VRocp, namely, when the overcurrent is generated, comparator 503 detects that monitoring voltage Vocp intersects with determination voltage VRocp, and changes safety control signal VOCP to the H-level.

Safety control signal VOCP can be transmitted to gate drive circuit 440. When safety control signal VOCP is at the L-level, gate drive circuit 440 generates gate drive signals PGATE and NGATE according to the PFM control described in the sixth embodiment. On the other hand, gate drive circuit 440 generates gate drive signal PGATE so as to forcibly fix switching element 450 to the off-state when the overcurrent in which safety control signal VOCP is set to the H-level is generated. At this time, the operations of comparator 420 and PFM control circuit 430 may be further stopped.

As a result, the safety control circuit using comparator 503 stops the conversion operation of DC-DC converter 400X when the overcurrent is generated, whereby the circuit protection of DC-DC converter 400X and load 550 can be achieved.

Comparator 504 is disposed to implement what is called over voltage protection (OVP) function of protecting the circuit when the overvoltage is generated due to fluctuation of power supply voltage VCC, generation of a surge voltage, thermal runaway, or the like.

Comparator 504 (comparator 100) operates with DC output voltage VDC that is the monitoring voltage and determination voltage VRovp as input voltage Vin and reference voltage VREF in FIG. 2. Determination voltage VRovp input to comparator 504 can be set according to the determination value of the overvoltage.

Comparator 504 outputs output voltage VOUT in FIG. 2 as safety control signal VOVP. Accordingly, when the reset operation is canceled during the operation of DC-DC converter 400X, comparator 504 sets safety control signal VOVP to the L-level when DC output voltage Vovp that is the monitoring voltage does not reach determination voltage VRovp and when no overvoltage is generated.

On the other hand, when DC output voltage VDC rises to determination voltage VRovp, namely, when the overvoltage is generated, comparator 504 detects that DC output voltage VDC (monitoring voltage) intersects with determination voltage VRovp, and changes safety control signal VOVP to the H-level.

Safety control signal VOVP can be transmitted to gate drive circuit 440. When safety control signal VOVP is at the L-level, gate drive circuit 440 generates gate drive signals PGATE, NGATE according to the PFM control described in the fifth embodiment. On the other hand, gate drive circuit 440 generates gate drive signal PGATE so as to forcibly fix switching element 450 to the off-state when the overvoltage in which safety control signal VOVP is set to the H-level is generated. At this time, the operations of comparator 420 and PFM control circuit 430 may be further stopped.

As a result, the safety control circuit using comparator 504 stops the conversion operation of DC-DC converter 400X when the overvoltage is generated, whereby the circuit protection of DC-DC converter 400X and load 550 can be achieved.

Comparator 505 is disposed to implement what is called over temperature protection (OTP) function of preventing the generation of thermal runaway when the ambient temperature rises due to the abnormal operation of DC-DC converter 400X or a peripheral circuit (not illustrated). Temperature sensor 530 outputs a monitoring voltage Vtmp corresponding to the temperature of DC-DC converter 400X. Monitoring voltage Vtmp corresponds to the output voltage of temperature sensor 530, and increases as the temperature rises.

Comparator 505 (comparator 100) operates using monitoring voltage Vtmp and a determination voltage VRovtmp as input voltage Vin and reference voltage VREF in FIG. 2. Determination voltage VRovtmp input to comparator 505 can be set according to the output voltage value of temperature sensor 530 corresponding to the temperature lower limit value requiring overheat protection.

Comparator 505 outputs output voltage VOUT in FIG. 2 as a safety control signal VOVTMP. Therefore, when the reset operation is canceled during the operation of DC-DC converter 400X, comparator 505 sets safety control signal VOVTMP to the L-level when monitoring voltage Vtmp does not reach determination voltage VRocp and the overheat state is not generated.

On the other hand, when monitoring voltage Vtmp rises to determination voltage VRovtmp, namely, when the overheat state is generated, comparator 505 detects that monitoring voltage Vtmp intersects with determination voltage VRovtmp, and changes safety control signal VOVTMP to the H-level.

Safety control signal VOCP can be transmitted to gate drive circuit 440. When safety control signal VOVTMP is at the L-level, gate drive circuit 440 generates gate drive signals PGATE, NGATE according to the PFM control described in the fifth embodiment. On the other hand, gate drive circuit 440 generates gate drive signal PGATE so as to forcibly fix switching element 450 to the off-state when the overheat state in which safety control signal VOVTMP is set to the H-level is generated. At this time, the operations of comparator 420 and PFM control circuit 430 may be further stopped.

As a result, the safety control circuit using comparator 505 stops the conversion operation of DC-DC converter 400X when the overheat state is generated, whereby the circuit protection of DC-DC converter 400X and load 550 can be achieved.

As described above, each of comparators 503 to 505 for the OCP, OVP, and OTP functions corresponds to one example of the "first abnormality monitoring comparator". Furthermore, the control to stop the conversion operation of DC-DC converter 400X according to safety control signals VOVP, VOVP, VOVTMP corresponds to one example of the "first safety control".

Current shunt control to cope with voltage rise will be described below. Comparator 506 and transistor 516 are disposed to form a forced discharge path when DC output voltage VDC rises. Voltage dividing circuit 526 is connected between DC output node Ndc and ground wiring 402, and outputs monitoring voltage VDCdv obtained by dividing DC output voltage VDC.

A determination voltage VRshnt input to comparator 502 can be set according to a multiplication value of a predetermined control upper limit voltage of DC output voltage VDC and the voltage division ratio of voltage dividing circuit 526. The control upper limit value is set to be lower than determination voltage VRovp input to comparator 504 detecting the overvoltage abnormality. That is, the control upper limit value is set such that the current shunt control is activated before overvoltage protection (OVP) acts.

Comparator 506 (comparator 100) operates with monitoring voltage VDCdv and determination voltage VRshnt as input voltage Vin and reference voltage VREF in FIG. 2. Comparator 502 outputs output voltage VOUT in FIG. 2 to the gate of N-type transistor 516 as a control signal VSHNT. Transistor 516 is connected between DC output node Ndc and ground wiring 402.

During the operation of DC-DC converter 400X, until monitoring voltage VDCdv reaches determination voltage VRshnt, namely, during the period in which the voltage rise to activate the current shunt control is not generated, L-level control signal VSHNT is input to the gate of transistor 516. In this period, transistor 516 is maintained in the off-state, and the current shunt control is not executed.

On the other hand, when monitoring voltage VDCdv rises to determination voltage VRshnt, comparator 506 detects that monitoring voltage VDCdv and determination voltage VRshnt intersect with each other, thereby changing control signal VSHNT from the L-level to the H-level. In response to this, transistor 516 is turned on, so that the discharge path can be formed for DC output node Ndc.

As a result, the safety control circuit using comparator 506 can execute the current shunt control to rapidly decrease DC output voltage VDC that is excessively increased. As described above, comparator 506 corresponds to one example of the "second abnormality monitoring comparator". In addition, the current shunt control to form the current path by turning on transistor 516 corresponds to one example of the "second safety control".

As described above, in DC-DC converter 400X of the modification of the sixth embodiment, for DC-DC converter 400 described in the sixth embodiment, the monitoring target values such as the voltage, the current, and the temperature are compared with the determination voltage by the comparator according to the present embodiment, so that the safety control to provide the protection function (ULVO, OCP, OVP, OTP) against the input voltage shortage, the overcurrent, the overvoltage, the overheat state, and the like can be implemented. Furthermore, the current shunt control and the malfunction prevention function of load 550 during the activation of DC-DC converter 400X can also be implemented using the similar comparator.

DC-DC converters 400, 400X of the sixth embodiment and the modification thereof are suitable for the configuration in which power supply voltage VCC of power supply wiring 401 is generated by what is called the energy harvesting power supply by achieving the low power consumption. Typically, the application of the energy harvesting power supply is desired in the application in which the load operates intermittently.

Figure 27:
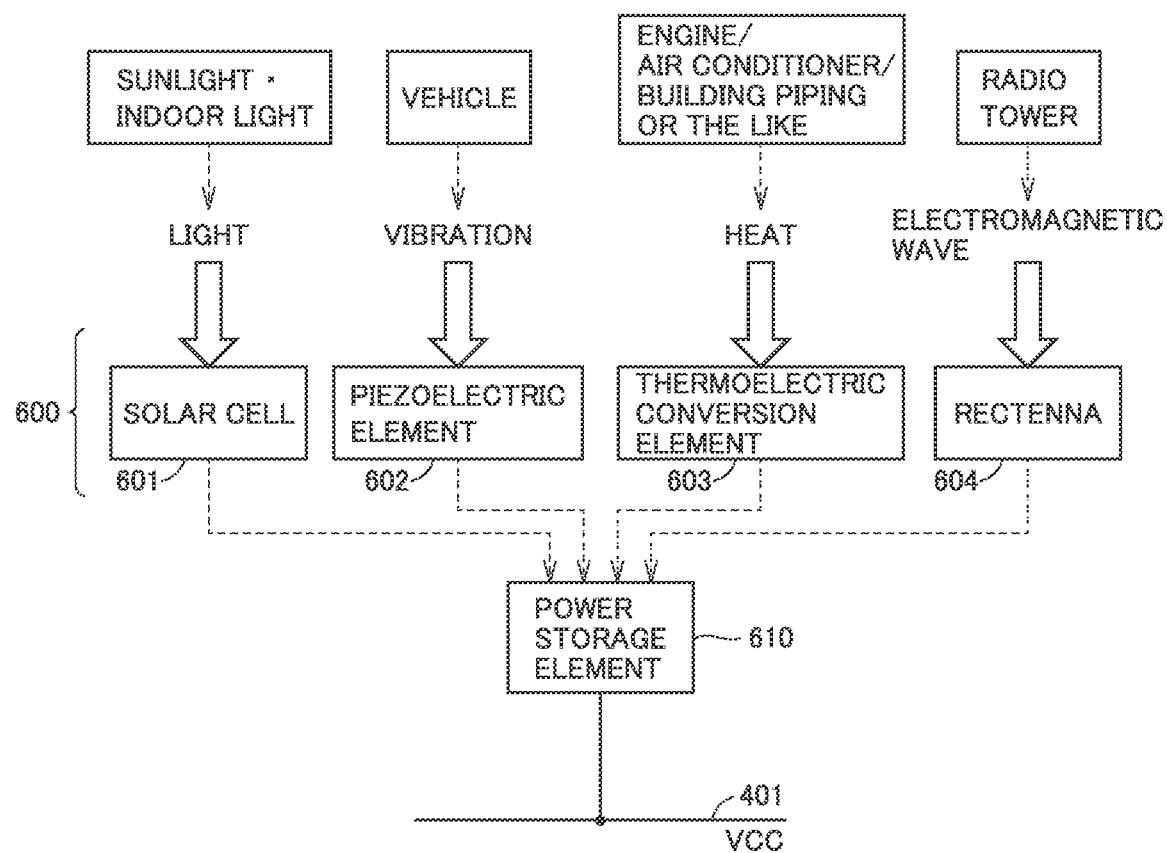
FIG. 27 is a conceptual diagram illustrating a supply example of a power supply voltage of the DC-DC converter by energy harvesting.

FIG. 27 illustrates a supply example of the power supply voltage of DC-DC converters 400, 400X by energy harvesting.

A power generating element 600 of the energy harvesting can include at least one of a solar cell 601 that converts light energy from sunlight or indoor light into electric power, a piezoelectric element 602 that converts vibration energy from a vehicle or the like into electric power, a thermoelectric conversion element 603 that converts thermal energy from an engine, an air conditioner, a building piping, or the like into electric power, and a rectenna 604 that converts electromagnetic wave energy from a radio tower or the like into electric power.

The power generated by power generating element 600 is accumulated by power storage element 610 such as an electric double layer capacitor, and supplied to power supply wiring 401. As a result, by obtaining power supply voltage VCC of the DC-DC converter by the energy harvesting power supply, feeding to load 550 can be performed even when it is difficult to dispose the battery or to feed from the system power supply. As a result, not only energy saving but also user convenience can be improved.

On the other hand, in the energy harvesting power supply, there is a concern that power supply voltage VCC becomes unstable when the generated power fluctuates due to a change in environment. Accordingly, DC-DC converter 400X in which comparator 501 to 506 for abnormality detection is configured by the comparator of the present embodiment with the low power consumption can implement the safety control function according to the abnormality detection with the low power consumption, thereby being able to be made more suitable for the application of the energy harvesting power supply.

In the sixth embodiment and the modifications thereof, an example in which the comparator of the present embodiment is applied to the step-down DC-DC converter has been described. However, the application example to the DC-DC converter is not limited thereto, and will be described for confirmation. That is, the comparator of the present embodiment can also be applied to a step-up DC-DC converter, an inverting DC-DC converter that generates a negative voltage, and the like. Alternatively, the comparator of the present embodiment can be applied to a power converter other than the DC-DC converter for the purpose of voltage monitoring (sixth embodiment) for output control.

Similarly, the safety control circuit by comparators 501 to 506 in FIG. 26 is not limited to be applied to DC-DC converter 400 (FIG. 21), but can be applied to a DC-DC converter different from DC-DC converter 400 or a power converter other than the DC-DC converter. Thus, in the power converter, the protection function (ULVO, OCP, OVP, OTP) against the input voltage shortage, the overcurrent, the overvoltage, the overheat state, and the like, and the malfunction prevention function of the load during the activation of the power converter can be implemented with the low power consumption using the comparator of the present embodiment.

It should be considered that the disclosed embodiments are illustrative and non-restrictive in every respect. The scope of the present disclosure is defined by not the description above, but the claims, and it is intended that all modifications within the meaning and scope of the claims and their equivalents are included in the present invention.

REFERENCE SIGNS LIST 100, 100 #, 100a, 100b, 101, 101x, 101y, 101z, 102 to 104: comparator, 110: differential amplifier circuit, 120: active load circuit, 130 to 132: current source circuit, 140: current conversion circuit, 150: minimum selector circuit, 151 to 153: voltage range, 160: latch circuit, 170: output stage, 180: input voltage detection circuit, 190: current control signal generation circuit, 191: logic gate, 200: oscillator, 210: RS flip-flop, 210a, 210b, C10, Cdc: capacitor, 220a, 220b: charge-discharge control circuit, 221a, 221b, 300a, 300b: current source, 400, 400X: DC-DC converter, 401: power supply wiring, 402: ground wiring, 410: voltage feedback circuit, 420, 501, 502, 503, 504, 505, 506: comparator (in power converter), 430: PFM control circuit, 432: D flip-flop, 435: delay circuit, 440: gate drive circuit, 442: non-overlapping clock generation circuit, 444a, 444b: inverter stage, 450, 451: semiconductor switching element, 450R: replica transistor, 521, 522, 526: voltage dividing circuit, 523: current detection circuit, 530: temperature sensor, 550: load, 600: power generation element, 601: solar cell, 602: piezoelectric element, 603: thermoelectric conversion element, 604: rectenna, 610: power storage element, INV1 to INV2: inverter, Ldc: inductor, NM0, NM0x, NM0x1, NM0x2, NM0y, NM0y1, NM0y2, NM1 to NM8, NM11 to NM16, NM61, NM62, NMC1 to NMC4: transistor (N-type), PM1 to PM8, PM10 to PM18, PM61, PM62, PMC1 to PMC4: transistor (P-type), N1 to N8: node, Np: power supply node, Nina, Ninb: input node, Ns: ground node, PGD, VOCP, VOVP, VOVTMP, VUVLO, VUVLOH: safety control signal, RST, RTTdc: reset signal, VCCdv, VDCdv, Vocp, Vtmp: monitoring voltage, VDCCNT: voltage control signal, VDCOUT: DC output voltage (power converter), VDD: power supply voltage, VOUT: Output voltage, VREF: reference voltage, VSS: ground voltage, Vclk: clock voltage, Vina, Vinb: output voltage, VRgd, VRocp, VRovp, VRovtmp, VRshnt, Vx, Vy: determination voltage, VRuvlo: lower limit determination voltage

The invention claimed is:

1. A comparator that operates by receiving supply of a first voltage and a second voltage, the comparator comprising:
a differential amplifier circuit that is connected to a first power supply node supplying the first voltage through first and second nodes and generates a first current and a second current in the first node and the second node, respectively, the first current and the second current having a current difference obtained by amplifying a voltage difference between an input voltage and a reference voltage predetermined between the first and second voltages;
a current source circuit that is connected in series with the differential amplifier circuit through a third node between the first power supply node and a second power supply node supplying the second voltage and generates a third current that is a sum of the first and second currents in the third node;
an output stage that is connected between an output node and the first power supply node and has current drive force to generate a first output current proportional to the first current between the first power supply node and the output node;
a current conversion circuit to have current drive force generating a second output current proportional to the second current between the second power supply node and the output node;
a minimum selector circuit that is connected between an output complementary node and the first power supply node and causes the output complementary node to generate current proportional to a minimum current of the first and second currents; and
a latch circuit connected between the output node and the output complementary node and the second power supply node,
wherein the latch circuit executes a reset operation in which each of the output node and the output complementary node is electrically connected to the second power supply node in response to a reset signal, and executes a positive feedback latch operation in which a change, generated in the output node, from the second voltage to the first voltage is amplified when a high and low relationship between the input voltage and the reference voltage is reversed from a cancellation time point of the reset operation while the output node and the output complementary node are electrically disconnected from the second power supply node during a circuit operation after cancellation of the reset operation, and fixes voltage at the output node to the first voltage while fixing voltage at the output complementary node to the second voltage until the reset signal is input next time.

2. The comparator according to claim 1, wherein the current source circuit increases the third current when the voltage at the output node is the second voltage as compared with when the voltage at the output node is the first voltage.

3. The comparator according to claim 1, wherein the current source circuit increases the third current when the input voltage is within a voltage range previously set to include the reference voltage as compared with when the input voltage is outside the voltage range.

4. The comparator according to claim 1, wherein
the comparator is controlled to operate alternately with the other comparators, and
the current source circuit increases the third current during an operation period of the other comparator as compared with a non-operation period of the other comparator.

5. The comparator according to claim 1, further comprising a capacitor connected between the output complementary node and the second power supply node,
wherein the latch circuit is configured to connect one node of the output node and the output complementary node to the second power supply node when the other node of the output node and the output complementary node changes from the second voltage toward the first voltage.

6. The comparator according to claim 1, further comprising an active load circuit that is connected between the first power supply node and the first and second nodes and includes a first current path between the first power supply node and the first node and a second current path between the first power supply node and the second node,
wherein the active load circuit includes a current cutoff mechanism that cuts off the first and second current paths during the reset operation.

7. The comparator according to claim 1, further comprising:
a first auxiliary current source connected to the output complementary node; and a second auxiliary current source connected to the output node, wherein the latch circuit includes a cross-coupled circuit connected between the output node and the output complementary node and the second power supply node, and the first and second auxiliary current sources generate current causing transistors constituting the cross-coupled circuit to operate in a subthreshold region until the latch circuit executes the latch operation after the reset operation is canceled.

8. The comparator according to claim 1, wherein the differential amplifier circuit includes:

a first transistor of a first conductivity type connected between the first node electrically connected to the first power supply node and the third node; and a second transistor of the first conductivity type connected between the second node electrically connected to the first power supply node and the third node, the current source circuit includes a third transistor of the first conductivity type that is connected between the second power supply node and the third node and receives a constant voltage at a gate, the current conversion circuit includes a fourth transistor of the first conductivity type connected between the output node and the second power supply node, the fourth transistor is arranged so as to form a current mirror with a transistor through which current proportional to the second current flows, the minimum selector circuit includes fifth and sixth transistors of a second conductivity type that are a conductivity type opposite to the first conductivity type and are connected in series between the first power supply node and the output complementary node, a gate of the fifth transistor is arranged to form a current mirror with a transistor through which the first current flows, a gate of the sixth transistor is arranged to form a current mirror with a transistor through which the second current flows, the output stage includes a seventh transistor of the second conductivity type connected between the first power supply node and the output node, a gate of the seventh transistor is disposed to form a current mirror with a transistor through which the first current flows, and the latch circuit includes:

an eighth transistor of the first conductivity type that is connected between the output complementary node and the second power supply node and includes a gate connected to the output node;

a ninth transistor of the first conductivity type that is connected between the output node and the second power supply node and includes a gate connected to the output complementary node;

a tenth transistor of the first conductivity type that is connected between the output complementary node and the second power supply node and includes a gate to which the reset signal is input; and an eleventh transistor of the first conductivity type that is connected between the output node and the second power supply node and includes a gate to which the reset signal is input.

9. The comparator according to claim 8, wherein the current source circuit includes a first auxiliary transistor connected in parallel with the third transistor between the third node and the second power supply node, the first auxiliary transistor is turned off when the voltage at the output node is the first voltage or when the input voltage is outside a voltage range previously set so as to include the reference voltage, and the first auxiliary transistor generates a predetermined current when the voltage at the output node is the second voltage or when the input voltage is within the voltage range.

10. The comparator according to claim 8, wherein the comparator is controlled to execute the circuit operation alternately with the other comparators, the current source circuit includes a second auxiliary transistor connected in parallel with the third transistor between the third node and the second power supply node, and the second auxiliary transistor is turned off during an operation period of the other comparator, and is controlled to generate a predetermined current during a non-operation period of the other comparator.

11. The comparator according to claim 8, further comprising a capacitor connected between the output complementary node and the second power supply node.

12. The comparator according to claim 8, further comprising an active load circuit connected between the first power supply node and the first and second nodes, wherein the active load circuit includes:

a twelfth transistor of the second conductivity type that is connected between the first power supply node and the first node and includes a gate connected to the first node;

a thirteenth transistor of the second conductivity type that is connected between the first power supply node and the second node and includes a gate connected to the second node; and a current cutoff mechanism that connects the gates of the twelfth transistor and the thirteenth transistor to a node supplying a gate voltage turning off the twelfth transistor and the thirteenth transistor during the reset operation.

13. The comparator according to claim 8, further comprising:

a first auxiliary current source connected to the output complementary node; and a second auxiliary current source connected to the output node, wherein the first and second auxiliary current sources generate current causing each of the eighth transistor and the ninth transistor to operate in a subthreshold region until the latch circuit executes the latch operation after the reset operation is canceled.

14. The comparator according to claim 1, wherein the first voltage is higher than the second voltage, the input voltage rises from the second voltage toward the first voltage during the circuit operation, and the latch circuit changes the voltage at the output node from the second voltage to the first voltage when the input voltage rises from a voltage lower than the reference voltage to the reference voltage during the circuit operation.

15. The comparator according to claim 1, wherein
the second voltage is higher than the first voltage,
the input voltage decreases from the second voltage toward the first voltage during the circuit operation, and
the latch circuit changes the voltage at the output node from the second voltage to the first voltage when the input voltage decreases from a voltage higher than the reference voltage to the reference voltage during the circuit operation.

16. An oscillator comprising:
first and second comparators each configured by the comparator according to claim 1; and
a signal generation circuit to receive a first output signal from the first comparator and a second output signal from the second comparator to generate a periodic signal that repeats transition of a logic level,
wherein the first output signal has a logic level according to voltage at the output node of the first comparator,
the second output signal has a logic level according to voltage at the output node of the second comparator,
the input voltage of the first comparator and the input voltage of the second comparator are controlled such that a voltage change toward the reference voltage is alternately generated in response to each of transitions of a logic level of the periodic signal,
the first and second comparators alternately execute the circuit operation to generate the first and second output signals according to the reference voltage and the input voltage with the voltage change, and
the signal generation circuit causes transition of the logic level of the periodic signal according to each of a change in the logic level in a predetermined direction of the first output signal and a change in the logic level in the predetermined direction of the second output signal.

17. A power converter that is connected to a ground wiring and a power supply wiring, converts a first DC voltage at the power supply wiring, and outputs a second DC voltage to a DC voltage output node, the power converter comprising:
an output voltage monitoring comparator that is configured by the comparator according to claim 1;
a drive switching element connected between the power supply wiring and the DC voltage output node; and
a voltage control circuit to control on and off of the drive switching element based on a control signal output from the output voltage monitoring comparator,
wherein the output voltage monitoring comparator operates to output the control signal set to a first or second level according to voltage at the output node or the output complementary node with voltage according to the second DC voltage as the input voltage and voltage according to a target voltage at the second DC voltage as the reference voltage.

18. The power converter according to claim 17, further comprising a semiconductor element connected between the DC voltage output node and the ground wiring,
wherein the second DC voltage is supplied from the DC voltage output node to a load through an inductor,
the semiconductor element is configured to form a current path including the DC voltage output node, the inductor, the load, and the ground wiring in an off-period of the drive switching element,
the output voltage monitoring comparator changes the control signal from the first level to the second level when the second DC voltage decreases to the target voltage after the cancellation of the reset operation, and
the voltage control circuit provides an on-period of the drive switching element in response to transition of the control signal output from the output voltage monitoring comparator from the first level to the second level and causes the output voltage monitoring comparator to execute the reset operation in response to an end of the on-period.

19. The power converter according to claim 17, further comprising a first abnormality monitoring comparator configured of a comparator that operates by receiving supply of a first voltage and a second voltage, the comparator comprising:
a differential amplifier circuit that is connected to a first power supply node supplying the first voltage through first and second nodes and generates a first current and a second current in the first node and the second node, respectively, the first current and the second current having a current difference obtained by amplifying a voltage difference between an input voltage and a reference voltage predetermined between the first and second voltages;
a current source circuit that is connected in series with the differential amplifier circuit through a third node between the first power supply node and a second power supply node supplying the second voltage and generates a third current that is a sum of the first and second currents in the third node;
an output stage that is connected between an output node and the first power supply node and has current drive force to generate a first output current proportional to the first current between the first power supply node and the output node;
a current conversion circuit to have current drive force generating a second output current proportional to the second current between the second power supply node and the output node;
a minimum selector circuit that is connected between an output complementary node and the first power supply node and causes the output complementary node to generate current proportional to a minimum current of the first and second currents; and
a latch circuit connected between the output node and the output complementary node and the second power supply node,
wherein the latch circuit executes a reset operation in which each of the output node and the output complementary node is electrically connected to the second power supply node in response to a reset signal, and executes a positive feedback latch operation in which a change, generated in the output node, from the second voltage to the first voltage is amplified when a high and low relationship between the input voltage and the reference voltage is reversed from a cancellation time point of the reset operation while the output node and the output complementary node are electrically disconnected from the second power supply node during a circuit operation after cancellation of the reset operation, and fixes voltage at the output node to the first voltage while fixing voltage at the output complementary node to the second voltage until the reset signal is input next time, and
wherein the first abnormality monitoring comparator operates to output a control signal that is a digital signal according to voltage at the output node or the output complementary node, with a monitoring voltage having a voltage value according to any one of voltage, current, and temperature generated in the power converter as the input voltage and a determination voltage corresponding to a voltage value of the monitoring voltage when an abnormality is generated in any one of the voltage, the current, and the temperature as the reference voltage, and the power converter executes first safety control stopping the conversion operation from the first DC voltage to the second DC voltage when a level of the control signal output from the first abnormality monitoring comparator changes after cancellation of the reset operation of the first abnormality monitoring comparator.

20. The power converter according to claim 17, further comprising a second abnormality monitoring comparator configured of a comparator that operates by receiving supply of a first voltage and a second voltage, the comparator comprising:
- a differential amplifier circuit that is connected to a first power supply node supplying the first voltage through first and second nodes and generates a first current and a second current in the first node and the second node, respectively, the first current and the second current having a current difference obtained by amplifying a voltage difference between an input voltage and a reference voltage predetermined between the first and second voltages;
- a current source circuit that is connected in series with the differential amplifier circuit through a third node between the first power supply node and a second power supply node supplying the second voltage and generates a third current that is a sum of the first and second currents in the third node;
- an output stage that is connected between an output node and the first power supply node and has current drive force to generate a first output current proportional to the first current between the first power supply node and the output node;
- a current conversion circuit to have current drive force generating a second output current proportional to the second current between the second power supply node and the output node;
- a minimum selector circuit that is connected between an output complementary node and the first power supply node and causes the output complementary node to generate current proportional to a minimum current of the first and second currents; and
- a latch circuit connected between the output node and the output complementary node and the second power supply node, wherein the latch circuit executes a reset operation in which each of the output node and the output complementary node is electrically connected to the second power supply node in response to a reset signal, and executes a positive feedback latch operation in which a change, generated in the output node, from the second voltage to the first voltage is amplified when a high and low relationship between the input voltage and the reference voltage is reversed from a cancellation time point of the reset operation while the output node and the output complementary node are electrically disconnected from the second power supply node during a circuit operation after cancellation of the reset operation, and fixes voltage at the output node to the first voltage while fixing voltage at the output complementary node to the second voltage until the reset signal is input next time, and wherein the second abnormality monitoring comparator operates to output a control signal that is a digital signal according to voltage at the output node or the output complementary node with voltage according to the second DC voltage as the input voltage and a predetermined upper limit voltage as the reference voltage, and the power converter executes second safety control forming a current path lowering the second DC voltage between the DC voltage output node and the ground wiring when a level of the control signal output from the second abnormality monitoring comparator changes after the cancellation of the reset operation of the second abnormality monitoring comparator.

21. The power converter according to claim 17, further comprising an output activation monitoring comparator configured of a comparator that operates by receiving supply of a first voltage and a second voltage, the comparator comprising:
- a differential amplifier circuit that is connected to a first power supply node supplying the first voltage through first and second nodes and generates a first current and a second current in the first node and the second node, respectively, the first current and the second current having a current difference obtained by amplifying a voltage difference between an input voltage and a reference voltage predetermined between the first and second voltages;
- a current source circuit that is connected in series with the differential amplifier circuit through a third node between the first power supply node and a second power supply node supplying the second voltage and generates a third current that is a sum of the first and second currents in the third node;
- an output stage that is connected between an output node and the first power supply node and has current drive force to generate a first output current proportional to the first current between the first power supply node and the output node;
- a current conversion circuit to have current drive force generating a second output current proportional to the second current between the second power supply node and the output node;
- a minimum selector circuit that is connected between an output complementary node and the first power supply node and causes the output complementary node to generate current proportional to a minimum current of the first and second currents; and
- a latch circuit connected between the output node and the output complementary node and the second power supply node, wherein the latch circuit executes a reset operation in which each of the output node and the output complementary node is electrically connected to the second power supply node in response to a reset signal, and executes a positive feedback latch operation in which a change, generated in the output node, from the second voltage to the first voltage is amplified when a high and low relationship between the input voltage and the reference voltage is reversed from a cancellation time point of the reset operation while the output node and the output complementary node are electrically disconnected from the second power supply node during a circuit operation after cancellation of the reset operation, and fixes voltage at the output node to the first voltage while fixing voltage at the output complementary node to the second voltage until the reset signal is input next time, and wherein the output activation monitoring comparator operates to output a control signal that is a digital signal according to voltage at the output node or the output complementary node with voltage according to the second DC voltage as the input voltage and voltage according to a lower limit value at which an operation of the load is allowed for the second DC voltage as the reference voltage, and the power converter generates an operation permission for the load when a level of the control signal output from the output activation monitoring comparator changes after the cancellation of the reset operation of the output activation monitoring comparator.

22. The power converter according to claim 17, further comprising an input voltage monitoring comparator configured of a comparator that operates by receiving supply of a first voltage and a second voltage, the comparator comprising:

a differential amplifier circuit that is connected to a first power supply node supplying the first voltage through first and second nodes and generates a first current and a second current in the first node and the second node, respectively, the first current and the second current having a current difference obtained by amplifying a voltage difference between an input voltage and a reference voltage predetermined between the first and second voltages;

a current source circuit that is connected in series with the differential amplifier circuit through a third node between the first power supply node and a second power supply node supplying the second voltage and generates a third current that is a sum of the first and second currents in the third node;

an output stage that is connected between an output node and the first power supply node and has current drive force to generate a first output current proportional to the first current between the first power supply node and the output node;

a current conversion circuit to have current drive force generating a second output current proportional to the second current between the second power supply node and the output node;

a minimum selector circuit that is connected between an output complementary node and the first power supply node and causes the output complementary node to generate current proportional to a minimum current of the first and second currents; and a latch circuit connected between the output node and the output complementary node and the second power supply node, wherein the latch circuit executes a reset operation in which each of the output node and the output complementary node is electrically connected to the second power supply node in response to a reset signal, and executes a positive feedback latch operation in which a change, generated in the output node, from the second voltage to the first voltage is amplified when a high and low relationship between the input voltage and the reference voltage is reversed from a cancellation time point of the reset operation while the output node and the output complementary node are electrically disconnected from the second power supply node during a circuit operation after cancellation of the reset operation, and fixes voltage at the output node to the first voltage while fixing voltage at the output complementary node to the second voltage until the reset signal is input next time, and wherein the input voltage monitoring comparator operates to output a control signal that is a digital signal according to voltage at the output node or the output complementary node with voltage according to the first DC voltage as the input voltage and voltage according to an allowable lower limit value of the first DC voltage in the power converter as the reference voltage, and the power converter starts generation of the second DC voltage at the DC voltage output node when a level of the control signal output from the input voltage monitoring comparator changes after the cancellation of the reset operation of the input voltage monitoring comparator.

23. A power converter that converts input power on a power supply wiring into power and supplies the power to a load, the power converter further comprising an abnormality monitoring comparator configured of the comparator according to claim 1, wherein the abnormality monitoring comparator operates to output a first control signal that is a digital signal according to voltage at the output node or the output complementary node with a monitoring voltage having a voltage value according to any one of voltage, current, and temperature related to the power converter as the input voltage and a determination voltage corresponding to a voltage value of the monitoring voltage when an abnormality is generated in any one of the voltage, the current, and the temperature as the reference voltage, and the power converter executes safety control stopping the power conversion when a level of the first control signal output from the abnormality monitoring comparator changes.

24. The power converter according to claim 23, further comprising an output activation monitoring comparator configured of a comparator that operates by receiving supply of a first voltage and a second voltage, the comparator comprising:

a differential amplifier circuit that is connected to a first power supply node supplying the first voltage through first and second nodes and generates a first current and a second current in the first node and the second node, respectively, the first current and the second current having a current difference obtained by amplifying a voltage difference between an input voltage and a reference voltage predetermined between the first and second voltages;

a current source circuit that is connected in series with the differential amplifier circuit through a third node between the first power supply node and a second power supply node supplying the second voltage and generates a third current that is a sum of the first and second currents in the third node;

an output stage that is connected between an output node and the first power supply node and has current drive force to generate a first output current proportional to the first current between the first power supply node and the output node;

a current conversion circuit to have current drive force generating a second output current proportional to the second current between the second power supply node and the output node;

a minimum selector circuit that is connected between an output complementary node and the first power supply node and causes the output complementary node to generate current proportional to a minimum current of the first and second currents; and a latch circuit connected between the output node and the output complementary node and the second power supply node, wherein the latch circuit executes a reset operation in which each of the output node and the output complementary node is electrically connected to the second power supply node in response to a reset signal, and executes a positive feedback latch operation in which a change, generated in the output node, from the second voltage to the first voltage is amplified when a high and low relationship between the input voltage and the reference voltage is reversed from a cancellation time point of the reset operation while the output node and the output complementary node are electrically disconnected from the second power supply node during a circuit operation after cancellation of the reset operation, and fixes voltage at the output node to the first voltage while fixing voltage at the output complementary node to the second voltage until the reset signal is input next time, and, wherein the output activation monitoring comparator operates to output a control signal that is a digital signal according to voltage at the output node or the output complementary node with voltage according to an output voltage at the power converter as the input voltage and voltage according to a lower limit value of the output voltage allowed by the load as the reference voltage, and the power converter generates operation permission for the load when a level of the control signal output from the output activation monitoring comparator changes after the cancellation of the reset operation of the output activation monitoring comparator.

25. The power converter according to claim 23, further comprising an input voltage monitoring comparator configured of a comparator that operates by receiving supply of a first voltage and a second voltage, the comparator comprising:

a differential amplifier circuit that is connected to a first power supply node supplying the first voltage through first and second nodes and generates a first current and a second current in the first node and the second node, respectively, the first current and the second current having a current difference obtained by amplifying a voltage difference between an input voltage and a reference voltage predetermined between the first and second voltages;

a current source circuit that is connected in series with the differential amplifier circuit through a third node between the first power supply node and a second power supply node supplying the second voltage and generates a third current that is a sum of the first and second currents in the third node;

an output stage that is connected between an output node and the first power supply node and has current drive force to generate a first output current proportional to the first current between the first power supply node and the output node;

a current conversion circuit to have current drive force generating a second output current proportional to the second current between the second power supply node and the output node;

a minimum selector circuit that is connected between an output complementary node and the first power supply node and causes the output complementary node to generate current proportional to a minimum current of the first and second currents; and a latch circuit connected between the output node and the output complementary node and the second power supply node, wherein the latch circuit executes a reset operation in which each of the output node and the output complementary node is electrically connected to the second power supply node in response to a reset signal, and executes a positive feedback latch operation in which a change, generated in the output node, from the second voltage to the first voltage is amplified when a high and low relationship between the input voltage and the reference voltage is reversed from a cancellation time point of the reset operation while the output node and the output complementary node are electrically disconnected from the second power supply node during a circuit operation after cancellation of the reset operation, and fixes voltage at the output node to the first voltage while fixing voltage at the output complementary node to the second voltage until the reset signal is input next time, and wherein the input voltage monitoring comparator operates to output a control signal that is a digital signal according to voltage at the output node or the output complementary node with a voltage according to the input power as the input voltage and voltage according to an allowable lower limit of the input power in the power converter as the reference voltage, and the power converter starts the power conversion when a level of the control signal output from the input voltage monitoring comparator changes after the cancellation of the reset operation of the input voltage monitoring comparator.

26. The power converter according to claim 19, wherein the power supply wiring is configured to receive power supplied from an energy harvesting power supply.

* * * * *